US010759872B2

(12) United States Patent
Boone et al.

(10) Patent No.: US 10,759,872 B2
(45) Date of Patent: *Sep. 1, 2020

(54) REGIOSELECTIVELY SUBSTITUTED CELLULOSE ESTERS AND FILMS MADE THEREFROM

(71) Applicant: Eastman Chemical Company, Kingsport, TN (US)

(72) Inventors: Matthew Allen Boone, Gray, TN (US); Christopher Harlan Burk, Gray, TN (US); Peter Borden Mackenzie, Enfield, CT (US); Jennifer A. Fish, Mount Joy, PA (US); Eduardo Gallas Cervo, Kingsport, TN (US); Elaine Beatrice Mackenzie, Enfield, CT (US); Robert Joseph Maleski, Kingsport, TN (US); Wesley McConnell, Gray, TN (US); David William Norman, Kingsport, TN (US); Tabatha Stearns, Bristol, TN (US); Bin Wang, Kingsport, TN (US)

(73) Assignee: Eastman Chemical Company, Kingsport, TN (US)

(*) Notice: Subject to any disclaimer, the term of this patent is extended or adjusted under 35 U.S.C. 154(b) by 318 days.

This patent is subject to a terminal disclaimer.

(21) Appl. No.: 15/482,910

(22) Filed: Apr. 10, 2017

(65) Prior Publication Data
US 2017/0306054 A1    Oct. 26, 2017

Related U.S. Application Data

(60) Provisional application No. 62/472,046, filed on Mar. 16, 2017, provisional application No. 62/326,037, filed on Apr. 22, 2016, provisional application No. 62/466,097, filed on Mar. 2, 2017.

(51) Int. Cl.
C08B 3/16      (2006.01)
B32B 27/24     (2006.01)
B32B 27/08     (2006.01)
B32B 27/36     (2006.01)
B32B 7/12      (2006.01)
B32B 27/28     (2006.01)
C08L 1/14      (2006.01)
B32B 23/08     (2006.01)
B32B 27/32     (2006.01)
B32B 27/18     (2006.01)
G02B 5/30      (2006.01)
B32B 27/22     (2006.01)
B32B 27/06     (2006.01)
G02F 1/13363   (2006.01)
H01L 51/52     (2006.01)
C08L 1/08      (2006.01)
C08L 1/10      (2006.01)

(52) U.S. Cl.
CPC .............. C08B 3/16 (2013.01); B32B 7/12 (2013.01); B32B 23/08 (2013.01); B32B 27/06 (2013.01); B32B 27/08 (2013.01); B32B 27/18 (2013.01); B32B 27/22 (2013.01); B32B 27/24 (2013.01); B32B 27/281 (2013.01); B32B 27/325 (2013.01); B32B 27/36 (2013.01); B32B 27/365 (2013.01); C08L 1/14 (2013.01); G02B 5/305 (2013.01); G02B 5/3033 (2013.01); G02B 5/3083 (2013.01); G02F 1/13363 (2013.01); H01L 51/5259 (2013.01); H01L 51/5281 (2013.01); B32B 2307/40 (2013.01); B32B 2307/516 (2013.01); B32B 2307/518 (2013.01); B32B 2307/546 (2013.01); B32B 2307/732 (2013.01); B32B 2309/105 (2013.01); B32B 2457/202 (2013.01); B32B 2457/206 (2013.01); C08L 1/08 (2013.01); C08L 1/10 (2013.01); G02F 2001/133638 (2013.01); G02F 2413/13 (2013.01); Y10T 428/105 (2015.01); Y10T 428/1036 (2015.01)

(58) Field of Classification Search
CPC .................................................. C08B 3/16
USPC ........................................................ 536/64
See application file for complete search history.

(56) References Cited

U.S. PATENT DOCUMENTS 4,592,885 A   6/1986   Ichino et al.
7,172,713 B2  2/2007   Arai et al.
7,671,193 B2  3/2010   Shibata et al.
8,354,525 B2  1/2013   Buchanan et al.
(Continued)

FOREIGN PATENT DOCUMENTS

EP        1215216 B1    7/2005
JP      2006/111797 A   4/2006
WO   WO 2014/116901 A1  7/2014

OTHER PUBLICATIONS

Liebert, Tim F., et al.; "Tailored Cellulose Esters: Synthesis and Structure Determination", Biomacromulecules, 2005, 6 (1), pp. 333-340.

(Continued)

Primary Examiner — Shaojia A Jiang
Assistant Examiner — Everett White
(74) Attorney, Agent, or Firm — Kenrick L. Vidale

(57) ABSTRACT

Regioselectively substituted cellulose esters having a plurality of pivaloyl substituents and a plurality of aryl-acyl substituents are disclosed along with methods for making the same. Such cellulose esters may be suitable for use in films, such as +A optical films, and/or +C optical films. Optical films prepared employing such cellulose esters have a variety of commercial applications, such as, for example, as compensation films in liquid crystal displays and/or waveplates in creating circular polarized light used in 3-D technology.

14 Claims, 5 Drawing Sheets

(56) References Cited

U.S. PATENT DOCUMENTS

| | | |
|---|---|---|
| 8,729,253 B2 | 5/2014 | Buchanan et al. |
| 9,096,691 B2 | 8/2015 | Buchanan et al. |
| 2004/0141121 A1 | 7/2004 | Tanaka et al. |
| 2005/0133953 A1 | 6/2005 | Yamazaki et al. |
| 2006/0216437 A1 | 9/2006 | Murakami |
| 2006/0222786 A1 | 10/2006 | Oya et al. |
| 2009/0021673 A1 | 1/2009 | Fukagawa et al. |
| 2009/0050842 A1 | 2/2009 | Shelby et al. |
| 2009/0054638 A1 | 2/2009 | Shelby et al. |
| 2009/0091694 A1 | 4/2009 | Sasada |
| 2009/0096962 A1 | 4/2009 | Shelton et al. |
| 2009/0111981 A1 | 4/2009 | Kuwabara et al. |
| 2010/0029927 A1 | 2/2010 | Buchanan et al. |
| 2010/0055356 A1 | 3/2010 | Takeda et al. |
| 2010/0245730 A1 | 9/2010 | Nimura et al. |
| 2010/0267942 A1 | 10/2010 | Buchanan et al. |
| 2012/0262650 A1 | 10/2012 | Buchanan et al. |
| 2013/0335685 A1 | 12/2013 | Suzuki et al. |
| 2014/0141121 A1 | 6/2014 | Wang et al. |
| 2014/0168770 A1 | 6/2014 | Wang et al. |

OTHER PUBLICATIONS

Notification of Transmittal of The International Search Report and The Written Opinion of the International Searching Authority, or the Declaration; International application No. PCT/US17/27111 dated Jul. 17, 2017.

Buchanan, Charles M., et al.; Preparation of Cellulose [1-$^{13}$C] Acetates and Determination of Monomer Composition by NMR Spectroscopy; vol. 24, 1991, pp. 3050-3059.

Copending U.S. Appl. No. 15/482,920, filed Apr. 10, 2017.

Notification of Transmittal of The International Search Report and The Written Opinion of the International Searching Authority, or the Declaration; International application No. PCT/US17/27115 dated Jul. 21, 2017.

Office Action dated Jun. 26, 2019 received in co-pending U.S. Appl. No. 15/482,920.

Office Action dated Oct. 9, 2019 received in co-pending U.S. Appl. No. 15/482,920.

Xu, Daiqiang, et al.; "Studies on regioselective acylation of cellulose with bulky acid chlorides"; Cellulose, 2011, 18:405-419.

REGIOSELECTIVELY SUBSTITUTED CELLULOSE ESTERS AND FILMS MADE THEREFROM

FIELD OF THE INVENTION

This application relates generally to cellulose ester compositions, methods of making cellulose ester compositions, and optical films produced therefrom.

BACKGROUND OF THE INVENTION

Cellulose esters such as cellulose triacetate ("CTA" or "TAC"), cellulose acetate propionate ("CAP"), and cellulose acetate butyrate ("CAB"), are used in a wide variety of films for the liquid crystal display ("LCD") industry. Most notable is their use as protective and compensation films used in conjunction with polarizer sheets. These films can typically be made by solvent casting, and then be laminated to either side of an oriented, iodinated polyvinyl alcohol ("PVOH") polarizing film to protect the PVOH layer from scratching and moisture ingress, while also increasing structural rigidity. When used as compensation films (a.k.a., waveplates), they can be laminated with the polarizer stack or otherwise included between the polarizer and liquid crystal layers. The waveplates can act to improve the contrast ratio, wide viewing angle, and color shift performance of the LCD. While significant advances have been made in LCD technology, improvements are still needed.

SUMMARY OF THE INVENTION

This application discloses a regioselectively substituted cellulose ester comprising:
(a) a plurality of chromophore-acyl substituents; and
(b) a plurality of pivaloyl substituents,
wherein the cellulose ester has a hydroxyl degree of substitution ("$DS_{OH}$") in the range of from about 0 to about 0.9,
wherein the cellulose ester has a pivaloyl degree of substitution ("$DS_{Pv}$") in the range of from about 0.1 to about 1.2,
wherein the cellulose ester has a chromophore-acyl degree of substitution ("$DS_{Ch}$") in the range of from about 0.4 to about 1.6, and
wherein the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is between about 0.5 and about 1.6
wherein the chromophore-acyl is chosen from
(i) an ($C_{6-20}$)aryl-acyl, wherein the aryl is unsubstituted or substituted by 1-5 $R^1$;
(ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

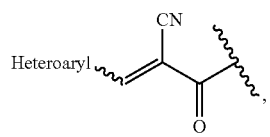

(iii)

wherein the aryl is a $C_{1-6}$ aryl, and wherein the aryl is unsubstituted or substituted by 1-5 $R^1$; or

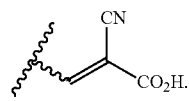

(iv)

wherein the heteroaryl is a 5- to 10-membered ring having 1-4 heteroatoms chosen from N, O or S, and wherein the heteroaryl is unsubstituted or substituted by 1-5 $R^1$,
wherein each $R^1$ is independently chosen from nitro; cyano; ($C_{1-6}$)alkyl; halo($C_{1-6}$)alkyl; ($C_{6-20}$)aryl-$CO_2$—; ($C_{6-20}$)aryl; ($C_{1-6}$)alkoxy; halo($C_{1-6}$)alkoxy; halo, 5- to 10-membered heteroaryl having 1-4 heteroatoms chosen from N, O, or S; or

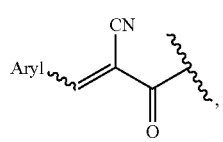

The present invention also discloses compositions, films and liquid crystalline displays ("LCD") made with the regioselectively substituted cellulose ester.

BRIEF DESCRIPTION OF THE FIGURES

Embodiments of the present invention are described herein with reference to the following figures, wherein:
FIG. 1(a) is prior art;
FIG. 1(b) is prior art.

DETAILED DESCRIPTION

Figure 1A:
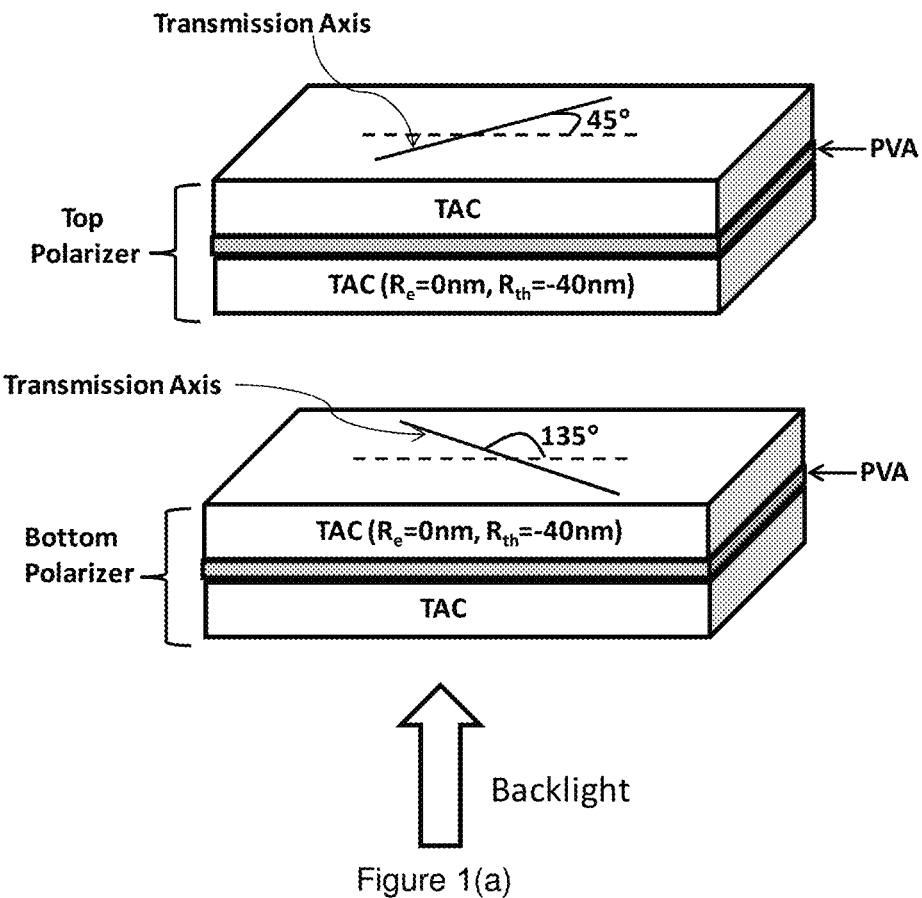
FIG. 1(a) schematically depicts backlight passing through a pair of crossed polarizers with two conventional cellulose triacetate ("TAC") films, each having an $R_e$ of 0 nm and an $R_{th}$ of −40 nm.

The present invention may be understood more readily by reference to the following detailed description of the invention and the examples provided therein. It is to be understood that this invention is not limited to the specific methods, formulations, and conditions described, as such may vary. It is also to be understood that the terminology used herein is for the purpose of describing particular aspects of the invention only and is not intended to be limiting.

Definitions

In this specification and in the claims that follow, reference will be made to a number of terms, which shall be defined to have the following meanings.

Values may be expressed as "about" or "approximately" a given number. Similarly, ranges may be expressed herein as from "about" one particular value and/or to "about" or another particular value. When such a range is expressed, another aspect includes from the one particular value and/or to the other particular value. Similarly, when values are expressed as approximations, by use of the antecedent "about," it will be understood that the particular value forms another aspect.

As used herein, the terms "a," "an," and "the" mean one or more.

As used herein, the term "and/or," when used in a list of two or more items, means that any one of the listed items can be employed by itself or any combination of two or more of the listed items can be employed. For example, if a composition is described as containing components A, B, and/or C, the composition can contain A alone; B alone; C alone; A and B in combination; A and C in combination, B and C in combination; or A, B, and C in combination.

As used herein, the terms "comprising," "comprises," and "comprise" are open-ended transition terms used to transition from a subject recited before the term to one or more elements recited after the term, where the element or elements listed after the transition term are not necessarily the only elements that make up the subject.

As used herein, the terms "having," "has," and "have" have the same open-ended meaning as "comprising," "comprises," and "comprise" provided above.

As used herein, the terms "including," "includes," and "include" have the same open-ended meaning as "comprising," "comprises," and "comprise" provided above.

Regioselectively substituted cellulose esters suitable for use in making optical films can comprise a plurality of alkyl-acyl substituents and a plurality of aryl-acyl substituents. As used herein, the term "acyl substituent" shall denote a substituent having the structure:

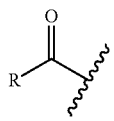

Such acyl groups in cellulose esters are generally bound to the pyranose ring of the cellulose via an ester linkage (i.e., through an oxygen atom).

As used herein, the term "aryl-acyl" substituent shall denote an acyl substituent where "R" is an aryl group. As used herein, the term "aryl" shall denote a univalent group formed by removing a hydrogen atom from a ring carbon in an arene (i.e., a mono- or polycyclic aromatic hydrocarbon). In some cases the aryl-acyl group is preceded by the carbon units: For example, $(C_{5-6})$aryl-acyl, $(C_{6-12})$aryl-acyl, or $(C_{6-20})$aryl-acyl. Examples of aryl groups suitable for use in various embodiments include, but are not limited to, phenyl, benzyl, tolyl, xylyl, and naphthyl. Such aryl groups can be substituted or unsubstituted.

As used herein, the term "alkyl-acyl" shall denote an acyl substituent where "R" is an alkyl group. As used herein, the term "alkyl" shall denote a univalent group formed by removing a hydrogen atom from a non-aromatic hydrocarbon, and may include heteroatoms. Alkyl groups suitable for use herein can be straight, branched, or cyclic, and can be saturated or unsaturated. Alkyl groups suitable for use herein include any $(C_{1-20})$, $(C_{1-12})$, $(C_{1-5})$, or $(C_{1-3})$ alkyl groups. In various embodiments, the alkyl can be a $C_{1-5}$ straight chain alkyl group. In still other embodiments, the alkyl can be a $C_{1-3}$ straight chain alkyl group. Specific examples of suitable alkyl groups include, but are not limited to, methyl, ethyl, n-propyl, isopropyl, n-butyl, isobutyl, sec-butyl, tert-butyl, pentyl, hexyl, octyl, decyl, dodecyl, cyclopentyl, and cyclohexyl groups. Examples of alkyl-acyl groups include acetyl, propionyl, butyroyl, and the like.

"Haloalkyl" means an alkyl substituent where at least one hydrogen is replaced with a halogen group. The carbon units in the haloalkyl group is often included; for example halo $(C_{1-6})$alkyl. The haloalkyl group can be straight or branched. Nonlimiting examples of haloalkyl include chloromethyl, trifluoromethyl, dibromoethyl and the like.

"Heteroaryl" means an aryl where at least one of the carbon units in the aryl ring is replaced with a heteroatom such as O, N, and S. The heteroaryl is ring can be monocyclic or polycyclic. Often the units making up the heteroaryl ring system is include; for example a 5- to 20-membered ring system. A 5-membered heteroaryl means a ring system having five atoms forming the heteroaryl ring. Nonlimiting examples of heteroaryl include pyridinyl, quinolinyl, pyrimidinyl, thiophenyl and the like.

"Alkoxy" means alkyl-O— or an alkyl group terminally attached to an oxygen group. Often the carbon units are included; for example $(C_{1-6})$alkoxy. Nonlimiting examples of alkoxy include Methoxy, ethoxy, propoxy and the like.

"Haloalkoxy" means alkoxy where at least one of the hydrogens is replace with a halogent. Often the carbon units are included; for example halo$(C_{1-6})$alkoxy. Nonlimiting examples of haloalkoxy include trifluoromethoxy, bromomethoxy, 1-bromo-ethoxy and the like.

"Halo" means halogen such as fluoro, chloro, bromo, or iodo.

As used herein, the term "substantially" means within 5%. For example, substantially perpendicular means a range of from 84.5 degrees to 94.5 degrees.

Substantially consumed means at least 95% or more has been consumed.

The term "naphthoyl" means

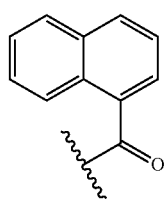 [SMILES: *C(=O)c1cccc2ccccc12]

(1-naphthoyl) or

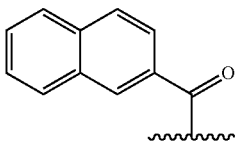 [SMILES: *C(=O)c1ccc2ccccc2c1]

(2-naphthoyl).

A plasticizer is a substance added to a resin or polymer to improve the properties of the resin or polymer such as improving the plasticity, flexibility and brittleness. Examples of plasticizers suitable for use in this invention include: Abitol E, Permalyn 3100, Permalyn 2085, Permalyn 6110, Foralyn 110, Admex 523, Optifilm Enhancer 400, Uniplex 552, Uniplex 280, Uniplex 809, triphenylphosphate, tri(ethylene glycol)bis(2-ethylhexoate), tri(ethyleneglycol)bis(n-octanoate), diethyl phthalate, and combinations thereof.

"Degree of Substitution" is used to describe the substitution level of the substituents of the substituents per anhydroglucose unit ("AGU"). Generally, conventional cellulose contains three hydroxyl groups in each AGU that can be substituted. Therefore, the DS can have a value between 0 and 3. However, low molecular weight cellulose mixed esters can have a total degree of substitution slightly above 3 from end group contributions. Low molecular weight cellulose mixed esters are discussed in more detail subsequently in this disclosure. Because DS is a statistical mean value, a value of 1 does not assure that every AGU has a single substituent. In some cases, there can be unsubstituted anhydroglucose units, some with two and some with three substituents, and more often than not the value will be a noninteger. Total DS is defined as the average number of all of substituents per anhydroglucose unit. The degree of substitution per AGU can also refer to a particular substituent, such as, for example, hydroxyl, acetyl, butyryl, or propionyl. Additionally, the degree of substitution can specify which carbon unit of the anhydroglucose unit.

Numerical Ranges

The present description uses numerical ranges to quantify certain parameters relating to the invention. It should be understood that when numerical ranges are provided, such ranges are to be construed as providing literal support for claim limitations that only recite the lower value of the range as well as claim limitations that only recite the upper value of the range. For example, a disclosed numerical range of 10 to 100 provides literal support for a claim reciting "greater than 10" (with no upper bounds) and a claim reciting "less than 100" (with no lower bounds).

The present description uses specific numerical values to quantify certain parameters relating to the invention, where the specific numerical values are not expressly part of a numerical range. It should be understood that each specific numerical value provided herein is to be construed as providing literal support for a broad, intermediate, and narrow range. The broad range associated with each specific numerical value is the numerical value plus and minus 60 percent of the numerical value, rounded to two significant digits. The intermediate range associated with each specific numerical value is the numerical value plus and minus 30 percent of the numerical value, rounded to two significant digits. The narrow range associated with each specific numerical value is the numerical value plus and minus 15 percent of the numerical value, rounded to two significant digits. For example, if the specification describes a specific temperature of 62° F., such a description provides literal support for a broad numerical range of 25° F. to 99° F. (62° F.+/−37° F.), an intermediate numerical range of 43° F. to 81° F. (62° F.+/−19° F.), and a narrow numerical range of 53° F. to 71° F. (62° F.+/−9° F.). These broad, intermediate, and narrow numerical ranges should be applied not only to the specific values, but should also be applied to differences between these specific values. Thus, if the specification describes a first pressure of 110 psia and a second pressure of 48 psia (a difference of 62 psi), the broad, intermediate, and narrow ranges for the pressure difference between these two streams would be 25 to 99 psi, 43 to 81 psi, and 53 to 71 psi, respectively.

Throughout this application, where patents or publications are referenced, the disclosures of these references in their entireties are intended to be incorporated by reference into this application, to the extent they are not inconsistent with the present invention, in order to more fully describe the state of the art to which the invention pertains.

As mentioned above, films prepared from cellulose esters can be employed in liquid crystal displays ("LCD"). Generally, LCDs employ a polarizer stacking including a set of crossed polarizers. For a typical set of crossed polarizers used in an LCD, there can be significant light leakage along the diagonals (leading to poor contrast ratio), particularly as the viewing angle is increased. Various optical films can be used to correct or "compensate" for this light leakage. These films can have certain well defined birefringences (or retardations) that vary depending on the type of liquid crystal cell used, since the liquid crystal cell itself will also impart a certain degree of undesirable optical retardation that must be corrected. Some of these compensation films are easier to make than others, so compromises are often made between performance and cost. Also, while most compensation and protective films are made by solvent casting, there is a push to make more films by melt extrusion so as to eliminate the need to handle environmentally unfriendly solvents. Having a material with more controllable optical retardation, that can be made by both solvent and melt casting, allows for greater flexibility in creating these films.

Optical films are commonly quantified in terms of birefringence which is, in turn, related to the refractive index n. The refractive index can typically be in the range of 1.4 to 1.8 for polymers in general, and can be approximately 1.46 to 1.50 for cellulose esters. The higher the refractive index, the slower a light wave propagates through that given material.

For an unoriented isotropic material, the refractive index will be the same regardless of the polarization state of the entering light wave. As the material becomes oriented, or otherwise anisotropic, the refractive index becomes dependent on material direction. For purposes of the present invention, there are three refractive indices of importance, denoted $n_x$, $n_y$, and $n_z$, which correspond to the machine direction ("MD"), the transverse direction ("TD") and the thickness direction respectively. As the material becomes more anisotropic (e.g., by stretching), the difference between any two refractive indices will increase. This difference is referred to as the "birefringence." Because there are many combinations of material directions to choose from, there are correspondingly different values of birefringence. The two that are the most common, namely the planar birefringence (or "in-plane" birefringence) $\Delta_e$ and the thickness birefringence (or "out-of-plane" birefringence) $\Delta_{th}$, are defined as:

$$\Delta_e = n_x - n_y \tag{1a}$$

$$\Delta_{th} = n_z - (n_x + n_y)/2 \tag{1b}$$

The birefringence $\Delta_e$ is a measure of the relative in-plane orientation between the MD and TD directions and is dimensionless. In contrast $\Delta_{th}$ gives a measure of the orientation of the thickness direction, relative to the average planar orientation.

Another term often used with regards to optical films is the optical retardation R. R is simply the birefringence times the thickness d, of the film in question. Thus, $$R_e=\Delta_e d=(n_x-n_y)d \qquad (2a)$$

$$R_{th}=\Delta_{th}d=[n_z-(n_x+n_y)/2]d \qquad (2b)$$

Retardation is a direct measure of the relative phase shift between the two orthogonal optical waves and is typically reported in units of nanometers (nm). Note that the definition of $R_{th}$ varies among some authors, particularly with regards to the sign (+/−), depending on how $R_{th}$ is calculated.

Materials are also known to vary with regards to their birefringence/retardation behavior. For example, most materials when stretched will exhibit a higher refractive index along the stretch direction and a lower refractive index perpendicular to the stretch. This follows because, on a molecular level, the refractive index is typically higher along the polymer chain's axis and lower perpendicular to the chain. These materials are commonly termed "positively birefringent" and represent most standard polymers, including current commercial cellulose esters. Note that, as we will describe later, a positively birefringent material can be used to make either positive or negative birefringent films or waveplates.

To avoid confusion, the birefringence behavior of the polymer molecule itself will be referred to as the "intrinsic birefringence" and is a property of the polymer. From a material optics standpoint, intrinsic birefringence is a measure of the birefringence that would occur if the material was fully stretched with all chains perfectly aligned in one direction (for most polymers this is a theoretical limit since they can never be fully aligned). For purposes of the present invention, it also provides a measure of the sensitivity of a given polymer to a given amount of chain orientation. For example, a sample with high intrinsic birefringence is going to exhibit more birefringence during film formation than a sample with low intrinsic birefringence, even though the relative stress levels in the film are approximately the same.

Polymers can have positive, negative, or zero intrinsic birefringence. Negative intrinsic birefringent polymers exhibit a higher refractive index perpendicular to the stretch direction (relative to the parallel direction). Certain styrenics and acrylics can have negative intrinsic birefringent behavior due to their rather bulky side groups. Depending on composition, some cellulose esters having aromatic ring structures can exhibit negative intrinsic birefringence as well. Zero intrinsic birefringence, in contrast, is a special case and represents materials that show no birefringence with stretching and thus have a zero intrinsic birefringence. Such materials can be ideal for certain optical applications as they can be molded, stretched, or otherwise stressed during processing without showing any optical retardation or distortion.

The actual compensation film(s) that is/are used in an LCD can take on a variety of forms including biaxial films where all three refractive indices differ and two optical axes exist, and uniaxial films having only one optical axis where two of the three refractive indices are the same. There are also other classes of compensation films where the optical axes twist or tilt through the thickness of the film (e.g., discotic films), but these are generally of lesser importance.

Generally, the type of compensation film that can be made is limited by the birefringence characteristics of the polymer (i.e., positive, negative or zero intrinsic birefringence). A few examples are described below.

In the case of uniaxial films, a film having refractive indices such that $$n_x>n_y=n_z \text{ "+A" optical film} \qquad (3a)$$

is denoted as a "+A" optical film. In such films, the x-direction (machine direction) of the film has a high refractive index, whereas the y and thickness directions are approximately equal in magnitude (and lower than $n_x$). This type of film is also referred to as a positive uniaxial crystal structure with the optic axis along the x-direction. Such films can be made by uniaxially stretching a positive intrinsic birefringent material using, for example, a film stretcher.

In contrast, a "−A" uniaxial film is defined as $$n_x<n_y=n_z \text{ "−A" optical film} \qquad (3b)$$

where the x-axis refractive index is lower than the other directions (which are approximately equal). One method for making a −A optical film is to stretch a negative intrinsic birefringent polymer or, alternately, by coating a negatively (intrinsic) birefringent liquid crystal polymer onto a surface such that the molecules are lined up in a preferred direction (for example, by using an underlying etched orientation layer).

In terms of retardation, "±A" optical films have the following relationship between $R_e$ and $R_{th}$, shown in (3c):

$$R_{th}=-R_e/2 \text{ "±A" optical films} \qquad (3c)$$

Another class of uniaxial optical films is the C optical film which can also be "+C" or "−C". The difference between a C and an A optical film is that, in C optical films, the unique refractive index (or optical axis) is in the thickness direction as opposed to in the plane of the film. Thus, $$n_z>n_y=n_x \text{ "+C" optical film} \qquad (4a)$$

$$n_z<n_y=n_x \text{ "−C" optical film} \qquad (4b)$$

C optical films can be produced by taking advantage of the stresses that form during solvent casting of a film. Tensile stresses are generally created in the plane of the film due to the restraint imposed by the casting belt, which are also equi-biaxial stretched in nature. These tend to align the chains in the plane of the film resulting in −C or +C films for positive and negative intrinsic birefringent materials respectively. As many cellulose ester films used in displays are solvent cast, and many are essentially positive birefringent, then it is apparent that solvent cast cellulose esters normally only produce −C optical films. These films can also be uniaxially stretched to produce +A optical films (assuming the initial as-cast retardation is very low).

Besides uniaxial optical films, it is also possible to use biaxial oriented films. Biaxial films are quantified in a variety of ways including simply listing the 3 refractive indices $n_x$, $n_y$ and $n_z$ in the principal directions (along with the direction of these principal axes). Generally, $n_x \neq n_y \neq n_z$.

One specific biaxial oriented film has unique optical properties to compensate light leakage of a pair of crossed polarizers or in-plane switching ("IPS") mode liquid crystal displays. The optical film has a parameter Nz in the range of from about 0.4 to about 0.9, or equals about 0.5, where Nz is defined as $$Nz=(n_x-n_z)/(n_x-n_y) \qquad (5)$$

This parameter gives the effective out-of-plane birefringence relative to the in-plane birefringence. Nz can be chosen to be about 0.5 when used as a compensation film for a pair of crossed polarizers. When Nz is about 0.5, the corresponding out-of-plane retardation, $R_{th}$, equals about 0.0 nm.

To show the optical film's compensation effect, the following light transmission or leakage of a pair of crossed polarizers with and without compensation films is calculated by computer simulation.

Figure 1B:
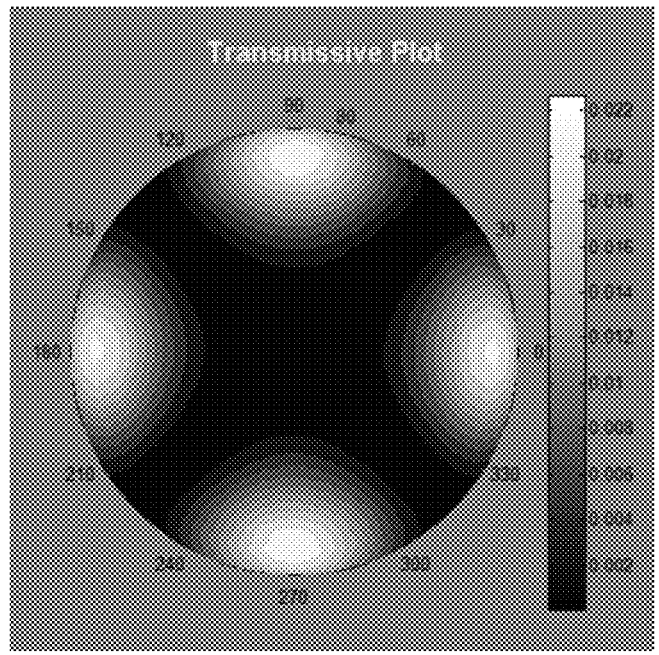
FIG. 1(b) depicts the calculated iso-contour plot of light transmission or light leakage of the structure depicted in FIG. 1(a)

FIG. 1(a) schematically indicates backlight passing through a pair of crossed polarizers having two conventional cellulose triacetate ("TAC") films, both of which have $R_e=0$ nm and $R_{th}=-40$ nm. FIG. 1(b) shows the calculated iso-contour plot of light transmission or light leakage according to the configuration structure of FIG. 1(a), which has a polar angle from 0° to 80° and an azimuthal angle from 0° to 360°. The calculated results show that there exists about 2.2% light leakage at 45° along the polarizer transmission axes.

Figure 2:
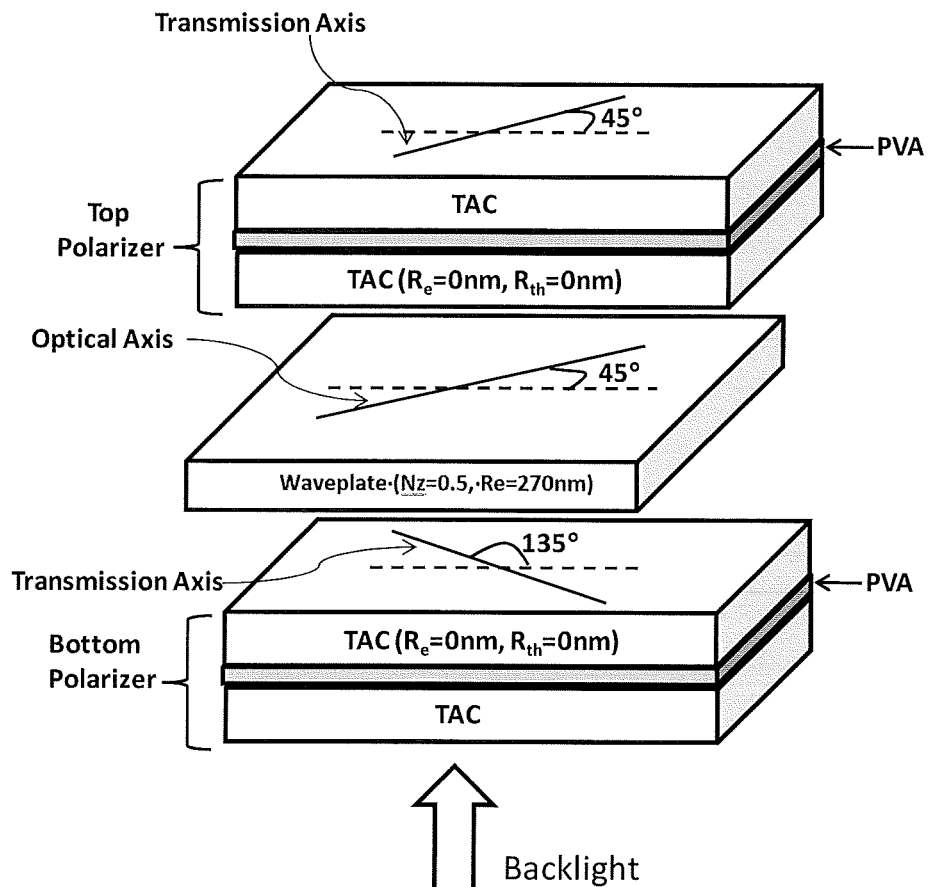
FIG. 2(a) schematically depicts backlight passing through a pair of crossed polarizers with a waveplate having an Nz of 0.5 and an $R_e$ of 270 nm disposed there between, where each polarizer comprises a zero retardation TAC film adjacent to the waveplate.
FIG. 2(b) depicts the calculated iso-contour plot of light transmission or light leakage of the structure depicted in FIG. 2(a)
Figure 2B:
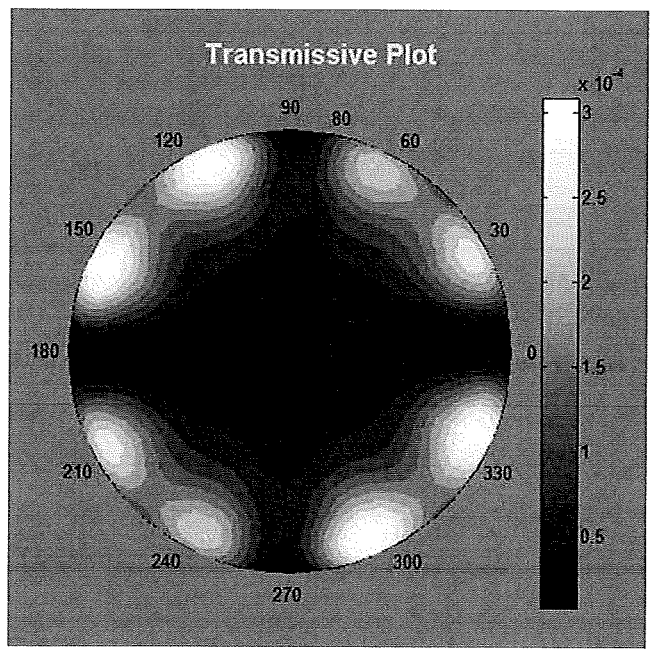

FIG. 2(a) schematically indicates backlight passing through a pair of crossed polarizers with one waveplate of Nz=0.5, $R_e=270$ nm, and two zero retardation TAC films ($R_e=0$ nm and $R_{th}=0$ nm). FIG. 2(b) shows the calculated iso-contour plot of light transmission or light leakage according to the configuration structure of FIG. 2(a), which has a polar angle from 0° to 80° and an azimuthal angle from 0° to 360°. The calculated results show that the maximum light leakage is reduced to about 0.03% at 45° along the polarizer transmission axes, which is a great improvement compared to the case illustrated in FIG. 1. Thus, a waveplate with Nz=0.5 and $R_e=270$ nm can play a role in reducing light leakage. Of course, such results are not limited to only waveplates having an Nz of 0.5 with an $R_e$ of 270. For example, the waveplate could also be a −A optical film with a $R_e$ of −270 nm, among others. If this waveplate is a cellulose based ester, it could replace one of the zero retardation films and adhere directly to the PVA layer, which could in turn reduce the manufacturing cost. As described below, various embodiments presented herein concern optical films (e.g., waveplates) having an Nz in the range of from about 0.4 to about 0.9, or of about 0.5, comprising cellulose esters.

Figure 3A:
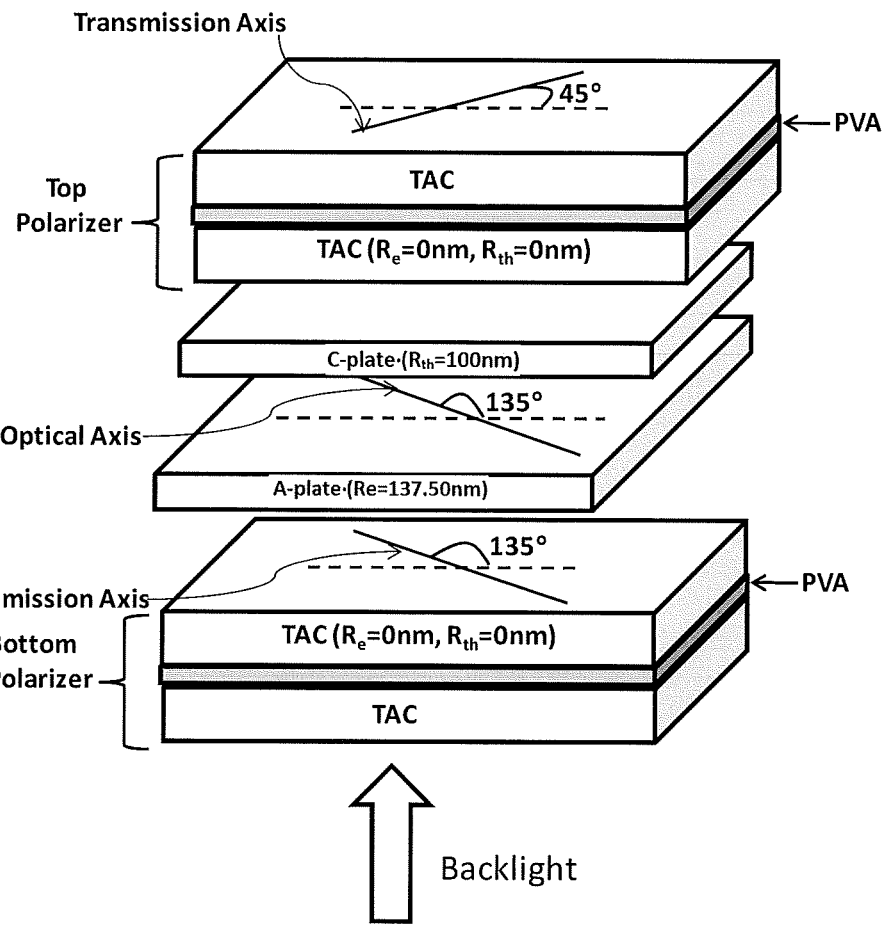
FIG. 3(a) schematically depicts backlight passing through a bottom polarizer and a top polarizer, where the pair of polarizers are crossed and have one +A plate ($R_e$=137.5 nm) and one +C plate ($R_{th}$=100 nm) disposed therebetween, where each polarizer comprises a zero retardation TAC film adjacent to the +A plate and +C plate, respectively.
Figure 3B:
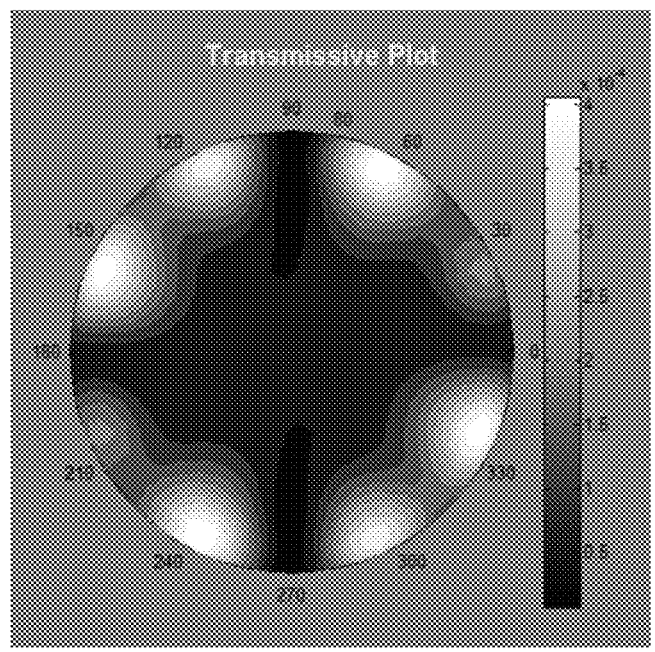
FIG. 3(b) depicts the calculated iso-contour plot of light transmission or light leakage of the structure depicted in FIG. 3(a).

FIG. 3(a) schematically indicates backlight passing through a pair of crossed polarizers with one +A optical film ($R_e=137.5$ nm), one +C optical film ($R_{th}=100$ nm) and two zero retardation TAC films ($R_e=0$ nm and $R_{th}=0$ nm). FIG. 3(b) shows the calculated iso-contour plot of light transmission or light leakage according to the configuration structure of FIG. 3(a), which has a polar angle from 0° to 80° and an azimuthal angle from 0° to 360°. The calculated results show that the maximum light leakage is reduced to about 0.04% at 45° along the polarizer transmission axes, which is also a great improvement compared to the case illustrated in FIG. 1. Therefore, the positive A and C optical films with indicated retardations played a role in reducing the light leakage. It needs to be pointed out that the waveplate could also be a −A optical film (with, for example, an $R_e$ of −137.5 nm) combined with a −C optical film (with, for example, an $R_{th}$ of −100 nm). The −A optical film could replace the bottom zero retardation film and adhere directly to the PVA layer, which in turn could reduce manufacturing costs. Various embodiments presented herein relate to −A optical films comprising cellulose esters.

The above simulation examples demonstrate that by adding appropriate optical films (e.g., waveplates), the light leakage of a pair of crossed polarizers can be greatly reduced. These optical films also could be used to compensate light leakage of in-plane switching ("IPS") mode liquid crystal displays, since, though not wishing to bound by theory, it is believed that the light leakage of IPS-LCDs comes primarily from the crossed polarizers.

In various embodiments, regioselectively substituted cellulose esters can be employed in which the aryl-acyl substituent is preferentially installed at C2 and C3 of the pyranose ring. Regioselectivity can be measured by determining the relative degree of substitution ("RDS") at C6, C3, and C2 in the cellulose ester by carbon 13 NMR spectroscopy (*Macromolecules*, 1991, 24, 3050-3059). In the case of one type of acyl substituent or when a second acyl substituent is present in a minor amount (DS<0.2), the RDS can be most easily determined directly by integration of the ring carbons. When 2 or more acyl substituents are present in similar amounts, in addition to determining the ring RDS, it is sometimes necessary to fully substitute the cellulose ester with an additional substituent in order to independently determine the RDS of each substituent by integration of the carbonyl carbons. In conventional cellulose esters, regioselectivity is generally not observed and the RDS ratio of C6/C3, C6/C2, or C3/C2 is generally near 1 or less. In essence, conventional cellulose esters are random copolymers. In contrast, when adding one or more acylating reagents to cellulose dissolved in an appropriate solvent, the C6 position of cellulose is acylated much faster than C2 and C3 positions. Consequently, the C6/C3 and C6/C2 ratios are significantly greater than 1, which is characteristic of a 6,3- or 6,2-enhanced regioselectively substituted cellulose ester.

Examples of regioselectively substituted cellulose esters and their methods for preparation are described in US 2010/0029927, US 2010/0267942, and U.S. Pat. No. 8,354,525; the contents of which are hereby incorporated by reference. In general, these applications concern preparation of cellulose esters by dissolution of cellulose in an ionic liquid, which is then contacted with an acylating reagent. Accordingly, for various embodiments of the present invention, two general methods can be employed for preparing regioselectively substituted cellulose esters. In one method, regioselectively substituted cellulose esters can be prepared using a staged addition by first contacting the cellulose solution with one or more alkyl acylating reagents followed by contacting the cellulose solution with an aryl-acylating reagent at a contact temperature and contact time sufficient to provide a cellulose ester with the desired degree of substitution ("DS") and degree of polymerization ("DP"). In this staged addition, the acyl groups containing alkyl groups can be preferentially installed at C6 and the acyl groups containing an aryl group can be preferentially installed at C2 and/or C3. Alternatively, the regioselectively substituted cellulose esters can be prepared by contacting the cellulose solution with one or more alkyl acylating reagents followed by isolation of the alkyl ester in which the acyl groups containing alkyl groups are preferentially installed at C6. The alkyl ester can then be dissolved in any appropriate organic solvent and contacted with an aryl-acylating reagent which can preferentially install the acyl groups containing an aryl group at C2 and/or C3 at a contact temperature and contact time sufficient to provide a cellulose ester with the desired degree of substitution ("DS") and degree of polymerization ("DP"). The cellulose esters thus prepared generally comprise the following structure:

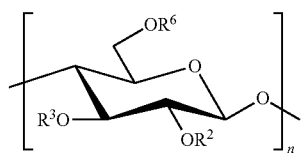

where $R^2$, $R^3$, and $R^6$ are hydrogen (with the proviso that $R^2$, $R^3$, and $R^6$ are not hydrogen simultaneously), alkyl-acyl groups, and/or aryl-acyl groups (such as those described above) bound to the cellulose via an ester linkage.

The degree of polymerization ("DP") of the cellulose esters prepared by these methods can be at least 10. In other embodiments, the DP of the cellulose esters can be at least 50, at least 100, or at least 250. In other embodiments, the DP of the cellulose esters can be in the range of from about 5 to about 100, or in the range of from about 10 to about 50.

Acylating reagents suitable for use herein can include, but are not limited to, alkyl or aryl carboxylic anhydrides, carboxylic acid halides, and/or carboxylic acid esters containing the above-described alkyl or aryl groups suitable for use in the acyl substituents of the regioselectively substituted cellulose esters described herein. Examples of suitable carboxylic anhydrides include, but are not limited to, acetic anhydride, propionic anhydride, butyric anhydride, pivaloyl anhydride, benzoic anhydride, and naphthoyl anhydride. Examples of carboxylic acid halides include, but are not limited to, acetyl, propionyl, butyryl, pivaloyl, benzoyl, and naphthoyl chlorides or bromides. Examples of carboxylic acid esters include, but are not limited to, acetyl, propionyl, butyryl, pivaloyl, benzoyl and naphthoyl methyl esters. In one or more embodiments, the acylating reagent can be one or more carboxylic anhydrides selected from the group consisting of acetic anhydride, propionic anhydride, butyric anhydride, pivaloyl anhydride, benzoyl anhydride, and naphthoyl anhydride.

The present application discloses a regioselectively substituted cellulose ester comprising: (a) a plurality of chromophore-acyl substituents; and (b) a plurality of pivaloyl substituents, wherein the cellulose ester has a hydroxyl degree of substitution ("$DS_{OH}$") in the range of from about 0 to about 0.9, wherein the cellulose ester has a pivaloyl degree of substitution ("$DS_{Pv}$") in the range of from about 0.1 to about 1.2, wherein the cellulose ester has a chromophore-acyl degree of substitution ("$DS_{Ch}$") in the range of from about 0.5 to about 1.6, and wherein the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is between about 0.5 and about 1.6, wherein the chromophore-acyl is chosen from (i) an $(C_{6-20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

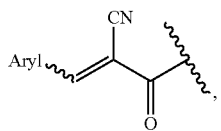

wherein the aryl is a $C_{1-6}$ aryl, and wherein the aryl is unsubstituted or substituted by 1-5 $R^1$; or

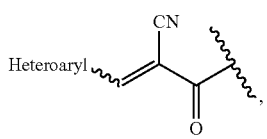

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro; cyano; $(C_{1-6})$ alkyl; halo$(C_{1-6})$alkyl; halo; $(C_{6-20})$aryl-$CO_2$—; $(C_{6-20})$aryl; $(C_{1-6})$alkoxy; halo$(C_{1-6})$alkoxy; 5- to 10-membered heteroaryl having 1-4 heteroatoms chosen from N, O, or S; or

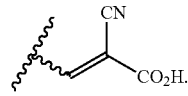

In one embodiment, the $DS_{Pv}$ is in the range of from about 0.2 to about 0.8. In one embodiment, the $DS_{Pv}$ is in the range of from about 0.3 to about 0.5. In one embodiment, the $DS_{Pv}$ is in the range of from about 0.1 to about 0.6. In one embodiment, the $DS_{Pv}$ is in the range of from about 0.8 to about 1.2.

In one embodiment, the $DS_{Ch}$ is in the range of from about 0.5 to about 1.5. In one embodiment, the $DS_{Ch}$ is in the range of from about 0.4 to about 0.8. In one embodiment, the $DS_{Ch}$ is in the range of from about 0.8 to about 1.6. In one embodiment, the $DS_{Ch}$ is in the range of from about 0.7 to about 1.0.

In one embodiment, the $DS_{OH}$ is in the range of from about 0.1 to about 0.6. In one embodiment, the $DS_{OH}$ is in the range of from about 0.1 to about 0.4. In one embodiment, the $DS_{OH}$ is in the range of from about 0.4 to about 0.9.

In one embodiment, the $DS_{OH}$ is in the range of from about 0.2 to about 0.3, the $DS_{Pv}$ is in the range of from about 0.3 to about 0.5, and the $DS_{Ch}$ is in the range of from about 1.0 to about 1.3. In one class of this embodiment, the regioselective cellulose ester further comprises a plurality of a $(C_{1-6})$alkyl-acyl substituent. In one class of this embodiment, the $C2DS_{Ch}$ minus $C3DS_{Ch}$ is greater than 0.1. In one subclass of this class, the regioselectively substituted cellulose ester further comprises a plurality of a $(C_{1-6})$alkyl-acyl substituent. In one class of this embodiment, the $C2DS_{Ch}$ minus $C3DS_{Ch}$ is greater than 0.2. In one subclass of this class, the regioselectively substituted cellulose ester further comprises a plurality of a $(C_{1-6})$alkyl-acyl substituent.

In one class of this embodiment, the chromophore-acyl is a benzoyl unsubstituted or substituted by 1-5 $R^1$ or a naphthoyl unsubstituted or substituted by 1-5 $R^1$. In one subclass of this class, the regioselectively substituted cellulose ester further comprises a plurality of a $(C_{1-6})$alkyl-acyl substituent. In one class of this embodiment, the chromophore-acyl is a benzoyl unsubstituted or substituted by 1-5 $R^1$. In one subclass of this class, the regioselectively substituted cellulose ester further comprises a plurality of a $(C_{1-6})$alkyl-acyl substituent. In one class of this embodiment, the chromophore-acyl is or a naphthoyl unsubstituted or substituted by 1-5 $R^1$. In one subclass of this class, the regioselectively substituted cellulose ester further comprises a plurality of a $(C_{1-6})$alkyl-acyl substituent. In one class of this embodiment, the chromophore-acyl is naphthoyl. In one class of this embodiment, the chromophore-acyl is benzoyl. In one subclass of this class, the regioselectively substituted cellulose ester further comprises a plurality of a $(C_{1-6})$alkyl-acyl substituent.

In one embodiment, the $DS_{OH}$ is in the range of from about 0.1 to about 0.6, the $DS_{Pv}$ is in the range of from about 0.1 to about 0.6, and the $DS_{Ch}$ is in the range of from about 0.5 to about 1.5. In one class of this embodiment, the $C2DS_{Ch}$ minus $C3DS_{Ch}$ is greater than 0.1. In one subclass of this class, the regioselectively substituted cellulose ester further comprises a plurality of a ($C_{1-6}$)alkyl-acyl substituent. In one class of this embodiment, the C2DS$_{Ch}$ minus C3DS$_{Ch}$ is greater than 0.2. In one subclass of this class, the regioselectively substituted cellulose ester further comprises a plurality of a ($C_{1-6}$)alkyl-acyl substituent.

In one class of this embodiment, the regioselective cellulose ester further comprises a plurality of a ($C_{1-6}$)alkyl-acyl substituent. In one subclass of this class, the degree of substitution of the ($C_{1-6}$)alkyl-acyl substituent ("DS$_{AK}$") is in the range of from about 0.1 to about 1.4.

In one subclass of this class, the ($C_{1-6}$)alkyl-acyl substituent is chosen from acetyl, propionyl, butyryl, pentanoyl, or hexanoyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent is chosen from acetyl or propionyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent propionyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent acetyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent butyryl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent pentanoyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent hexanoyl. In one sub-subclass of this subclass, the degree of substitution of the ($C_{1-6}$)alkyl-acyl substituent ("DS$_{AK}$") is in the range of from about 0.1 to about 1.4.

In one embodiment, the DS$_{OH}$ is in the range of from about 0.1 to about 1.1, the DS$_{Pv}$ is in the range of from about 0.3 to about 0.4, and the DS$_{Ch}$ is in the range of from about 0.3 to about 1.1. In one class of this embodiment, the C2DS$_{Ch}$ minus C3DS$_{Ch}$ is greater than 0.1. In one subclass of this class, the regioselectively substituted cellulose ester further comprises a plurality of a ($C_{1-6}$)alkyl-acyl substituent. In one class of this embodiment, the C2DS$_{Ch}$ minus C3DS$_{Ch}$ is greater than 0.2. In one subclass of this class, the regioselectively substituted cellulose ester further comprises a plurality of a ($C_{1-6}$)alkyl-acyl substituent.

In one class of this embodiment, the regioselective cellulose ester further comprises a plurality of a ($C_{1-6}$)alkyl-acyl substituent. In one subclass of this class, the degree of substitution of the ($C_{1-6}$)alkyl-acyl substituent ("DS$_{Ak}$") is in the range of from about 0.1 to about 1.3.

In one subclass of this class, the ($C_{1-6}$)alkyl-acyl substituent is chosen from acetyl, propionyl, butyryl, pentanoyl, or hexanoyl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent is chosen from acetyl or propionyl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent propionyl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent acetyl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent butyryl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent pentanoyl. In one sub-subclass of this subclass, the degree of substitution of the ($C_{1-6}$)alkyl-acyl substituent ("DS$_{AK}$") is in the range of from about 0.1 to about 1.3. In one subclass of this class, the ($C_{1-6}$)alkyl-acyl substituent hexanoyl. In one sub-subclass of this subclass, the degree of substitution of the ($C_{1-6}$)alkyl-acyl substituent ("DS$_{AK}$") is in the range of from about 0.1 to about 1.3.

In one embodiment, the DS$_{OH}$ is in the range of from about 0.1 to about 1.0, the DS$_{Pv}$ is in the range of from about 0.3 to about 0.5, and the DS$_{Ch}$ is in the range of from about 0.8 to about 1.3. In one class of this embodiment, the C2DS$_{Ch}$ minus C3DS$_{Ch}$ is greater than 0.1. In one subclass of this class, the regioselectively substituted cellulose ester further comprises a plurality of a ($C_{1-6}$)alkyl-acyl substituent. In one class of this embodiment, the C2DS$_{Ch}$ minus C3DS$_{Ch}$ is greater than 0.2. In one subclass of this class, the regioselectively substituted cellulose ester further comprises a plurality of a ($C_{1-6}$)alkyl-acyl substituent.

In one class of this embodiment, the regioselective cellulose ester further comprises a plurality of a ($C_{1-6}$)alkyl-acyl substituent. In one subclass of this class, the degree of substitution of the ($C_{1-6}$)alkyl-acyl substituent ("DS$_{Ak}$") is in the range of from about 0.1 to about 1.4.

In one subclass of this class, the ($C_{1-6}$)alkyl-acyl substituent is chosen from acetyl, propionyl, butyryl, pentanoyl, or hexanoyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent is chosen from acetyl or propionyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent propionyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent acetyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent butyryl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent pentanoyl. In one sub-subclass of this subclass, the degree of substitution of the ($C_{1-6}$)alkyl-acyl substituent ("DS$_{AK}$") is in the range of from about 0.1 to about 1.4. In one subclass of this class, the ($C_{1-6}$)alkyl-acyl substituent hexanoyl. In one sub-subclass of this subclass, the degree of substitution of the ($C_{1-6}$)alkyl-acyl substituent ("DS$_{AK}$") is in the range of from about 0.1 to about 1.4.

In one embodiment, the regioselectivity is such that the sum of the chromophore-acyl degree of substitution at C2 and C3 ("C2DS$_{Ch}$" and "C3DS$_{Ch}$") minus the chromophore-acyl degree of substitution at C6 ("C6DS$_{Ch}$") is in the range of from about 0.5 to about 1.6. In one class of this embodiment, C2DS$_{Ch}$ minus C3DS$_{Ch}$ is greater than 0.1. In one class of this embodiment, C2DS$_{Ch}$ minus C3DS$_{Ch}$ is greater than 0.2. In one class of this embodiment, $C2DS_{Ch}$ minus $C3DS_{Ch}$ is greater than 0.3. In one class of this embodiment, $C2DS_{Ch}$ minus $C3DS_{Ch}$ is greater than 0.4.

In one embodiment, the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is in the range of from about 0.8 to about 1.6. In one class of this embodiment, $C2DS_{Ch}$ minus $C3DS_{Ch}$ is greater than 0.1. In one class of this embodiment, $C2DS_{Ch}$ minus $C3DS_{Ch}$ is greater than 0.2. In one class of this embodiment, $C2DS_{Ch}$ minus $C3DS_{Ch}$ is greater than 0.3. In one class of this embodiment, $C2DS_{Ch}$ minus $C3DS_{Ch}$ is greater than 0.4.

In one embodiment, the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is in the range of from about 0.9 to about 1.6. In one class of this embodiment, $C2DS_{Ch}$ minus $C3DS_{Ch}$ is greater than 0.1. In one class of this embodiment, $C2DS_{Ch}$ minus $C3DS_{Ch}$ is greater than 0.2. In one class of this embodiment, $C2DS_{Ch}$ minus $C3DS_{Ch}$ is greater than 0.3. In one class of this embodiment, $C2DS_{Ch}$ minus $C3DS_{Ch}$ is greater than 0.4.

In one embodiment, the chromophore-acyl is an unsubstituted or substituted benzoyl or an unsubstituted or substituted naphthoyl, wherein the $DS_{OH}$ is in the range of from about 0.2 to about 0.3, wherein $DS_{Pv}$ is in the range of from about 0.3 to about 0.5, wherein the $DS_{Ch}$ is in the range of from about 1.0 to about 1.3. In one class of this embodiment, the regioselective cellulose ester further comprises a plurality of a ($C_{1-6}$)alkyl-acyl substituent. In one subclass of this class, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent is chosen from acetyl, propionyl, butyryl, pentanoyl, or hexanoyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent is chosen from acetyl or propionyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent propionyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent acetyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent butyryl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent pentanoyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent hexanoyl. In one sub-subclass of this subclass, the degree of substitution of the ($C_{1-6}$)alkyl-acyl substituent ("$DS_{Ak}$") is in the range of from about 0.1 to about 1.4.

In one embodiment, the chromophore-acyl is an unsubstituted or substituted benzoyl or an unsubstituted or substituted naphthoyl, wherein the $DS_{OH}$ is in the range of from about 0.1 to about 0.6, wherein $DS_{Pv}$ is in the range of from about 0.1 to about 0.6, wherein the $DS_{Ar}$ is in the range of from about 0.5 to about 1.5. In one class of this embodiment, the regioselective cellulose ester further comprises a plurality of a ($C_{1-6}$)alkyl-acyl substituent. In one subclass of this class, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent is chosen from acetyl, propionyl, butyryl, pentanoyl, or hexanoyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent is chosen from acetyl or propionyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent propionyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent acetyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent butyryl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent pentanoyl. In one sub-subclass of this subclass, the degree of substitution of the ($C_{1-6}$)alkyl-acyl substituent ("$DS_{Ak}$") is in the range of from about 0.1 to about 1.4. In one subclass of this class, the ($C_{1-6}$)alkyl-acyl substituent hexanoyl. In one sub-subclass of this subclass, the degree of substitution of the ($C_{1-6}$)alkyl-acyl substituent ("$DS_{Ak}$") is in the range of from about 0.1 to about 1.4.

In one embodiment, the chromophore-acyl has an absorption maximum ($\lambda_{max}$) in the range from about 200 nm to about 350 nm. In one class of this embodiment, the regioselectively substituted cellulose ester further comprises a plurality of a ($C_{1-6}$)alkyl-acyl substituent. In one subclass of this class, the regioselectively substituted cellulose ester further comprises a plurality of a ($C_{1-6}$)alkyl-acyl substituent. In one sub-subclass of this subclass, the ($C_{1-6}$)alkyl-acyl substituent is chosen from acetyl, propionyl, butyryl, pentanoyl, or hexanoyl. In one sub-subclass of this subclass, the ($C_{1-6}$)alkyl-acyl substituent is chosen from acetyl or propionyl. In one sub-subclass of this subclass, the ($C_{1-6}$)alkyl-acyl substituent propionyl. In one sub-subclass of this subclass, the ($C_{1-6}$)alkyl-acyl substituent acetyl. In one sub-subclass of this subclass, the ($C_{1-6}$)alkyl-acyl substituent butyryl. In one sub-subclass of this subclass, the ($C_{1-6}$)alkyl-acyl substituent pentanoyl. In one sub-subclass of this subclass, the ($C_{1-6}$)alkyl-acyl substituent hexanoyl.

In one class of this embodiment, the chromophore-acyl has an absorption maximum ($\lambda_{max}$) in the range from about 230 nm to about 270 nm. In one class of this embodiment, the chromophore-acyl has an absorption maximum ($\lambda_{max}$) in the range from about 247 nm to about 350 nm.

In one embodiment, chromophore-acyl is ($C_{6-20}$)aryl-acyl, unsubstituted or substituted by 1-5 $R^1$. In one class of this embodiment, the regioselectively substituted cellulose ester further comprises a plurality of a ($C_{1-6}$)alkyl-acyl substituent. In one sub-subclass of this subclass, the ($C_{1-6}$) alkyl-acyl substituent is chosen from acetyl, propionyl, butyryl, pentanoyl, or hexanoyl. In one sub-subclass of this subclass, the ($C_{1-6}$)alkyl-acyl substituent is chosen from acetyl or propionyl. In one sub-subclass of this subclass, the ($C_{1-6}$)alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is heteroaryl-acyl, wherein the heteroaryl is a 5- to 10-membered ring having 1-4 heteroatoms chosen from N, O, or S, and wherein the heteroaryl is unsubstituted or substituted by 1-5 $R^1$. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is wherein the aryl is a $C_{1-6}$ aryl, and wherein the aryl is unsubstituted or substituted by 1-5 $R^1$. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is wherein the heteroaryl is a 5- to 10-membered ring having 1-4 heteroatoms chosen from N, O or S, and wherein the heteroaryl is unsubstituted or substituted by 1-5 $R^1$. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, chromophore-acyl is chosen from a benzoyl unsubstituted or substituted by 1-5 $R^1$, or naphthoyl unsubstituted or substituted by 1-5 $R^1$. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, chromophore-acyl is benzoyl unsubstituted or substituted by 1-5 $R^1$. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, chromophore-acyl is naphthoyl unsubstituted or substituted by 1-5 $R^1$. In one class of this embodiment, the naphthoyl is a 2-naphthoyl. In one class of this embodiment, the naphthoyl is a 1-naphthoyl. In one class of this embodiment, the regioselective cellulose ester further comprises a plurality of a $(C_{1-6})$alkyl-acyl substituent. In one sub-subclass of this subclass, the $(C_{1-6})$alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is chosen from

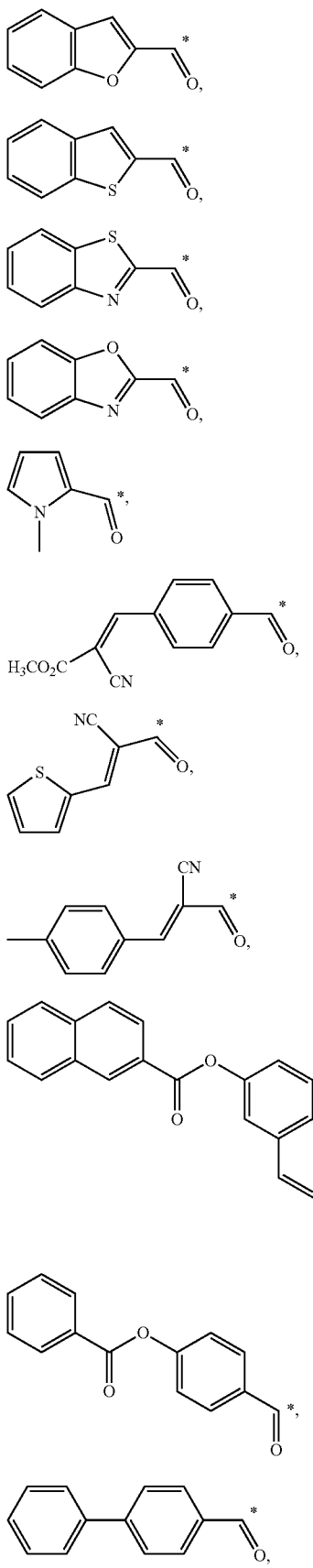
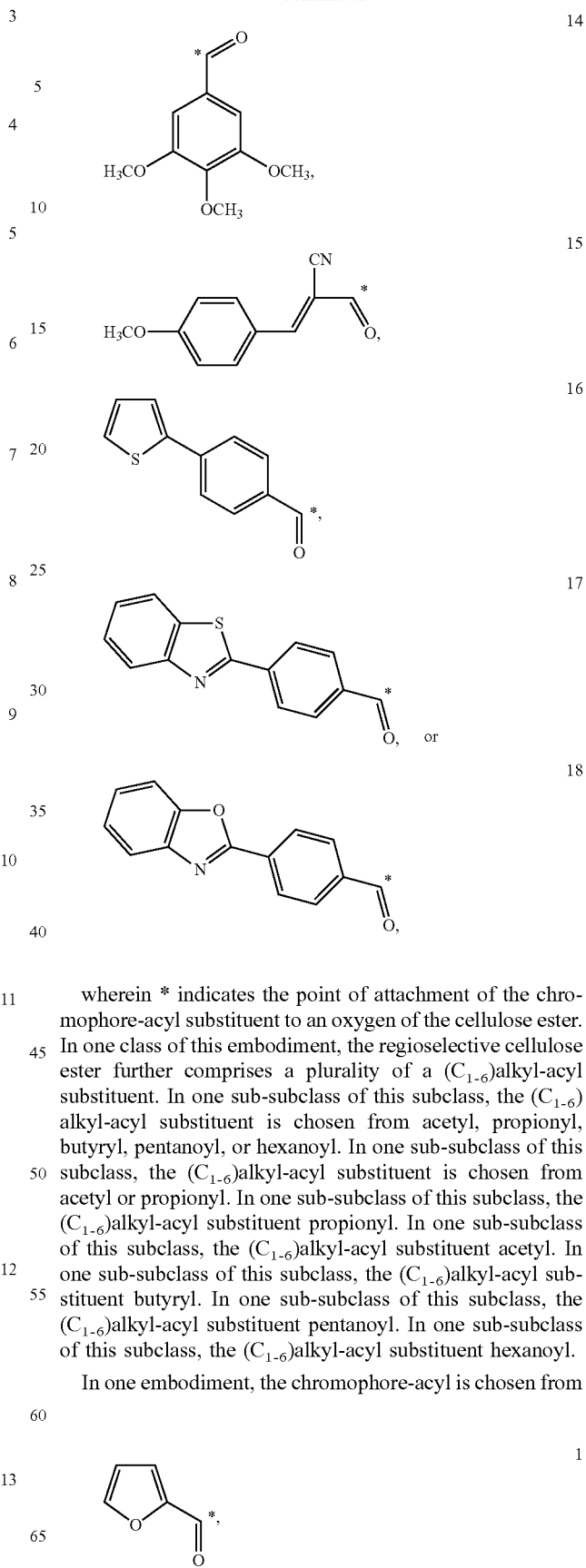

wherein * indicates the point of attachment of the chromophore-acyl substituent to an oxygen of the cellulose ester. In one class of this embodiment, the regioselective cellulose ester further comprises a plurality of a $(C_{1-6})$alkyl-acyl substituent. In one sub-subclass of this subclass, the $(C_{1-6})$ alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is chosen from

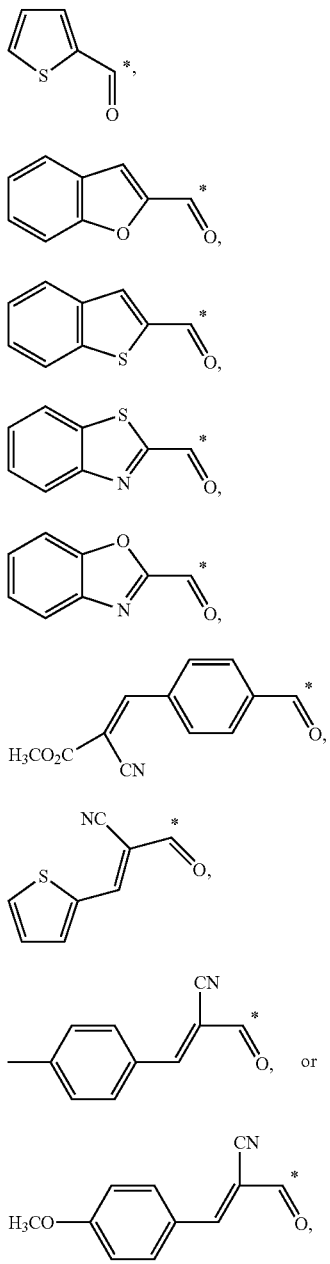
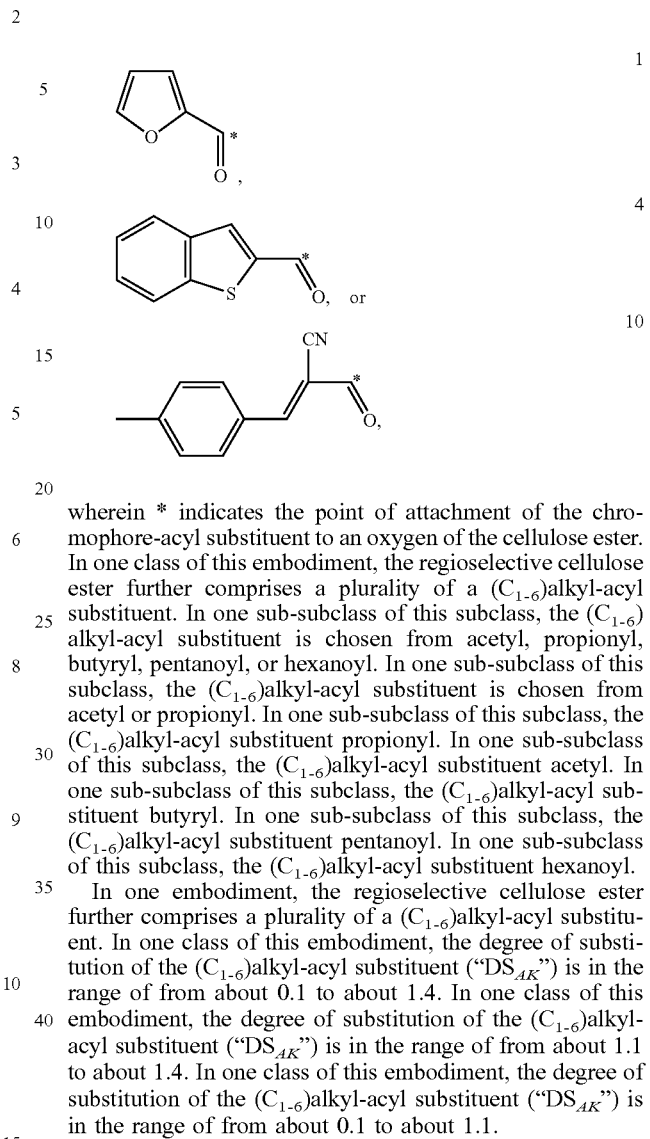

wherein * indicates the point of attachment of the chromophore-acyl substituent to an oxygen of the cellulose ester. In one class of this embodiment, the regioselective cellulose ester further comprises a plurality of a $(C_{1-6})$alkyl-acyl substituent. In one sub-subclass of this subclass, the $(C_{1-6})$ alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the chromophore-acyl is chosen from wherein * indicates the point of attachment of the chromophore-acyl substituent to an oxygen of the cellulose ester. In one class of this embodiment, the regioselective cellulose ester further comprises a plurality of a $(C_{1-6})$alkyl-acyl substituent. In one sub-subclass of this subclass, the $(C_{1-6})$ alkyl-acyl substituent is chosen from acetyl, propionyl, butyryl, pentanoyl, or hexanoyl. In one sub-subclass of this subclass, the $(C_{1-6})$alkyl-acyl substituent is chosen from acetyl or propionyl. In one sub-subclass of this subclass, the $(C_{1-6})$alkyl-acyl substituent propionyl. In one sub-subclass of this subclass, the $(C_{1-6})$alkyl-acyl substituent acetyl. In one sub-subclass of this subclass, the $(C_{1-6})$alkyl-acyl substituent butyryl. In one sub-subclass of this subclass, the $(C_{1-6})$alkyl-acyl substituent pentanoyl. In one sub-subclass of this subclass, the $(C_{1-6})$alkyl-acyl substituent hexanoyl.

In one embodiment, the regioselective cellulose ester further comprises a plurality of a $(C_{1-6})$alkyl-acyl substituent. In one class of this embodiment, the degree of substitution of the $(C_{1-6})$alkyl-acyl substituent ("$DS_{AK}$") is in the range of from about 0.1 to about 1.4. In one class of this embodiment, the degree of substitution of the $(C_{1-6})$alkyl-acyl substituent ("$DS_{AK}$") is in the range of from about 1.1 to about 1.4. In one class of this embodiment, the degree of substitution of the $(C_{1-6})$alkyl-acyl substituent ("$DS_{AK}$") is in the range of from about 0.1 to about 1.1.

In one class of this embodiment, the $(C_{1-6})$alkyl-acyl substituent is chosen from acetyl, propionyl, butyryl, pentanoyl, or hexanoyl. In one subclass of this class, the degree of substitution of the $(C_{1-6})$alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1. In one class of this embodiment, the $(C_{1-6})$alkyl-acyl substituent is chosen from acetyl or propionyl. In one subclass of this class, the degree of substitution of the $(C_{1-6})$alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1. In one class of this embodiment, the $(C_{1-6})$alkyl-acyl substituent propionyl. In one subclass of this class, the degree of substitution of the $(C_{1-6})$alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1. In one class of this embodiment, the $(C_{1-6})$alkyl-acyl substituent acetyl. In one subclass of this class, the degree of substitution of the $(C_{1-6})$alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1. In one class of this embodiment, the $(C_{1-6})$alkyl-acyl substituent butyryl. In one subclass of this class, the degree of substitution of the $(C_{1-6})$alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1. In one class of this embodiment, the $(C_{1-6})$alkyl-acyl substituent pentanoyl. In one class of this embodiment, the $(C_{1-6})$alkyl-acyl substituent hexanoyl. In one subclass of this class, the degree of substitution of the $(C_{1-6})$ alkyl-acyl substituent ("$DS_{AK}$") is in the range of from about 0.1 to about 1.4. In one subclass of this class, the degree of substitution of the $(C_{1-6})$alkyl-acyl substituent ("$DS_{AK}$") is in the range of from about 1.1 to about 1.4. In one subclass of this class, the degree of substitution of the $(C_{1-6})$alkyl-acyl substituent ("$DS_{AK}$") is in the range of from about 0.1 to about 1.1.

Films

The present application also discloses a film comprising a regioselectively substituted cellulose ester comprising: (a) a plurality of chromophore-acyl substituents; and (b) a plurality of pivaloyl substituents, wherein the cellulose ester has a hydroxyl degree of substitution ("$DS_{OH}$") in the range of from about 0 to about 0.9, wherein the cellulose ester has a pivaloyl degree of substitution ("$DS_{Pv}$") in the range of from about 0.1 to about 1.2, wherein the cellulose ester has a chromophore-acyl degree of substitution ("$DS_{Ch}$") in the range of from about 0.5 to about 1.6, and wherein the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is between about 0.5 and about 1.6, wherein the chromophore-acyl is chosen from (i) an $(C_{6-20})$ aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

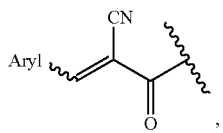

(iii)

wherein the aryl is a $C_{1-6}$ aryl, and wherein the aryl is unsubstituted or substituted by 1-5 $R^1$; or

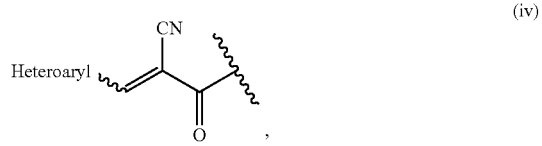

(iv)

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$ alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

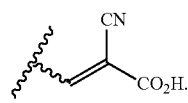

In one embodiment of this film, the chromophore-acyl is an $(C_{6-20})$aryl-acyl, wherein the aryl is unsubstituted or substituted by 1-5 $R^1$. In one class of this embodiment, the regioselectively substituted cellulose ester further comprises a plurality of a $(C_{1-6})$alkyl-acyl substituent.

In one class of this embodiment, the $(C_{6-20})$aryl-acyl is benzoyl or naphthoyl. In one subclass of this class, the regioselectively substituted cellulose ester further comprises a plurality of a $(C_{1-6})$alkyl-acyl substituent.

In one class of this embodiment, the $(C_{6-20})$aryl-acyl is benzoyl.

In one class of this embodiment, the $(C_{6-20})$aryl-acyl is naphthoyl. In one subclass of this class, the naphthoyl is 2-naphthoyl. In one subclass of this class, the naphthoyl is 1-naphthoyl.

In one embodiment of this film, the chromophore-acyl is a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$. In one class of this embodiment, the regioselectively substituted cellulose ester further comprises a plurality of a $(C_{1-6})$alkyl-acyl substituent.

In one embodiment of this film, the chromophore-acyl is

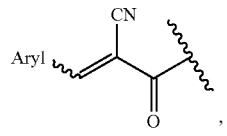

wherein the aryl is a $C_{1-6}$ aryl, and wherein the aryl is unsubstituted or substituted by 1-5 $R^1$. In one class of this embodiment, the regioselectively substituted cellulose ester further comprises a plurality of a $(C_{1-6})$alkyl-acyl substituent.

In one embodiment of this film, the chromophore-acyl is

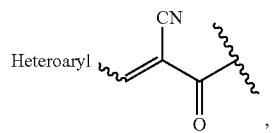

wherein the heteroaryl is a 5- to 10-membered ring having 1-4 heteroatoms chosen from N, O or S, and wherein the heteroaryl is unsubstituted or substituted by 1-5 R¹. In one class of this embodiment, the regioselectively substituted cellulose ester further comprises a plurality of a $(C_{1-6})$alkyl-acyl substituent.

In one embodiment of this film, the chromophore-acyl is chosen from

1
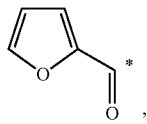

2
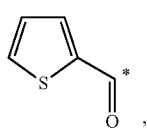

3
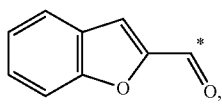

4
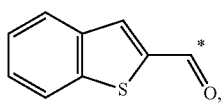

5
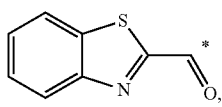

6
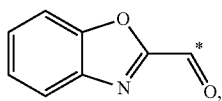

7
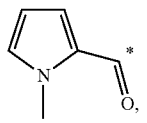

8
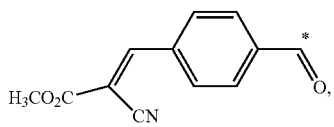

9
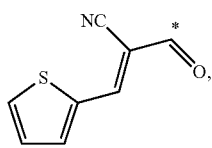

10
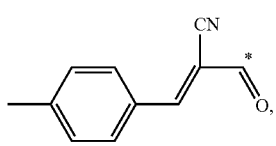

11
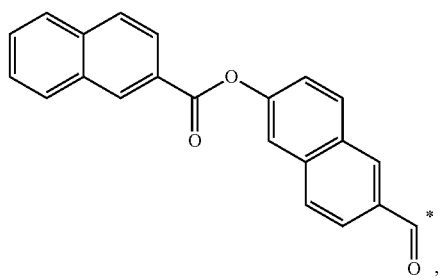

12
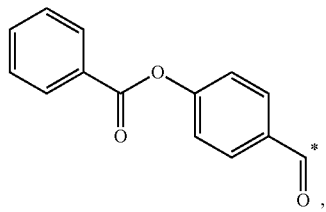

13
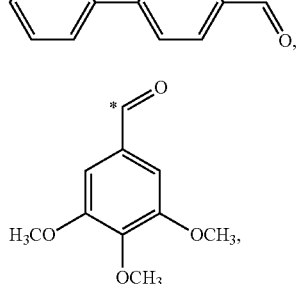

14
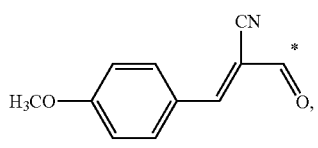

15
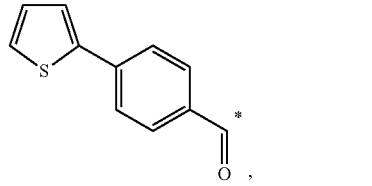

16
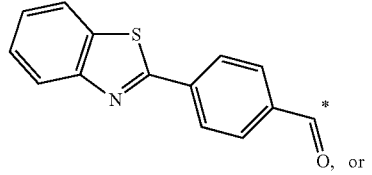

17
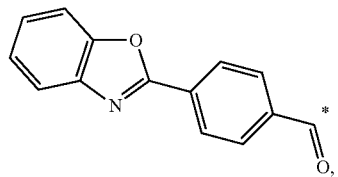

18 wherein * indicates the point of attachment of the chromophore-acyl substituent to an oxygen of the cellulose ester.

In one class of this embodiment, the regioselectively substituted cellulose ester further comprises a plurality of a $(C_{1-6})$alkyl-acyl substituent.

In one embodiment of this film, the chromophore-acyl is chosen from

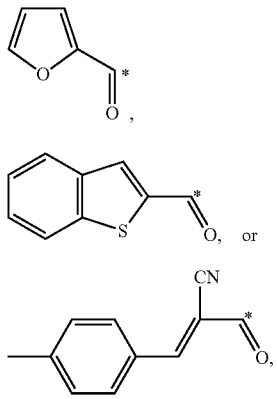

wherein * indicates the point of attachment of the chromophore-acyl substituent to an oxygen of the cellulose ester. In one class of this embodiment, the regioselectively substituted cellulose ester further comprises a plurality of a $(C_{1-6})$alkyl-acyl substituent.

In one embodiment, the chromophore-acyl has an absorption maximum ($\lambda_{max}$) in the range of from about 200 nm to about 350 nm. In one class of this embodiment, the regioselectively substituted cellulose ester further comprises a plurality of a $(C_{1-6})$alkyl-acyl substituent.

In one embodiment of this film, chromophore-acyl is a naphthoyl unsubstituted or substituted by 1-5 $R^1$, the $DS_{OH}$ is in the range of from about 0.2 to about 0.3, the $DS_{Pv}$ is in the range of from about 0.3 to about 0.5, the $DS_{Ch}$ is in the range of from about 1.1 to about 1.3. In one class of this embodiment, the film has a thickness in the range of from about 0.5 μm to about 5 μm. In one class of this embodiment, the film has a thickness in the range of from about 5 μm to about 20 μm.

In one embodiment of this film, the film is 45 degree, a uniaxial or a biaxial stretched optical film. In one class of this embodiment, the film is a 45 degree stretched optical film. In one class of this embodiment, the film is a uniaxial stretched optical film. In one class of this embodiment, the film is a biaxial stretched optical film.

In another embodiment of this film, the film is diagonally 45° stretched, which will increase the circular polarizer manufacture output through roll to roll lamination process for 3D display, OLED and other applications.

In one embodiment is a polarizer plate comprising the film. In one embodiment is a circular polarizer comprising the film.

In one embodiment is a multilayer film comprising the film. In one class of this embodiment, the multilayer film is an A plate film. In one class of this embodiment, the multilayer film has a thickness in the range of from about 20 μm to about 140 μm.

In one class of this embodiment, the multilayer film is 45 degree, uniaxially, or biaxially stretched. In one class of this embodiment, the multilayer film is 45 degree stretched. In one class of this embodiment, the multilayer film is uniaxially stretched. In one class of this embodiment, the multilayer film is biaxially stretched. In one class of this embodiment, the multilayer film comprises at least two films prepared by lamination, coating, or co-casting. In one subclass of this embodiment, the multilayer film is prepared by lamination, coating, or co-casting. In one sub-subclass of this subclass, the multilayer film is prepared by lamination. In one sub-subclass of this subclass, the multilayer film is prepared by coating. In one sub-subclass of this subclass, the multilayer film is prepared by co-casting.

In one embodiment of this film, the film has a transmission b* value that is less than 0.8. In one embodiment of this film the film has a transmission b* value that is less than 0.7. In one embodiment of this film, the film has a transmission b* value that is less than 0.6. In one embodiment of this film, the film has a b* of less than 0.5. In one embodiment of this film, the film has a transmission b* value that is less than 0.4. In one embodiment of this film, the film has a transmission b* value that is less than 0.3.

In one embodiment of this film, the film has a birefringence ("Δn") is in the range of from about 0.001 to about 0.020 as measured at a wavelength of 589 nm. In one class of this embodiment, the film has a thickness about 1 μm to about 20 μm. In one embodiment, the film has a birefringence ("Δn") is in the range of from about 0.006 to about 0.020 as measured at a wavelength of 589 nm. In one class of this embodiment, the film has a thickness about 1 μm to about 20 μm. In one embodiment of this film, the film has a Δn is in the range of from about 0.008 to about 0.020 as measured at a wavelength of 589 nm. In one class of this embodiment, the film has a thickness about 1 μm to about 20 μm. In one embodiment of this film, the film has a Δn is in the range of from about 0.009 to about 0.020 as measured at a wavelength of 589 nm. In one class of this embodiment, the film has a thickness 5 μm to about 20 μm. In one embodiment, the film has a Δn is in the range of from about 0.01 to about 0.020 as measured at a wavelength of 589 nm. In one class of this embodiment, the film has a thickness 1 μm to about 20 μm.

In one embodiment of this film, the film has a percent haze of less than about 4.0. In one class of this embodiment, the film has a thickness 1 μm to about 20 μm. In one embodiment of this film, the film has a percent haze of less than about 3.0. In one class of this embodiment, the film has a thickness 1 μm to about 20 μm. In one embodiment of this film, the film has a percent haze of less than about 2.0. In one class of this embodiment, the film has a thickness 1 μm to about 20 μm. In one embodiment, the film has a percent haze of less than about 1.0. In one class of this embodiment, the film has a thickness 1 μm to about 20 μm. In one embodiment, the film has a percent haze of less than about 0.9. In one class of this embodiment, the film has a thickness 1 μm to about 20 μm. In one embodiment, the film has a percent haze of less than about 0.8. In one class of this embodiment, the film has a thickness 1 μm to about 20 μm. In one embodiment, the film has a percent haze of less than about 0.7. In one class of this embodiment, the film has a thickness 1 μm to about 20 μm. In one embodiment, the film has a percent haze of less than about 0.6. In one class of this embodiment, the film has a thickness 1 μm to about 20 μm. In one embodiment, the film has a percent haze of less than about 0.5. In one class of this embodiment, the film has a thickness 1 μm to about 20 μm. In one embodiment, the film has a percent haze of less than about 0.4. In one class of this embodiment, the film has a thickness 1 μm to about 20 μm. In one embodiment, the film has a percent haze of less than about 0.3. In one class of this embodiment, the film has a thickness 1 μm to about 20 μm. In one embodiment, the film has a percent haze of less than about 0.2. In one class of this embodiment, the film has a thickness 1 μm to about 20 μm.

The film thickness may depend upon the film thickness before stretching and upon the stretching conditions. After stretching, the film thickness can be from about 1 μm to about 500 μm, from about 5 μm to about 200 μm, from about 10 μm to about 120 μm, from about 20 μm to about 100 μm, from about 30 μm to about 80 μm, from about 40 μm to about 80 μm, or about 20 μm to about 140 μm. In one embodiment of this film, the thickness of the film after stretching is in the range of from about 0.5 μm to about 20 μm.

Before stretching the film can have an average thickness ranging from about 1 μm to about 500 μm, from about 5 μm to about 200 μm, from about 10 μm to about 120 μm, from about 20 μm to about 100 μm, from about 30 μm to about 80 μm, or from about 40 μm to about 80 μm. In one embodiment of this film, the thickness of the film before stretching is in the range of from about 0.5 μm to about 20 μm.

In one embodiment of this film, the film is a +C film, −C film, or a +A film. In one class of this embodiment, the film has a thickness in the range of 0.5 μm to about 20 μm. In one class of this embodiment, the film has a thickness in the range of 20 μm to about 140 μm.

In one class of this embodiment, the film is a +C film. In one subclass of this class, the film has a thickness in the range of 0.5 μm to about 20 μm. In one subclass of this class, the film has a thickness in the range of 20 μm to about 140 μm. In one class of this embodiment, the film is a −C film. In one subclass of this class, the film has a thickness in the range of 0.5 μm to about 20 μm. In one subclass of this class, the film has a thickness in the range of 20 μm to about 140 μm. In one class of this embodiment, the film is a +A film. In one subclass of this class, the film has a thickness in the range of 0.5 μm to about 20 μm. In one subclass of this class, the film has a thickness in the range of 20 μm to about 140 μm. In one class of this embodiment, the film is a −A film. In one subclass of this class, the film has a thickness in the range of 0.5 μm to about 20 μm. In one subclass of this class, the film has a thickness in the range of 20 μm to about 140 μm.

In one embodiment of this film, the film has an out-of-plane retardation ("$R_{th}$") in the range of from about 44 nm to about 244 nm as measured at a wavelength of about 589 nm at a thickness in the range of from about 14 μm to about 19 μm. In one embodiment, the film has a $R_{th}$ in the range of from about 80 nm to about 120 nm as measured at a wavelength of about 589 nm at a thickness in the range of from about 8 μm to about 16 μm.

In one embodiment of this film, the film has an out-of-plane retardation ("$R_{th}$") in the range of from about −100 nm to about 100 nm, as measured at a wavelength of about 589 nm at a thickness in the range of from about 2 μm to about 15 μm. In one class of this embodiment, the film is unstretched. In one embodiment of this film, the film has an out-of-plane retardation ("$R_{th}$") is in the range of from about −50 nm to about 50 nm as measured at a wavelength of about 589 nm at a thickness in the range of from about 2 μm to about 17 μm. In one class of this embodiment, the film is unstretched.

In one embodiment of this film, the film has an in-plane retardation ("$R_e$") is in the range of from about −0.5 nm to about 5 nm as measured at a wavelength of about 589 nm at a thickness in the range of from about 2 μm to about 17 μm. In one class of this embodiment, the film is unstretched.

In one embodiment, the film has a positive in-plane retardation that satisfies the relations of $-0.5<R_e(450)/R_e(550)<5$ and $-1.6<R_e(650)/R_e(550)<1.5$, wherein $R_e(450)$, $R_e(550)$, and $R_e(650)$ are in-plane retardations at the light wavelengths of 450 nm, 550 nm, and 650 nm, respectively.

In one embodiment, the film has a positive out-of-plane retardation that satisfies the relations of $0.5<R_{th}(450)/R_{th}(550)<2.5$ and $0.4<R_{th}(650)/R_{th}(550)<1.3$, wherein $R_{th}(450)$, $R_{th}(550)$, and $R_{th}(650)$ are in-plane retardations at the light wavelengths of 450 nm, 550 nm, and 650 nm, respectively.

The films can comprise one or more of the above-described regioselectively substituted cellulose esters. In one embodiment, the film comprises a regioselectively substituted cellulose ester having a $DS_{Pv}$ in the range of from about 0.1 to about 1.2.

In one embodiment of this film, the chromophore-acyl is a benzoyl unsubstituted or substituted by 1-5 $R^1$; or a naphthoyl unsubstituted or substituted by 1-5 $R^1$, wherein the $DS_{OH}$ is in the range of from about 0.2 to about 0.3, wherein $DS_{Pv}$ is in the range of from about 0.3 to about 0.5, wherein the $DS_{Ar}$ is in the range of from about 1.0 to about 1.3.

In one embodiment, the $DS_{Pv}$ is in the range of from about 0.2 to about 0.8. In one embodiment, the $DS_{Pv}$ is in the range of from about 0.3 to about 0.5. In one embodiment, the $DS_{Pv}$ is in the range of from about 0.1 to about 0.6. In one embodiment, the $DS_{Pv}$ is in the range of from about 0.8 to about 1.2.

In one embodiment, the $DS_{Ch}$ is in the range of from about 0.5 to about 1.5. In one embodiment, the $DS_{Ch}$ is in the range of from about 0.4 to about 0.8. In one embodiment, the $DS_{Ch}$ is in the range of from about 0.8 to about 1.6. In one embodiment, the $DS_{Ch}$ is in the range of from about 0.7 to about 1.0.

In one embodiment, the $DS_{OH}$ is in the range of from about 0.1 to about 0.6. In one embodiment, the $DS_{OH}$ is in the range of from about 0.1 to about 0.4. In one embodiment, the $DS_{OH}$ is in the range of from about 0.4 to about 0.9.

In one embodiment, the $DS_{OH}$ is in the range of from about 0.1 to about 0.6, the $DS_{Pv}$ is in the range of from about 0.1 to about 0.6, and the $DS_{Ch}$ is in the range of from about 0.5 to about 1.5. In one embodiment, the $DS_{OH}$ is in the range of from about 0.1 to about 1.1, the $DS_{Pv}$ is in the range of from about 0.3 to about 0.4, and the $DS_{Ch}$ is in the range of from about 0.3 to about 1.1. In one embodiment, the $DS_{OH}$ is in the range of from about 0.1 to about 1.0, the $DS_{Pv}$ is in the range of from about 0.3 to about 0.5, and the $DS_{Ch}$ is in the range of from about 0.8 to about 1.3.

In one embodiment, the regioselectivity is such that the sum of the chromophore-acyl degree of substitution at C2 and C3 ("C2DS$_{Ch}$" and "C3DS$_{Ch}$") minus the chromophore-acyl degree of substitution at C6 ("C6DS$_{Ch}$") is in the range of from about 0.5 to about 1.6. In one embodiment, the regioselectivity is such that the sum of the chromophore-acyl degree of substitution at C2 and C3 ("C2DS$_{Ch}$" and "C3DS$_{Ch}$") minus the chromophore-acyl degree of substitution at C6 ("C6DS$_{Ch}$") is in the range of from about 0.8 to about 1.6. In one embodiment, the regioselectivity is such that the sum of the chromophore-acyl degree of substitution at C2 and C3 ("C2DS$_{Ch}$" and "C3DS$_{Ch}$") minus the chromophore-acyl degree of substitution at C6 ("C6DS$_{Ch}$") is in the range of from about 0.9 to about 1.6.

The films can be formed into multilayer films. The multilayer films can be made by solvent co-casting, melt co-extrusion, lamination, or a coating process. These procedures are generally known in the art. Examples of solvent co-casting, melt co-extrusion, lamination, and coating methods to form multilayer structures are found in US 2009/0050842, US 2009/0054638, and US 2009/0096962.

Further examples of solvent co-casting, melt co-extrusion, lamination, and coating methods to form a multilayer structure are found in U.S. Pat. Nos. 4,592,885; 7,172,713; US 2005/0133953; and US 2010/0055356, the contents of which are hereby incorporated by reference in their entirety.

Figure 4A:
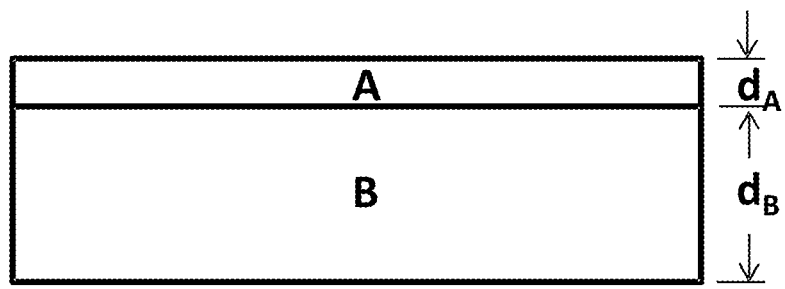
FIG. 4(a) shows a multilayer film according to the invention in an A-B configuration.
Figure 4B:
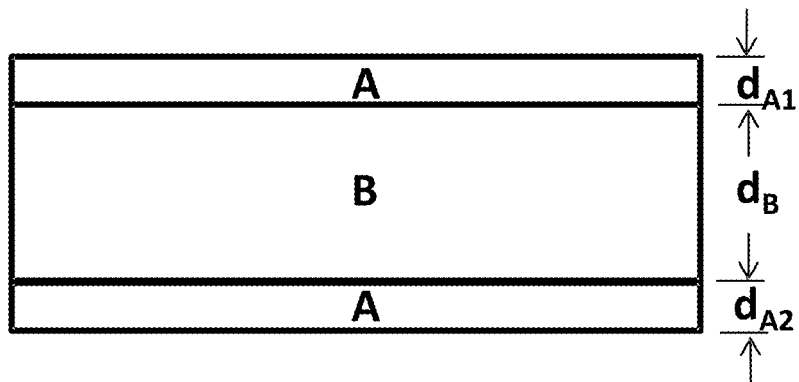
FIG. 4(b) shows a multilayer film according to the invention in an A-B-A configuration.

The multilayer film may be configured in an A-B structure or an A-B-A structure (FIGS. 4(a) and 4(b), respectively). In one embodiment, layer A can be made from the cellulose esters of disclosed herein, and layer B can be made from the cellulose esters disclosed herein, another cellulose ester, a polycarbonate, a polyester, a polyimide, a cycloolefin polymer, or a cycloolefin copolymer. Layer B can also be made from a combination of the aforementioned polymers. Examples of another cellulose ester include a cellulose acetate butyrate, a cellulose acetate, a cellulose acetate propionate, a cellulose propionate, and a cellulose butyrate. In the case of a bi-layer structure, the layers are made using different cellulose esters. For the tri-layer structure, the top and bottom layers are made using the same cellulose ester and the middle layer is made using a different cellulose ester. Other configurations are possible such as A-X-B where X is an adhesive or tie layer, and B-A-B. The thickness of each layer can be the same or different. By varying the thickness of each layer, the desired optical retardation and reversed optical dispersion can be obtained. The thickness of layer A before after stretching can range from about 1 µm to about 20 µm, and the thickness of layer B after stretching can range from about 19 µm to about 120 µm.

To obtain certain in-plane retardation ($R_e$) values, the multilayer film may be stretched. By adjusting the stretch conditions such as stretch temperature, stretch ratio, stretch type (e.g., 45 degree, uniaxial or biaxial), pre-heat time and temperature, and post-stretch annealing time and temperature; the desired $R_e$, $R_{th}$, and reverse optical dispersion can be achieved. The stretching temperature can range from 130° C. to 200° C. The stretch ratio can range from 1.0 to 1.4 in the machine direction (MD) and can range from 1.1 to 2.0 in the transverse direction (TD). The pre-heat time can range from 10 to 300 seconds, and the pre-heat temperature can be the same as the stretch temperature. The post-annealing time can range from 0 to 300 seconds, and the post-annealing temperature can range from 10° C. to 40° C. below the stretching temperature.

It is known in the art of optical compensation film that the phase retardation of light varies according to wavelength, causing color shift. This wavelength dependence (or dispersion) characteristic of the compensation film may be taken into account when designing an optical device so that color shift is minimized. Wavelength dispersion curves are defined as "normal", "flat" or "reversed" with respect to the compensation film having positive, none or negative retardance (or retardation). A compensation film with positive retardance (positive A-plate or C-plate) may have a normal dispersion curve in which the value of phase retardation is increasingly positive toward shorter wavelengths or a reversed dispersion curve in which the value of phase retardation is decreasingly positive toward shorter wavelengths. A compensation film with negative retardance (negative A-plate or C-plate) may have a normal dispersion curve in which the value of phase retardation is increasingly negative toward shorter wavelengths or a reversed dispersion curve in which the value of phase retardation is decreasingly negative toward shorter wavelengths. Exemplary shapes of these curves are depicted in FIG. 1.

Wave plates are customarily named as follows in accordance with their refractive index profiles:
positive A-plate: $n_x > n_y = n_z$; negative A-plate: $n_x < n_y = n_z$
positive C-plate: $n_x = n_y < n_z$; negative C-plate: $n_x = n_y > n_z$
wherein, $n_x$ and $n_y$ represent in-plane refractive indices, and $n_z$ the thickness refractive index.

The above wave plates are uniaxial birefringent plates. A wave plate can also be biaxial birefringent, where $n_x$, $n_y$, and $n_z$ are all not equal; it is customarily named as biaxial film.

An A-plate having in-plane retardation ($R_e$) equal to a quarter of the wavelength (λ/4) is named quarter wave plate (QWP). An ideal achromatic QWP has the in-plane retardation of λ/4 at every wavelength. In order to achieve this, the wavelength dispersion of the QWP has to be reversed and satisfies the following equations:

$$R_e(450)/R_e(550)=0.818 \text{ and } R_e(650)/R_e(550)=1.182,$$

wherein $R_e(450)$, $R_e(550)$, and $R_e(650)$ are in-plane retardations at the light wavelengths of 450 nm, 550 nm, and 650 nm respectively.

An achromatic (or broadband) wave plate is highly desirable since it can direct the light in the same manner at each wavelength to yield the optimal viewing quality. A common wave plate, however, exhibits a normal dispersion curve, which is not suitable for broadband wave plate application. Thus, there exists a need for a wave plate having reversed wavelength dispersion characteristics with respect to in-plane and out of plane retardations.

A-plates are commonly used in liquid crystal displays (LCDs) as compensation films to improve the viewing angles. They can also be used in an OLED (organic light emitting diode) display device. For example, a QWP is being used with a linear polarizer to provide a circular polarizer in an OLED device to reduce the ambient light reflected by OLED for improved viewing quality. These applications typically utilize the in-plane retardation provided by the A-plate for in-plane phase-shift compensation. For example, A-plate combining with C-plate is particularly useful in reducing light leakage of the crossed polarizers at oblique viewing angles.

In one embodiment is a multilayer film comprising the film, wherein the multilayer film is an A-plate film. In one class of this embodiment, the multilayer film has a thickness in the range of 20 µm to about 140 µm. In one subclass of this class, the film has a thickness in the range of from about 1 µm to about 20 µm. In one subclass of this class, the multilayer film is 45 degree, uniaxially, or biaxially stretched. In one subclass of this class, the multilayer film is 45 degree stretched. In one subclass of this embodiment, the multilayer film is uniaxially stretched.

In one class of this embodiment, the A-plate film is a negative A-plate film. In one subclass of this class, the multilayer film has a thickness in the range of 20 µm to about 140 µm. In one sub-subclass of this subclass, the multilayer film is 45 degree, uniaxially, or biaxially stretched. In one sub-sub-subclass of this sub-subclass, the film has a thickness in the range of from about 1 µm to about 20 µm. In one sub-subclass of this subclass, the multilayer film is 45 degree stretched. In one sub-subclass of this subclass, the multilayer film is uniaxially stretched.

In one class of this embodiment, the A-plate film is a positive A-plate film. In one subclass of this class, the multilayer film has a thickness in the range of 20 µm to about 140 µm. In one sub-subclass of this subclass, the multilayer film is 45 degree, uniaxially, or biaxially stretched. In one sub-sub-subclass of this sub-subclass, the film has a thickness in the range of from about 1 µm to about 20 µm. In one sub-subclass of this subclass, the multilayer film is 45 degree stretched. In one sub-subclass of this subclass, the multilayer film is uniaxially stretched.

In one embodiment, the multilayer film further comprises another film comprising another cellulose ester, a polycarbonate, a polyester, a polyimide, a cycloolefin polymer, a cycloolefin copolymer, or combinations thereof. In one class of this embodiment, the cellulose ester is a cellulose acetate butyrate, a cellulose acetate, a cellulose acetate propionate, a cellulose propionate, a cellulose butyrate, or combinations thereof. In one class of this embodiment, the cellulose ester is a cellulose acetate butyrate. In one class of this embodiment, the cellulose ester is a cellulose acetate. In one class of this embodiment, the cellulose ester is a cellulose acetate propionate. In one class of this embodiment, the cellulose ester is, a cellulose propionate. In one class of this embodiment, the cellulose ester is a cellulose butyrate.

In one class of this embodiment, the another film comprises a polycarbonate. In one class of this embodiment, the another film comprises a polyester. In one class of this embodiment, the another film comprises a polyimide. In one class of this embodiment, the another film comprises a cycloolefin polymer. In one class of this embodiment, the another film comprises a cycloolefin copolymer.

In one embodiment is a multilayer film comprising the film, wherein the multilayer film has an out-of-plane retardation ("$R_{th}$") is in the range of from about −300 nm to about 0 nm, as measured at 589 nm at a thickness in the range of from about 20 μm to about 140 μm, wherein the multilayer film stretched. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has an out-of-plane retardation ("$R_{th}$") measured at 589 nm is in the range of from about −200 nm to about −50 nm, as measured at 589 nm at a thickness in the range of from about 20 μm to about 140 μm, wherein the multilayer film is a stretched. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has in-plane retardation ($R_e$) in the range of about 40 to about 160 nm, in the range of about 50 to 150 nm, in the range of about 100 to 150 nm or in the range of about 110 to 150 nm and out-of-plane retardation ($R_{th}$) of about 0 to about −200 nm, in the range of about 0 to −150 nm or in the range of about −30 to −100 nm at the wavelength (λ) 550 nm. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has a positive in-plane retardation that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations at the light wavelengths of 450 nm, 550 nm, and 650 nm, respectively. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has an in-plane retardation ($R_e$) of about 50 to about 160 nm at the light wavelength of 550 nm. In one embodiment of this film, the film has an out-of-plane retardation ($R_{th}$) of about −200 nm to about 0 nm at the light wavelength of 550 nm. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has an in-plane retardation ($R_e$) of about 50 to about 160 nm and out-of-plane retardation ($R_{th}$) of about −200 to about 20 nm as measured at the wavelength of 550 nm. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has an in-plane retardation ($R_e$) of about 50 to about 160 nm and an out-of-plane retardation ($R_{th}$) of about −200 to about 20 nm at the wavelength (λ) 550 nm, and a positive in-plane retardation ($R_e$) that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations measured at the light wavelengths of 450 nm, 550 nm, and 650 nm respectively. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment is a multilayer film comprising the film, wherein the multilayer film has an in-plane retardation ($R_e$) of about 50 to about 160 nm and an out-of-plane retardation ($R_{th}$) of about −20 to about −200 nm at the wavelength (λ) 550 nm, and a positive in-plane retardation ($R_e$) that satisfies the relations of $0.75<R_e(450)/R_e(550)<0.9$ and $1.05<R_e(650)/R_e(550)<1.2$, wherein $R_e(450)$, $R_e(550)$, and $R_e(650)$ are in-plane retardations measured at the light wavelengths of 450 nm, 550 nm, and 650 nm respectively. In one class of this embodiment, the multilayer film is uniaxially, biaxially, or 45 degree stretched. In one class of this embodiment, the multilayer film has a thickness in the range of from about 20 µm to about 140 µm. In one subclass of this class, the multilayer film is uniaxially, biaxially, or 45 degree stretched.

In one embodiment is a multilayer film comprising the film, wherein the multilayer film is 45 degree, uniaxially, or biaxially stretched. In one class of this embodiment, the multilayer film has a thickness in the range of from about 20 µm to about 140 µm. In one subclass of this class, the multilayer film has a positive in-plane retardation that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations at the light wavelengths of 450 nm, 550 nm, and 650 nm, respectively. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an in-plane retardation ($R_e$) in the range of about 40 to about 160 nm, in the range of about 50 to 150 nm, in the range of about 100 to 150 nm or in the range of about 110 to 150 nm and out-of-plane retardation ($R_{th}$) of about 0 to about -200 nm, in the range of about 0 to -150 nm or in the range of about -30 to -100 nm at the wavelength ($\lambda$) 550 nm. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an in-plane retardation ($R_e$) of about 50 to about 160 nm at the light wavelength of 550 nm. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an out-of-plane retardation ($R_{th}$) of about -200 nm to about 0 nm at the light wavelength of 550 nm. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an in-plane retardation ($R_e$) of about 50 to about 160 nm and out-of-plane retardation ($R_{th}$) of about -200 to about 20 nm as measured at the wavelength of 550 nm. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an in-plane retardation ($R_e$) of about 50 to about 160 nm and an out-of-plane retardation ($R_{th}$) of about -200 to about 20 nm at the wavelength ($\lambda$) 550 nm, and a positive in-plane retardation ($R_e$) that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations measured at the light wavelengths of 450 nm, 550 nm, and 650 nm respectively. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In one subclass of this class, the multilayer film has an in-plane retardation ($R_e$) of about 50 to about 160 nm and an out-of-plane retardation ($R_{th}$) of about -20 to about -200 nm at the wavelength ($\lambda$) 550 nm, and a positive in-plane retardation ($R_e$) that satisfies the relations of $0.75<R_e(450)/R_e(550)<0.9$ and $1.05<R_e(650)/R_e(550)<1.2$, wherein $R_e(450)$, $R_e(550)$, and $R_e(650)$ are in-plane retardations measured at the light wavelengths of 450 nm, 550 nm, and 650 nm respectively. In one sub-subclass of this subclass, the film has a thickness in the range of from about 1 µm to about 20 µm. In one sub-subclass of this subclass, the multilayer film is uniaxially stretched. In one sub-subclass of this subclass, the multilayer film is biaxially stretched. In one sub-subclass of this subclass, the multilayer film is 45 degree stretched.

In various embodiments, additives such as plasticizers, stabilizers, UV absorbers, antiblocks, slip agents, lubricants, dyes, pigments, retardation modifiers, etc. may be mixed with the regioselectively substituted cellulose esters used in preparing the above-described optical films. Examples of these additives can be found, for example, in U.S. Patent Application Publication Nos. US 2009/0050842, US 2009/0054638, and US 2009/0096962, the contents of which are incorporated herein by reference.

Any of the above-described films can be made by solvent casting, melt extrusion, lamination, or a coating process. These procedures are generally known in the art. Examples of solvent casting, melt extrusion, lamination, and coating methods can be found, for example, in U.S. Patent Application Publication Nos. US 2009/0050842, US 2009/0054638, and US 2009/0096962, the contents of which are incorporated herein by reference. Further examples of solvent casting, melt extrusion, lamination, and coating methods to form films can be found, for example, in U.S. Pat. Nos. 4,592,885 and 7,172,713, and U.S. Patent Application Publication Nos. US 2005/0133953 and US 2010/0055356, the contents of which are incorporated herein by reference.

In order to assist in obtaining the desired $R_e$ and $R_{th}$ values using the regioselectively substituted cellulose esters described herein, the films (single layer or multilayer) can be stretched. By adjusting the stretch conditions, such as stretch temperature, stretch type (45 degree, uniaxial or biaxial), stretch ratio, pre-heat time and temperature, and post-stretch annealing time and temperature, the desired $R_e$, and $R_{th}$, can be achieved. The precise stretching conditions may depend upon the specific composition of the regioselectively substituted cellulose ester, the amount and type of plasticizer, and the glass transition temperature of that specific composition. Hence, the specific stretching conditions can vary widely. In various embodiments, the stretching temperature can be in the range of from about 160 to about 200° C. Additionally, the stretch ratio based on 1.0 in the machine direction ("MD") can range from about 1.3 to about 2.0 in the transverse direction ("TD"). The pre-heat time can be in the range of from about 10 to about 300 seconds, and the pre-heat temperature can be the same as the stretch temperature. The post-annealing time can range from about 0 to about 300 seconds, and the post-annealing temperature can range from about 10 to about 40° C. below the stretching temperature. Film thickness may depend upon the film thickness before stretching and upon the stretching conditions. After stretching, the film thickness can be from about 1 µm to about 500 µm, from about 5 µm to about 200 µm, or from about 10 µm to about 120 µm, from about 20 µm to about 100 µm, from about 30 µm to about 80 µm, or from about 40 µm to about 60 µm.

In addition to the optical properties, the films prepared from the regioselectively substituted cellulose esters described herein have other valuable features. Many conventional cellulose esters used in LCD displays have relatively high moisture uptake which affects dimensional stability and results in changing optical values of the film. Films prepared from the regioselectively substituted cellulose esters described herein have low moisture uptake, and the optical values of the film change very little at high humidity and temperature. Thus, in various embodiments, the regioselectively substituted cellulose esters can contain less than 2 weight percent moisture, less than 1 weight percent moisture, or less than 0.5 weight percent moisture. In other various embodiments, the change in $R_e$ for the cellulose ester film can be less than 4 percent, less than 1 percent, or less than 0.5 percent when stored at 60° C., 100 percent relative humidity for 240 hours.

The regioselectively substituted cellulose esters described herein are surprisingly thermally stable which makes them very useful in melt extrusion of film. Thus, one aspect of the present invention relates to regioselectively substituted cellulose esters that have less than 10 percent weight loss by thermogravimetric analysis at 330° C., 340° C., or 350° C.

The films of the current invention can be used as optical compensation films. The optical compensation films described herein can be employed in LCDs. Particularly, the above-described optical films can be employed as part or all of a compensation film in the polarizer stack of an LCD. As described above, polarizer stacks generally include two crossed polarizers disposed on either side of a liquid crystal layer. Compensation films can be disposed between the liquid crystal layer and one of the polarizers. In one or more embodiments, the above-described single layer optical film can be employed by itself as a compensation film (i.e., a waveplate) in an LCD. In such an embodiment, the single layer optical film can be disposed between the liquid crystal layer and one of the polarizing filters of the LCD. In other embodiments, the above-described positive A-plate can be employed in a compensation film (i.e., a waveplate) in an LCD. In such embodiments, the A-plate can be disposed adjacent to at least one additional optical film, where such additional optical film can be a positive C-plate. In any of the foregoing embodiments, LCDs prepared comprising the optical films described herein can operate in in-plane-switching ("IPS") mode.

The optical compensation film described herein can also be employed in OLED. For example, a QWP combined with a linear polarizer to form a circular polarizer. When the circular polarizer is put in front of an OLED device, it can reduce the ambient light reflected from OLED metal electrodes to improved viewing quality, such as high contrast ratio and less color shift, especially when the QWP has a reverse dispersion close to ideal.

The optical compensation films described herein can also be employed in circular polarizers. Particularly, a single quarter waveplate can be prepared comprising one or more of the above-described polymer films of the present invention, which can be used to convert linear polarized light to circular polarized light. This aspect may be particularly valuable for use in circular-polarized 3-dimensional ("3-D") glasses and/or 3-D media displays, such as televisions ("3-D TV"). Accordingly, in one or more embodiments, a single quarter waveplate can be prepared comprising the above-described single layer optical film. In other various embodiments, a single quarter waveplate can be prepared comprising the above-described positive A-plate. Such quarter waveplates can be applied to the glass of a 3-D TV, such as above the polarizing stack. Additionally, such quarter waveplates can be applied to the glass of 3-D glasses. In the case of 3-D glasses, the optical film can be applied so that the optical axis in one lens is perpendicular or substantially perpendicular to the optical axis of the other lens. The result in 3-D glasses is that certain observed polarization is blocked in one lens but will pass through the other lens leading to the observed 3-D optical effect. In various embodiments, a quarter waveplate comprising one or more of the above-described optical films can be employed in conjunction with at least one additional polarizer, which can be a linear polarizer.

The optical compensation film in accordance with the present invention has a positive in-plane retardation ($R_e$) and a reversed in-plane wavelength dispersion characteristic, in which the value of phase retardation is decreasingly positive toward shorter wavelengths. For bilayer and multilayer films, this dispersion characteristic is expressed by the ratios of the retardations as measured at the wavelengths of 450 nm, 550 nm, and 650 nm, which satisfy the relations of $R_e(450)/R_e(550)<1$ and $R_e(650)/R_e(550)>1$. The ratio of $R_e(450)/R_e(550)$ can be 0.71 to 0.99, 0.72 to 0.98, 0.74 to 0.97, 0.76 to 0.96, 0.78 to 0.95, 0.8 to 0.9, or 0.81 to 0.85. The ratio of $R_e(650)/R_e(550)$ can be 1.01 to 1.24, 1.02 to 1.23, 1.03 to 1.22, 1.04 to 1.21, 1.05 to 1.2, or 1.1 to 1.19.

In one embodiment, the optical compensation film of the invention has an in-plane retardation ($R_e$) of about 50 to about 160 nm at the wavelength (λ) 550 nm. In another embodiment, the polymer film has an out-of-plane retardation ($R_{th}$) of about 0 to about −200 nm at the wavelength (λ) 550 nm. In yet another embodiment, the polymer film has a positive in-plane retardation that satisfies the relations of $0.7<R_e(450)/R_e(550)<1$ and $1<R_e(650)/R_e(550)<1.25$, wherein $R_{450}$, $R_{550}$, and $R_{650}$ are in-plane retardations at the light wavelengths of 450 nm, 550 nm, and 650 nm respectively. In an embodiment, the polymer film has a positive in-plane retardation that satisfies the relations of $0.75<R_e(450)/R_e(550)<0.9$ and $1.05<R_e(650)/R_e(550)<1.2$. In any one of the embodiments specified above, the polymer film can be a positive A-plate having a refractive index profile of $n_x>n_y=n_z$ and a reversed wavelength dispersion.

In one aspect, the first polymer film and the second polymer film in the above-described optical compensation films are attached by lamination. In another aspect, the second polymer is coated on the first polymer film by solution cast.

In other embodiments, the retardation or the dispersion characteristics of the optical compensation film can be further enhanced by introducing an additive, such as a small molecule or a polymer, to the multilayer film of the invention before stretching. Desirably, the additive has a rigid rod-like moiety that is capable of being aligned in the plane of the film upon stretching. The chemical structure of the rigid rod-like moiety is not particularly limited.

The film of the present invention may be formed into a multilayer film by lamination or co-extrusion of the film of the present invention one or more of another film. The multilayer film can be obtained by solution casting whereby one film is first solution cast and another film is solution casted onto the first film formed by solution casting. In one embodiment, the first or the second solution cast film is a film of the present invention.

The present application also discloses a multilayer film comprising:

(1) a layer (A) comprising a regioselectively substituted cellulose ester comprising: (a) a plurality of chromophore-acyl substituents; and (b) a plurality of pivaloyl substituents, wherein the cellulose ester has a hydroxyl degree of substitution ("$DS_{OH}$") in the range of from about 0 to about 0.9, wherein the cellulose ester has a pivaloyl degree of substitution ("$DS_{Pv}$") in the range of from about 0.1 to about 1.2, wherein the cellulose ester has a chromophore-acyl degree of substitution ("$DS_{Ch}$") in the range of from about 0.4 to about 1.6, and wherein the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is between about 0.1 and about 1.6, wherein the chromophore-acyl is chosen from an $(C_{6-20})$aryl-acyl, wherein the aryl is unsubstituted or substituted by 1-5 $R^1$; a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

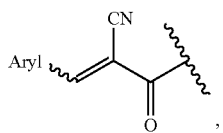

wherein the aryl is a $C_{1-6}$ aryl, and wherein the aryl is unsubstituted or substituted by 1-5 $R^1$; or

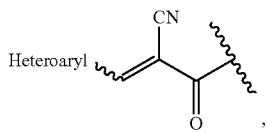

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

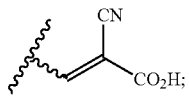

and (2) a layer (B) comprising a cellulose ester, a polycarbonate, a polyester, a polyimide, a cycloolefin polymer, a cycloolefin copolymer, or combinations thereof.

In one embodiment, the layer (B) comprises a cellulose ester comprising a plurality of $(C_{1-6})$alkyl-CO— substituents, wherein the cellulose ester has a hydroxyl degree of substitution ("$DS_{OH2}$") in the range of from about 0.25 to about 1.30, wherein the cellulose ester has an $(C_{1-6})$alkyl-CO-degree of substitution ("$DS_{Acyl}$") in the range of from about 1.70 to about 2.75. In one class of this embodiment, the cellulose ester is a cellulose acetate butyrate, a cellulose acetate, a cellulose acetate propionate, a cellulose propionate, a cellulose butyrate, or combinations thereof. In one class of this embodiment, the cellulose ester is a cellulose acetate butyrate. In one class of this embodiment, the cellulose ester is a cellulose acetate. In one class of this embodiment, the cellulose ester is a cellulose acetate propionate. In one class of this embodiment, the cellulose ester is, a cellulose propionate. In one class of this embodiment, the cellulose ester is a cellulose butyrate.

In one embodiment, the layer (B) comprises a polycarbonate. In one embodiment, the layer (B) comprises a polyester. In one embodiment, the layer (B) comprises a polyimide. In one embodiment, the layer (B) comprises a cycloolefin polymer. In one embodiment, the layer (B) comprises a cycloolefin copolymer.

In one embodiment, the multilayer film is made by a solvent co-casting, a melt co-extrusion, a lamination or a coating process. In one class of this embodiment, the multilayer film is made by a solvent co-casting process. In one class of this embodiment, the multilayer film is made by a melt co-extrusion process. In one class of this embodiment, the multilayer film is made by a lamination process. In one class of this embodiment, the multilayer film is made by a coating process.

In one embodiment, the multilayer film comprises one layer (A) and one layer (B) in an A-B configuration. In one embodiment, the multilayer film comprising two layers (A) and one layer (B) in an A-B-A configuration.

In one embodiment, the multilayer film has been stretched in at least one direction. In one embodiment, the multilayer film has been 45 degree, uniaxially, or biaxially stretched. In one class of this embodiment, the multilayer film has been 45 degree stretched. In one class of this embodiment, the multilayer film has been uniaxially stretched. In one class of this embodiment, the multilayer film has been biaxially stretched.

In one embodiment, the multilayer film has an out-of-plane retardation ("$R_{th}$") is in the range of from about −300 nm to about 0 nm, as measured at 589 nm at a thickness in the range of from about 20 μm to about 140 μm, wherein the multilayer film stretched. In one class of this embodiment, the multilayer film is uniaxially, biaxially, or 45 degree stretched. In one class of this embodiment, the multilayer film has a thickness in the range of from about 20 μm to about 140 μm. In one subclass of this class, the film has a thickness in the range of from about 1 μm to about 20 μm. In one subclass of this class, the multilayer film is uniaxially, biaxially, or 45 degree stretched.

In one embodiment, the multilayer film has an out-of-plane retardation ("$R_{th}$") measured at 589 nm is in the range of from about −200 nm to about −50 nm, as measured at 589 nm at a thickness in the range of from about 20 μm to about 140 μm, wherein the multilayer film is a stretched. In one class of this embodiment, the multilayer film is uniaxially, biaxially, or 45 degree stretched. In one class of this embodiment, the multilayer film has a thickness in the range of from about 20 μm to about 140 μm. In one subclass of this class, the layer (A) has a thickness in the range of from about 1 μm to about 20 μm. In one subclass of this class, the multilayer film is uniaxially, biaxially, or 45 degree stretched.

In one embodiment, the multilayer film has in-plane retardation ($R_e$) in the range of about 40 to about 160 nm, in the range of about 50 to 150 nm, in the range of about 100 to 150 nm or in the range of about 110 to 150 nm and out-of-plane retardation ($R_{th}$) of about 0 to about −200 nm, in the range of about 0 to −150 nm or in the range of about −30 to −100 nm at the wavelength (λ) 550 nm. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film has a positive in-plane retardation that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations at the light wavelengths of 450 nm, 550 nm, and 650 nm, respectively. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film has an in-plane retardation ($R_e$) of about 50 to about 160 nm at the light wavelength of 550 nm. In one embodiment of this film, the film has an out-of-plane retardation ($R_{th}$) of about −200 nm to about 0 nm at the light wavelength of 550 nm. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film has an in-plane retardation ($R_e$) of about 50 to about 160 nm and out-of-plane retardation ($R_{th}$) of about −200 to about 20 nm as measured at the wavelength of 550 nm. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film has an in-plane retardation ($R_e$) of about 50 to about 160 nm and an out-of-plane retardation ($R_{th}$) of about −200 to about 20 nm at the wavelength (λ) 550 nm, and a positive in-plane retardation ($R_e$) that satisfies the relations of $0.7<R_e(450)/R_e(550)<1$ and $1<R_e(650)/R_e(550)<1.25$, wherein $R_e(450)$, $R_e(550)$, and $R_e(650)$ are in-plane retardations measured at the light wavelengths of 450 nm, 550 nm and 650 nm respectively. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film has an in-plane retardation ($R_e$) of about 50 to about 160 nm and an out-of-plane retardation ($R_{th}$) of about −20 to about −200 nm at the wavelength (λ) 550 nm, and a positive in-plane retardation ($R_e$) that satisfies the relations of $0.75<R_e(450)/R_e(550)<0.9$ and $1.05<R_e(650)/R_e(550)<1.2$, wherein $R_e(450)$, $R_e(550)$, and $R_e(650)$ are in-plane retardations measured at the light wavelengths of 450 nm, 550 nm, and 650 nm respectively. In one class of this embodiment, the multilayer film is uniaxially, biaxially, or 45 degree stretched. In one class of this embodiment, the multilayer film has a thickness in the range of from about 20 µm to about 140 µm. In one subclass of this class, the layer (A) has a thickness in the range of from about 1 µm to about 20 µm. In one subclass of this class, the multilayer film is uniaxially, biaxially, or 45 degree stretched.

In one embodiment, the multilayer film is an A-plate film. In one class of this embodiment, the multilayer film is uniaxially, biaxially, or 45 degree stretched. In one class of this embodiment, the multilayer film is uniaxially stretched. In one class of this embodiment, the multilayer film is biaxially stretched. In one class of this embodiment, the multilayer film is 45 degree stretched.

In one class of this embodiment, the A-plate film is a negative A-plate film. In one subclass of this class, the multilayer film has a thickness in the range of 20 µm to about 140 µm. In one sub-subclass of this subclass, the multilayer film is 45 degree, uniaxially, or biaxially stretched.

In one class of this embodiment, the A-plate film is a positive A-plate film. In one subclass of this class, the multilayer film has a thickness in the range of 20 µm to about 140 µm. In one sub-subclass of this subclass, the multilayer film is 45 degree, uniaxially, or biaxially stretched.

Process

The present application also discloses a process for the preparation of a regioselectively substituted cellulose ester, the process comprising:

(1) contacting a nonregioselectively substituted cellulose ester ("NSCE") with a deacylating agent ("DA") under conditions sufficient to obtain a regioselectively deprotected cellulose ester ("RDCE"), wherein the DA is added at one time or in consecutive stages, wherein the DA is an amine compound, wherein the C2 degree of substitution of the hydroxyl substituents ("C2DS$_{OH}$") of the RDCE or the C3 degree of substitution of the hydroxyl substituents ("C3DS$_{OH}$") of the RDCE is greater than the C6 degree of substitution of the hydroxyl substituents ("C6DS$_{OH}$") of the RDCE.

In one embodiment of this process, the C2DS$_{OH}$ is greater than the C3S$_{OH}$.

The conditions for the preparation of the RDCE are known to one of ordinary skill in the art. The conditions include adjusting the temperature, time, solvents, sequence of additions, adding additives, and the like. The reaction temperature can be adjusted (e.g. in the range of from about 20° C. and about 80° C.). The time can be adjusted (e.g. in the range of from about 5 h to about 48 h). The solvent system can be adjusted (e.g., with or without a solvent and with solvent mixtures). The additive can for example be an ($C_{2-8}$)alkanoic acid).

The RDCE can further be treated with acylating agents known to one of ordinary skill in the art to synthesize regioselectively substituted cellulose esters.

In one embodiment of this process, the conditions includes adding an ($C_{2-8}$)alkanoic acid. In one class of this embodiment, the ($C_{2-8}$)alkanoic acid is chosen from acetic acid, propionic acid, butyric acid, isobutyric acid, valeric acid, caprylic acid, pivalic acid, 1- or 2-naphthoic acid, or benzoic acid. In one subclass of this class, the conditions also include a reaction temperature in the range of from about 25° C. to about 50° C. and a reaction time in the range of from about 15 h to about 24 h. In one sub-subclass of this subclass, the $(C_{2\text{-}8})$alkanoic acid is acetic acid. In one sub-subclass of this subclass, the $(C_{2\text{-}8})$alkanoic acid is propionic acid. In one sub-subclass of this subclass, the $(C_{2\text{-}8})$alkanoic acid is butyric acid. In one sub-subclass of this subclass, the $(C_{2\text{-}8})$alkanoic acid is isobutyric acid. In one sub-subclass of this subclass, the (C2-6)alkanoic acid is valeric acid. In one sub-subclass of this subclass, the $(C_{2\text{-}8})$alkanoic acid is caprylic acid. In one sub-subclass of this subclass, the $(C_{2\text{-}8})$alkanoic acid is pivalic acid. In one sub-subclass of this subclass, the $(C_{2\text{-}8})$alkanoic acid is 1-naphthoic acid. In one sub-subclass of this subclass, the $(C_{2\text{-}8})$alkanoic acid is 2-naphthoic acid. In one sub-subclass of this subclass, the $(C_{2\text{-}8})$alkanoic acid is benzoic acid.

In one embodiment of this process, the amine compound is chosen from methylamine, ethylamine, hydroxylamine, hydrazine, and/or solvates, hydrates or salts thereof. In one class of this embodiment, the amine compound is methylamine. In one class of this embodiment, the amine compound is ethylamine. In one class of this embodiment, the amine compound is hydroxylamine. In one class of this embodiment, the amine compound is hydrazine.

In one class of this embodiment, the conditions also include a reaction temperature in the range of from about 25° C. to about 50° C.; a reaction time in the range of from about 15 h to about 24 h; and adding an $(C_{2\text{-}8})$alkanoic acid.

In one subclass of this class, the amine compound is methylamine In one subclass of this class, the amine compound is ethylamine. In one subclass of this class, the amine compound is hydroxylamine. In one subclass of this class, the amine compound is hydrazine.

In one embodiment of this process, the conditions include running the reaction without a solvent. In one class of this embodiment, the conditions also include a reaction temperature in the range of from about 25° C. to about 50° C.; a reaction time in the range of from about 15 h to about 24 h; and adding an $(C_{2\text{-}8})$alkanoic acid.

In one embodiment of this process, the conditions includes adding one or more solvents chosen from an $(C_{1\text{-}8})$alkanol, or pyridine. In one class of this embodiment, the conditions also include a reaction temperature in the range of from about 25° C. to about 50° C.; a reaction time in the range of from about 15 h to about 24 h; and adding an $(C_{2\text{-}8})$alkanoic acid.

In one class of this embodiment, the conditions also include a reaction temperature in the range of from about 25° C. to about 50° C.; a reaction time in the range of from about 15 h to about 24 h; and adding an $(C_{2\text{-}8})$alkanoic acid.

In one class of this embodiment, the solvent is an $(C_{1\text{-}8})$ alkanol. In one subclass of this class, the conditions also include a reaction temperature in the range of from about 25° C. to about 50° C.; a reaction time in the range of from about 15 h to about 24 h; and adding an $(C_{2\text{-}8})$alkanoic acid.

In one subclass of this class, the $(C_{1\text{-}8})$alkanol is chosen from methanol, ethanol, propanol, isopropanol, butanol, or isobutanol. In one sub-subclass of this subclass, the conditions also include a reaction temperature in the range of from about 25° C. to about 50° C.; a reaction time in the range of from about 15 h to about 24 h; and adding an $(C_{2\text{-}8})$alkanoic acid.

In one class of this embodiment, the solvent is a mixture of dimethylsulfoxide and $(C_{1\text{-}8})$alkanol. In one subclass of this class, the conditions also include a reaction temperature in the range of from about 25° C. to about 50° C.; a reaction time in the range of from about 15 h to about 24 h; and adding an $(C_{2\text{-}8})$alkanoic acid.

In one embodiment of this process, the conditions include a reaction temperature in the range of from about 20° C. to about 80° C. In one embodiment of this process, the conditions include a reaction temperature in the range of from about 25° C. to about 50° C. In one embodiment of this process, the conditions include a reaction temperature in the range of from about 40° C. to about 50° C.

In one embodiment of this process, the $DS_{OH}$ of the RDCE is in the range of from about 1.7 to about 1.9; and the $C2DS_{OH} > C3DS_{OH}$; and $C2DS_{OH}$ or $C3DS_{OH} > C6DS_{OH}$. In one subclass of this class, $C2DS_{OH} + C3DS_{OH} > C6DS_{OH}$.

In one embodiment of this process, the $DS_{OH}$ of the RDCE is in the range of from about 1.8 to about 1.9; and the $C2DS_{OH} > C3DS_{OH}$; and $C2DS_{OH}$ or $C3DS_{OH} > C6DS_{OH}$. In one subclass of this class, $C2DS_{OH} + C3DS_{OH} > C6DS_{OH}$.

The present application discloses a process for the preparation of a regioselectively substituted cellulose ester comprising:

(1) contacting a regioselectively deprotected cellulose ester ("RDCE") with a sterically hindered acylating agent ("SHAA") in a solvent under conditions sufficient to obtain a first regioselectively substituted cellulose ester ("FRSCE"), wherein the $C2DS_{OH}$ or $C3DS_{OH}$ of the RDCE is greater than the $C6DS_{OH}$ of the RDCE, wherein the SHAA is added at one time or in consecutive stages, and wherein the sterically hindered acyl group is selective or partially selective for the primary alcohol positions; and (2) contacting the FRSCE with a first acylating agent ("FAA") to regioselectively add a plurality of a first acyl group ("FAG") under conditions sufficient to obtain a second regioselectively substituted cellulose ester ("SRSCE"), wherein the FAG is selective for the C2 or C3 alcohol position, and wherein the FAA is added at one time or in consecutive stages.

In one embodiment of this process, when the regioselectively substituted cellulose ester prepared from the process is formed into a film, the film has a transmission b* value that is less than 0.8. In one embodiment of this process, when the regioselectively substituted cellulose ester prepared from the process is formed into a film, the film has a transmission b* value that is less than 0.7. In one embodiment of this process, when the regioselectively substituted cellulose ester prepared from the process is formed into a film, the film has a transmission b* value that is less than 0.6. In one embodiment of this process, when the regioselectively substituted cellulose ester prepared from the process is formed into a film, the film has a transmission b* value that is less than 0.5. In one embodiment of this process, when the regioselectively substituted cellulose ester prepared from the process is formed into a film, the film has a transmission b* value that is less than 0.4. In one embodiment of this process, when the regioselectively substituted cellulose ester prepared from the process is formed into a film, the film has a transmission b* value that is less than 0.3.

In one embodiment of this process, when the regioselectively substituted cellulose ester prepared from the process is formed into a film, the film has a percent haze of less than about 4.0. In one class of this embodiment, the film has a thickness 1 μm to about 20 μm. In one embodiment of this process, when the regioselectively substituted cellulose ester prepared from the process is formed into a film, the film has a percent haze of less than about 3.0. In one class of this embodiment, the film has a thickness 1 μm to about 20 μm. In one embodiment of this process, when the regioselectively substituted cellulose ester prepared from the process is formed into a film, the film has a percent haze of less than about 2.0. In one class of this embodiment, the film has a thickness 1 µm to about 20 µm. In one embodiment of this process, when the regioselectively substituted cellulose ester prepared from the process is formed into a film, the film has a percent haze of less than about 1.0. In one class of this embodiment, the film has a thickness 1 µm to about 20 µm. In one embodiment of this process, when the regioselectively substituted cellulose ester prepared from the process is formed into a film, the film has a percent haze of less than about 0.9. In one class of this embodiment, the film has a thickness 1 µm to about 20 µm. In one embodiment of this process, when the regioselectively substituted cellulose ester prepared from the process is formed into a film, the film has a percent haze of less than about 0.8. In one class of this embodiment, the film has a thickness 1 µm to about 20 µm. In one embodiment of this process, when the regioselectively substituted cellulose ester prepared from the process is formed into a film, the film has a percent haze of less than about 0.7. In one class of this embodiment, the film has a thickness 1 µm to about 20 µm. In one embodiment of this process, when the regioselectively substituted cellulose ester prepared from the process is formed into a film, the film has a percent haze of less than about 0.6. In one class of this embodiment, the film has a thickness 1 µm to about 20 µm. In one embodiment of this process, when the regioselectively substituted In one embodiment of this process, when the regioselectively substituted cellulose ester prepared from the process is formed into a film, the film has a percent haze of less than about 0.5. In one class of this embodiment, the film has a thickness 1 µm to about 20 µm. In one embodiment of this process, when the regioselectively substituted cellulose ester prepared from the process is formed into a film, the film has a percent haze of less than about 0.4. In one class of this embodiment, the film has a thickness 1 µm to about 20 µm. In one embodiment of this process, when the regioselectively substituted cellulose ester prepared from the process is formed into a film, the film has a percent haze of less than about 0.3. In one class of this embodiment, the film has a thickness 1 µm to about 20 µm. In one embodiment of this process, when the regioselectively substituted cellulose ester prepared from the process is formed into a film, the film has a percent haze of less than about 0.2. In one class of this embodiment, the film has a thickness 1 µm to about 20 µm.

In one embodiment of this process, the RDCE is prepared by the process comprising: contacting a nonregioselectively substituted cellulose ester with a deacylating agent ("DA") under conditions sufficient to obtain the RDCE, wherein the DA is added at one time or in consecutive stages, wherein the DA is chosen from a fluoride salt, a hydroxide salt, or an amine compound, and wherein the regioselectively deprotected cellulose ester has been selectively deprotected at the secondary alcohol positions.

In one class of this embodiment, the $DS_{OH}$ of the RDCE is in the range of from about 1.7 to about 1.9; and the $C2DS_{OH} > C3DS_{OH}$; and $C2DS_{OH}$ or $C3DS_{OH} > C6DS_{OH}$. In one subclass of this class, $C2DS_{OH} + C3DS_{OH} > C6DS_{OH}$.

In one class of this embodiment, the $DS_{OH}$ of the RDCE is in the range of from about 1.8 to about 1.9; and the $C2DS_{OH} > C3DS_{OH}$; and $C2DS_{OH}$ or $C3DS_{OH} > C6DS_{OH}$. In one subclass of this class, $C2DS_{OH} + C3DS_{OH} > C6DS_{OH}$.

In one embodiment of this process, the SHAA is chosen from pivaloyl anhydride or a pivaloyl halide. In one class of this embodiment, the SHAA is present in the range of from about 0.2 to about 0.5 eq. In one subclass of this class, the FAA is chosen from acetyl anhydride, an acetyl halide, propionyl anhydride, propionyl halide, butyryl anhydride, burtyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide, and the FAA is present in the range of from about 0.2 to about 2.0 eq. In one sub-subclass of this subclass, the FAA is 1-naphthoyl anhydride or 2-naphthoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is 1-naphthoyl halide or 2-naphthoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one subclass of this class, the FAA is chromophore-acyl-X, wherein: X is chloro, bromo, or iodo; and chromophore-acyl is chosen from (i) an $(C_{6-20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

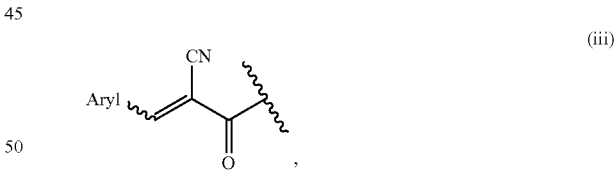

(iii)

wherein the aryl is a $C_{1-6}$ aryl, and wherein the aryl is unsubstituted or substituted by 1-5 $R^1$; or

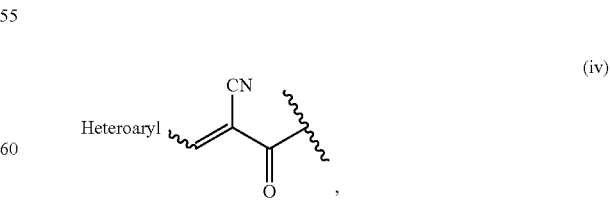

(iv)

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$ alkyl; halo($C_{1-6}$)alkyl; ($C_{6-20}$)aryl-$CO_2$—; ($C_{6-20}$)aryl; ($C_{1-6}$)alkoxy; halo($C_{1-6}$)alkoxy; halo; 5- to 10-membered heteroaryl having 1-4 heteroatoms chosen from N, O, or S; or

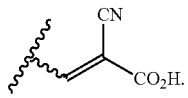

In one sub-subclass of this subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one sub-subclass of this subclass, the chromophore-acyl is an ($C_{6-20}$)aryl-acyl. In one sub-subclass of this subclass, the chromophore-acyl is a heteroaryl-acyl. In one sub-subclass of this subclass, the chromophore-acyl is

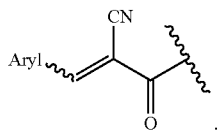

In one sub-subclass of this subclass, the chromophore-acyl is.

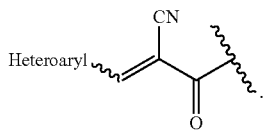

In one class of this embodiment, the SHAA is present in the range of from about 0.3 to about 0.5 eq. In one subclass of this class, the FAA is chosen from acetyl anhydride, an acetyl halide, propionyl anhydride, propionyl halide, butyryl anhydride, burtyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide, and the FAA is present in the range of from about 0.2 to about 2.0 eq. In one sub-subclass of this subclass, the FAA is 1-naphthoyl anhydride or 2-naphthoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is 1-naphthoyl halide or 2-naphthoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidi-none, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one subclass of this class, the FAA is chromophore-acyl-X, wherein: X is chloro, bromo, or iodo; and chromophore-acyl is chosen from (i) an ($C_{6-20}$)aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

(iii)

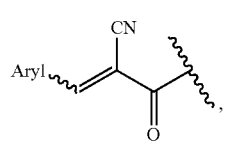

wherein the aryl is a $C_{1-6}$ aryl, and wherein the aryl is unsubstituted or substituted by 1-5 $R^1$; or (iv)

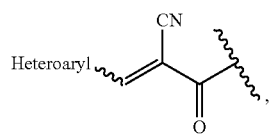

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, ($C_{1-6}$) alkyl; halo($C_{1-6}$)alkyl; ($C_{6-20}$)aryl-$CO_2$—; ($C_{6-20}$)aryl; ($C_{1-6}$)alkoxy; halo($C_{1-6}$)alkoxy; halo; 5- to 10-membered heteroaryl having 1-4 heteroatoms chosen from N, O, or S; or

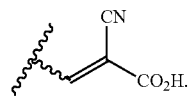

In one sub-subclass of this subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one sub-subclass of this subclass, the chromophore-acyl is an ($C_{6-20}$)aryl-acyl. In one sub-sub-subclass of this sub-subclass, the chromophore-acyl is a heteroaryl-acyl. In one sub-sub-subclass of this sub-subclass, the chromophore-acyl is

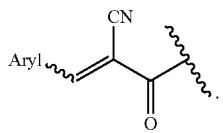

In one sub-sub-subclass of this sub-subclass, the chromophore-acyl is

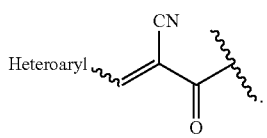

In one embodiment of this process, the SHAA is pivaloyl anhydride. In one class of this embodiment, the SHAA is present in the range of from about 0.2 to about 0.5 eq. In one subclass of this class, the FAA is chosen from acetyl anhydride, an acetyl halide, propionyl anhydride, propionyl halide, butyryl anhydride, burtyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide, and the FAA is present in the range of from about 0.2 to about 2.0 eq. In one sub-subclass of this subclass, the FAA is 1-naphthoyl anhydride or 2-naphthoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is 1-naphthoyl halide or 2-naphthoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one subclass of this class, the FAA is chromophore-acyl-X, wherein: X is chloro, bromo, or iodo; and chromophore-acyl is chosen from (i) an $(C_{6-20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

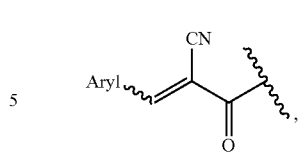

wherein the aryl is a $C_{1-6}$ aryl, and wherein the aryl is unsubstituted or substituted by 1-5 $R^1$; or

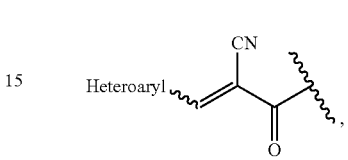

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

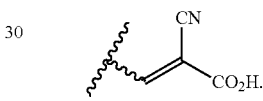

In one sub-subclass of this subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one sub-subclass of this subclass, the chromophore-acyl is an $(C_{6-20})$aryl-acyl. In one sub-sub-subclass of this sub-subclass, the chromophore-acyl is a heteroaryl-acyl. In one sub-sub-subclass of this sub-subclass, the chromophore-acyl is

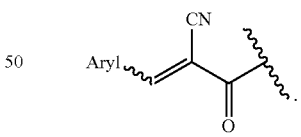

In one sub-sub-subclass of this sub-subclass, the chromophore-acyl is

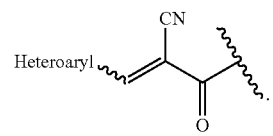

In one class of this embodiment, the SHAA is present in the range of from about 0.3 to about 0.5 eq. In one subclass of this class, the FAA is chosen from acetyl anhydride, an acetyl halide, propionyl anhydride, propionyl halide, butyryl anhydride, burtyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide, and the FAA is present in the range of from about 0.2 to about 2.0 eq. In one sub-subclass of this subclass, the FAA is 1-naphthoyl anhydride or 2-naphthoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is 1-naphthoyl halide or 2-naphthoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one subclass of this class, the FAA is chromophore-acyl-X, wherein: X is chloro, bromo, or iodo; and chromophore-acyl is chosen from (i) an $(C_{6\text{-}20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

(iii)

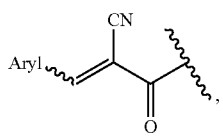

wherein the aryl is a $C_{1\text{-}6}$ aryl, and wherein the aryl is unsubstituted or substituted by 1-5 $R^1$; or (iv)

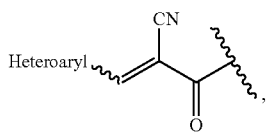

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1\text{-}6})$alkyl; halo$(C_{1\text{-}6})$alkyl; $(C_{6\text{-}20})$aryl-$CO_2$—; $(C_{6\text{-}20})$aryl; $(C_{1\text{-}6})$alkoxy; halo$(C_{1\text{-}6})$alkoxy; halo; 5- to 10-membered heteroaryl having 1-4 heteroatoms chosen from N, O, or S; or

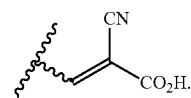

In one sub-subclass of this subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one sub-subclass of this subclass, the chromophore-acyl is an $(C_{6\text{-}20})$aryl-acyl. In one sub-sub-subclass of this sub-subclass, the chromophore-acyl is a heteroaryl-acyl. In one sub-sub-subclass of this sub-subclass, the chromophore-acyl is

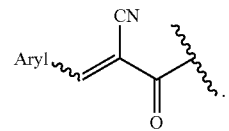

In one sub-sub-subclass of this sub-subclass, the chromophore-acyl is

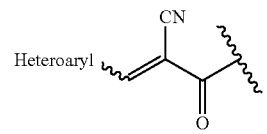

In one embodiment of this process, the SHAA is a pivaloyl halide. In one class of this embodiment, the SHAA is present in the range of from about 0.2 to about 0.5 eq. In one subclass of this class, the FAA is chosen from acetyl anhydride, an acetyl halide, propionyl anhydride, propionyl halide, butyryl anhydride, burtyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide, and the FAA is present in the range of from about 0.2 to about 2.0 eq. In one sub-subclass of this subclass, the FAA is 1-naphthoyl anhydride or 2-naphthoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is 1-naphthoyl halide or 2-naphthoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl anhydride. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one sub-subclass of this subclass, the FAA is benzoyl halide. In one sub-sub-subclass of this sub-subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one subclass of this class, the FAA is chromophore-acyl-X, wherein: X is chloro, bromo, or iodo; and chromophore-acyl is chosen from (i) an $(C_{6-20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

(iii)
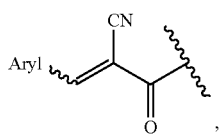

wherein the aryl is a $C_{1-6}$ aryl, and wherein the aryl is unsubstituted or substituted by 1-5 $R^1$; or (iv)
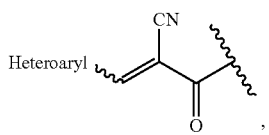

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

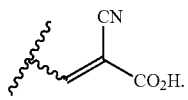

In one sub-subclass of this subclass, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane.

In one sub-subclass of this subclass, the chromophore-acyl is an $(C_{6-20})$aryl-acyl. In one sub-sub-subclass of this sub-subclass, the chromophore-acyl is a heteroaryl-acyl. In one sub-sub-subclass of this sub-subclass, the chromophore-acyl is

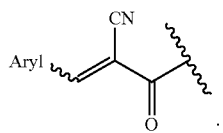

In one sub-sub-subclass of this sub-subclass, the chromophore-acyl is

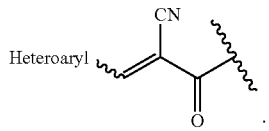

In one embodiment of this process, the solvent is chosen from methyl ethyl ketone, acetone, tetrahydrofuran, pyridine, substituted pyridine, 1,3-dimethyl-2-imidazolidinone, dimethylacetamide, dioxane, dimethylformamide, ethyl acetate, butyl acetate, methylisobutyl ketone, N-methylimidazole, N-methylpyrrolidone, trichloromethane, or dichloromethane. In one class of this embodiment, the solvent is chosen from pyridine, dimethylacetamide, dimethylformamide or N-methylimidazole.

In one embodiment of this process, the FAA is chosen from acetyl anhydride, an acetyl halide, propionyl anhydride, propionyl halide, butyryl anhydride, butyryl halide, isobutyroyl anhydride, isobutyroyl halide, an unsubstituted or substituted benzoyl anhydride, an unsubstituted or substituted benzoyl halide, an unsubstituted or substituted naphthoyl anhydride, or an unsubstituted or substituted naphthoyl halide. In one class of this embodiment, the FAA is present in the range of from about 0.2 to about 2.0 eq.

In one embodiment of this process, the FAA is an unsubstituted or substituted benzoyl anhydride, an unsubstituted or substituted benzoyl halide, an unsubstituted or substituted naphthoyl anhydride or an unsubstituted or substituted naphthoyl halide.

In one embodiment of this process, the FAA is an unsubstituted or substituted benzoyl anhydride. In one class of this embodiment, the FAA is present in the range of from about 0.2 to about 2.0 eq. In one class of this embodiment, the unsubstituted or substituted benzoyl anhydride is chosen from benzoyl anhydride or 2-(benzothiazol-2-yl)benzoyl anhydride. In one subclass of this class, the FAA is present in the range of from about 0.2 to about 2.0 eq.

In one embodiment of this process, the FAA is an unsubstituted or substituted benzoyl halide. In one class of this embodiment, the FAA is present in the range of from about 0.2 to about 2.0 eq. In one class embodiment of this process, the unsubstituted or substituted benzoyl halide is chosen from benzoyl halide or 2-(benzothiazol-2-yl)benzoyl halide. In one subclass of this class, the FAA is present in the range of from about 0.2 to about 2.0 eq.

In one embodiment of this process, the FAA is an unsubstituted or substituted naphthoyl anhydride. In one class of this embodiment, the FAA is present in the range of from about 0.2 to about 2.0 eq. In one class of this embodiment, the unsubstituted or substituted naphthoyl anhydride is chosen from 1-naphthoyl anhydride or 2-naphthoyl anhydride. In one subclass of this class, the FAA is present in the range of from about 0.2 to about 2.0 eq.

In one embodiment of this process, the FAA is an unsubstituted or substituted naphthoyl halide. In one class of this embodiment, the FAA is present in the range of from about 0.2 to about 2.0 eq. In one class of this embodiment, the unsubstituted or substituted naphthoyl chloride is chosen from 1-naphthoyl halide or 2-naphthoyl halide. In one subclass of this class, the FAA is present in the range of from about 0.2 to about 2.0 eq.

In one embodiment of this process, the FAA is a chromophore-acyl-X, wherein:

X is chloro, bromo, or iodo; and chromophore-acyl is chosen from (i) an $(C_{6-20})$aryl-acyl, wherein the aryl is unsubstituted or substituted by 1-5 $R^1$; (ii) a heteroaryl-acyl, wherein the heteroaryl is a 5- to 10-membered ring having 1- to 4-heteroatoms chosen from N, O, or S, and wherein the heteroaryl is unsubstituted or substituted by 1-5 $R^1$;

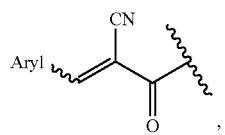

(iii)

wherein the aryl is a $C_{1-6}$ aryl, and wherein the aryl is unsubstituted or substituted by 1-5 $R^1$; or

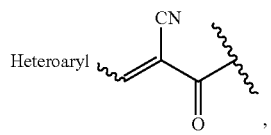

(iv)

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

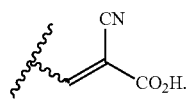

In one class of this embodiment, the FAA is present in the range of from about 0.2 to about 2.0 eq.

In one class of this embodiment, the chromophore-acyl is a heteroaryl-acyl. In one subclass of this class, the FAA is present in the range of from about 0.2 to about 2.0 eq.

In one class of this embodiment, the chromophore-acyl is

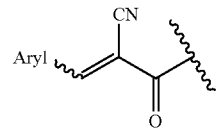

In one subclass of this class, the FAA is present in the range of from about 0.2 to about 2.0 eq.

In one class of this embodiment, the chromophore-acyl is

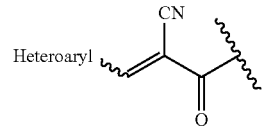

In one subclass of this class, the FAA is present in the range of from about 0.2 to about 2.0 eq.

In one embodiment of this process, the process further comprising (3) contacting the SRSCE with a second acylating agent ("SAA") under conditions sufficient to obtain a third regioselectively substituted cellulose ester ("TRSCE"), wherein the SAA is added at one time or in consecutive stages. In one class of this embodiment, the SAA is contacting the SRSCE after the FAA is at least substantially consumed. In one class of this embodiment, the SAA is contacting the SRSCE before the FAA is substantially consumed.

This invention can be further illustrated by the following examples of embodiments thereof, although it will be understood that these examples are included merely for the purposes of illustration and are not intended to limit the scope of the invention unless otherwise specifically indicated.

EXAMPLES

Materials and Methods

General Procedures:

NMR Characterization: Proton NMR data were obtained on a JEOL Model Eclipse-600 NMR spectrometer operating at 600 MHz. The sample tube size was 5 mm, and the sample concentrations were ca. 20 mg/mL DMSO-$d_6$. Each spectrum was recorded at 80° C. using 64 scans and a 15 second pulse delay. One to two drops of trifluoroacetic acid-d were added to each sample to shift residual water from the spectral region of interest. Chemical shifts are reported in parts per million ("ppm") from tetramethylsilane with the center peak of DMSO-$d_6$ as an internal reference (2.49 ppm).

Quantitative $^{13}C$ NMR data were obtained on a JEOL Model GX-400 NMR spectrometer operating at 100 MHz. The sample tube size was 10 mm, and the sample concentrations were ca. 100 mg/mL DMSO-$d_6$. Chromium(III) acetylacetonate was added to each sample at 5 mg/100 mg cellulose ester as a relaxation agent. Each spectrum was typically recorded at 80° C. using 10000 scans and a 1 second pulse delay. Chemical shifts are reported in ppm from tetramethylsilane with the center peak of DMSO-$d_6$ as an internal reference (39.5 ppm).

The proton and carbon NMR assignments, the degree of substitution and the relative degree of substitution ("RDS")

of the various acyl groups of the cellulose esters were determined by adapting the procedures disclosed in US 2012/0262650.

The solutions of the cellulose esters for preparation of the films and the film preparation were made by adapting the procedures disclosed in US 2012/0262650.

Abbreviations

AcOH is acetic acid; adj is adjusted; ArCl is aryl-acyl chloride; Bt is (2-benzothiazol-2-yl)benzoyl; BtCl is 2-(benzothiazol-2-yl)benzoyl chloride; Bz is benzoyl; BzCl is benzoyl chloride; ° C. is degree(s) Celsius; CPPvNp is a propionyl, pivolyl, and naphthoyl substituted cellulose ester; CP is a propionyl substituted cellulose ester; CPNp is a propionyl, naphthoyl substituted cellulose ester; CPBz means a propionyl, and benzoyl substitute cellulose ester; DCE is dichloroethane; DCM is dichloromethane; DEP is diethyl phthalate; DMAC is dimethylacetamide; DMSO is dimethyl sulfoxide; DMSO-$d_6$ means perdeuterated dimethyl sulfoxide; $DS_{Ar}$ is degree of substituted of aryl-acyl ($DS_{Ar}$ and $DS_{Ch}$ are used interchangeably); $DS_{Ch}$ is degree of substitution of the chromophore-acyl substituent; $DS_{OH}$ is degree of substitution of hydroxyl; $DS_{Np}$ is degree of substitution of naphthoyl; $DS_{Bz}$ is degree of substitution of benzoyl; eq is equivalent(s); EX or Ex is example(s); g means grams; h is hour; Int is intermediate; iPrOH is isopropanol; L is liter; MEK is methyl ethyl ketone; MeOH is methanol; mg means milligram; MIPK is methyl isopropyl ketone; min is minute(s); mL means milliliter; NMI is N-methylimidazole; NMR is nuclear magnetic resonance; NpCl is 2-naphthoyl chloride; P is propionyl; POH is propionic acid; Pv is pivaloyl; PvCl is pivaloyl chloride; Pyr is pyridine; rt is room temperature; TPP is triphenyl phosphate; wt % is weight percent; F is furan-2-carbonyl; T is thiophene-2-carbonyl; BFC is benzofuran-2-carbonyl BZT is benzo[b]thiophene-2-carbonyl; BZTA is benzo[d]thiazole-2-carbonyl BZOA is benzo[d]oxazole-2-carbonyl; NMP is 1-methyl-1H-pyrrole-2-carbonyl; MCA is (E)-methyl 3-(4-(chlorocarbonyl)phenyl)-2-cyanoacrylate; CThA is (E)-2-cyano-3-(thiophen-2-yl)acryloyl; TCA is (E)-2-cyano-3-(p-tolyl)acryloyl; NapNap is 6-(chlorocarbonyl)naphthalen-2-yl 2-naphthoate; Bpc is [1,1'-biphenyl]-4-carbonyl; BzBz is 4-(chlorocarbonyl)phenyl benzoate; TMB is 3,4,5-trimethoxybenzoylfuran-2-carbonyl; CMPA is (E)-2-cyano-3-(4-methoxyphenyl)acryloyl; TPB is 4-(thiophen-2-yl)benzoyl; BTB is 4-(benzo[d]thiazol-2-yl)benzoyl; BOB is 4-(benzo[d]oxazol-2-yl)benzoyl.

General Procedure for the Synthesis of the Regioselective Cellulose Esters Intermediates Preparation of Intermediate 1

To a 4-neck 2 L jacketed flask, under nitrogen with overhead stirring and a bottom valve, was added iPrOH (259 g). The jacket was set at 43° C. To the reactor was added Eastman™ CAP 482-20 (60 g) through a bent funnel directing the material into the vortex. The slurry was stirred for 10 min. To the slurry was added $N_2H_4H_2O$ (18.1 g, 1.90 eq) in AcOH (4.52 g, 0.40 eq) and DMSO (259 g). The reaction mixture was stirred for 24 h. The dope was precipitated by the addition of water to afford the product as a white solid. The solids were filtered on a frit and washed with copious amounts of water. The product was transferred to an aluminum pan and dried in vacuo at 55° C. for two days. The product was analyzed by $^1$H NMR, $^{13}$C NMR to determine that the $DS_{Pr}$=1.19 and $DS_{OH}$=1.81.

Preparation of Intermediate 2

In a variation of Intermediate 1, 1.70 eq of hydrazine monohydrate was used. Pyridine replaced the iPrOH and DMSO solvents, and acetic acid was replaced with propionic acid (0.1 eq) and the reaction temperature was set at 50° C. to give Intermediate 2 which was similar to Intermediate 1: $DS_{Pr}$=1.15 and $DS_{OH}$=1.85.

Preparation of Intermediate 3: CPPv

To a 1 L, 4-neck jacketed resin kettle reaction flask under nitrogen with overhead mechanical stirring was charged anhydrous dimethylacetamide (DMAC, 6.27 mol) and N-methylimidazole (NMI, 1.23 mol). To the mixture was added with stirring CP (0.288 mol) from Step 1 using a bent funnel to direct the powder into the vortex. The mixture was stirred 2 hrs at 35° C. to afford a homogeneous mixture. To the dope was added pivaloyl chloride (0.44 mol eq to CP) in DMAC (0.194 mol) dropwise over 25 minutes. The reaction mixture was stirred at 35° C. for 5 hours. The cellulose-propionate-pivaloate (aka CP-Pv) product was precipitated by pouring the reaction mass into 4 L of water with homogenization to afford a white solid. The solids were collected in a polypropylene weave bag and continuously washed 6 hrs with deionized water. The washed product while still in the closed bag was centrifuged to remove excess water and then the product was transferred to a glass crystallization dish and dried in a vacuum oven at 55° C. and −22 in. Hg overnight. The product was analyzed by $^1$H NMR and $^{13}$C NMR to determine the $DS_{Pr}$=1.19, $DS_{Pv}$=0.38, and $DS_{OH}$=1.43.

Table 1 provides a list of cellulose propionates synthesized along with the equivalents $N_2H_4.H_2O$, $N_2H_4.H_2O$ solvent used, weight percent polymer, acid (acetic acid or propionic acid), reaction time, and reaction temperature.

TABLE 1

| Int | $N_2H_4 \cdot H_2O$ Solvent | Wt % polymer | Eq $N_2H_4 \cdot H_2O$ | Eq Acid | Rxn time (h) | Rxn temp (° C.) |
|---|---|---|---|---|---|---|
| 3 | Pyr | 9.6 | 1.60 | 0.20 (POH) | 18 | 70 |
| 4 | Pyr | 9.7 | 1.60 | 0.20 (POH) | 24 | 25 |
| 5 | Pyr | 15 | 1.60 | 0.20 (AcOH) | 19.5 | 50 |
| 6 | Pyr | 15 | 1.50 | 0.20 (POH) | 18 | 50 |
| 7 | DMSO/iPrOH | 10 | 1.90 | 0.40 (AcOH) | 24 | 40 |
| 8 | Pyr | 8.4 | 1.70 | 0.1 (POH) | 24 | 50 |
| 9 | DMSO/iPrOH | 10 | 1.83 | 0.40 (AcOH) | 20 | 43 |
| 10 | Pyr | 12.4 | 1.63 | 1.60 (POH) | 24 | 50 |
| 11 | Pyr | 13.4 | 1.60 | 1.60 (POH) | 23 | 50 |
| 12 | DMSO/iPrOH | 10 | 1.90 | 0.40 (AcOH) | 24 | 43 |

Table 2 provides the degree of substitution for the hydroxyl, and the C2, C3, and C6 degree of substitution for propionyl for Int 2-12 as determined by $^1$H and $^{13}$C NMR.

TABLE 2

| Int | $DS_{OH}$ | $C2DS_{Pr}$ | $C3DS_{Pr}$ | $C6DS_{Pr}$ |
|---|---|---|---|---|
| 2 | 1.81 | ND | ND | ND |
| 3 | 1.89 | 0.26 | 0.27 | 0.65 |
| 4 | 1.84 | 0.26 | 0.29 | 0.62 |
| 5 | 1.90 | 0.27 | 0.28 | 0.63 |
| 6 | 1.81 | 0.26 | 0.33 | 0.64 |
| 7 | 1.86 | 0.24 | 0.28 | 0.60 |
| 8 | 1.86 | 0.26 | 0.33 | 0.62 |
| 9 | 1.81 | 0.27 | 0.32 | 0.57 |
| 10 | 1.84 | 0.28 | 0.32 | 0.65 |
| 11 | 1.87 | 0.24 | 0.31 | 0.57 |
| 12 | 1.90 | 0.23 | 0.29 | 0.58 |

Preparation of Example 1 (CPPvNp)

To a 500 mL, 4-neck flask under nitrogen with mechanical stirring was added DMAC (177 g) and the Intermediate 1 (17.47 g). To the mixture was added NMI (38.66 g), and the mixture was stirred overnight at rt to afford a dope. To the dope was added PvCl (3.01 g, 0.32 eq) in DMAC (3.01 g), dropwise over 20 min, and the mixture was stirred at rt for 2 h. To the reaction mixture was added NpCl (21.28 g, 1.43 eq) in DMAC (21.28 g), dropwise over 30 min. The reaction mixture was stirred for 12 h. The dope was precipitated by pouring slowly into 1.5 L of water using a high speed homogenizer to provide turbulent mixing, thereby affording a white solid. The solid was isolated by vacuum filtration then re-slurried with water (4×) and with iPrOH (2×) to give the title compound. The product was dried in vacuo at 55° C. overnight. Example 1 was analyzed by $^1H$ NMR, $^{13}C$ NMR to determine the $DS_{Pr}$=1.18, $DS_{Pv}$=0.27; $DS_{Np}$=1.20; and $DS_{OH}$=0.35.

Following the aforementioned procedures, the following examples in Table 3 were prepared by varying the solvent, equivalents of PvCl and ChCl (BzCl or NpCl). Additionally, the intermediate used to synthesize the intermediate and the degree of substitution is also provided.

TABLE 3

| EX # | Int | Product | Solvent | Eq PvCl | Eq ChCl (Ch = Bz/Np/Bt) | $DS_{Ac}$ | $DS_{Pr}$ | $DS_{Pv}$ | $DS_{Ch}$ |
|---|---|---|---|---|---|---|---|---|---|
| 2 | 3 | CPBz | Pyr | 0.00 | 1.9 (BzCl) | 0.02 | 1.16 | 0.00 | 1.80 |
| 3 | 4 | CPBz | Pyr | 0.00 | 1.9 (BzCl) | 0.00 | 1.16 | 0.00 | 1.79 |
| 4 | 5 | CPBz | Pyr | 0.00 | 1.9 (BzCl) | 0.00 | 1.12 | 0.00 | 1.72 |
| 5 | 6 | CPNp | Pyr | 0.00 | 1.6 (NpCl) | 0.00 | 1.22 | 0.00 | 1.56 |
| 6 | 8 | CPNp | Pyr | 0.00 | 1.6 (NpCl) | 0.00 | 1.15 | 0.00 | 1.61 |
| 7 | 7 | CPPv | DMAC/NMI | 0.40 | 0.0 | 0.00 | 1.15 | 0.36 | 0.00 |
| 8 | 8 | CPPvBz | DMAC/NMI | 0.45 | 1.4 (BzCl) | 0.00 | 1.14 | 0.41 | 1.31 |
| 9 | 9 | CPPvBz | Pyr | 0.40 | 1.4 (BzCl) | 0.00 | 1.19 | 0.33 | 1.33 |
| 10 | 9 | CPPvNp | DMAC/NMI | 0.415 | 0.3 (NpCl) | 0.00 | 1.19 | 0.41 | 1.25 |
| 11 | 9 | CPPvNp | DMAC/NMI | 0.42 | 1.2 (NpCl) | 0.00 | 1.19 | 0.37 | 1.23 |
| 12 | 10 | CPPvNp | DMAC/NMI | 0.42 | 1.2 (NpCl) | 0.00 | 1.17 | 0.38 | 1.17 |
| 13 | 10 | CPPvNp | Pyr | 0.40 | 1.2 (NpCl) | 0.00 | 1.12 | 0.36 | 1.22 |
| 14 | 11 | CPPvNp | Pyr | 0.40 | 1.2 (NpCl) | 0.00 | 1.12 | 0.37 | 1.18 |
| 15 | 10 | CPPvNp | Pyr | 0.40 | 0.6 (NpCl) | 0.00 | 1.17 | 0.36 | 0.60 |
| 16 | 10 | CPPvNp | Pyr | 0.40 | 0.8 (NpCl) | 0.00 | 1.19 | 0.36 | 0.80 |
| 17 | 10 | CPPvNp | Pyr | 0.40 | 0.8 (NpCl) | 0.00 | 1.19 | 0.36 | 0.80 |
| 18 | 7 | CPPvNp | DMAC/NMI | 0.22 | 1.4 (NpCl) | 0.00 | 1.16 | 0.2 | 1.29 |
| 19 | 7 | CPPvNp | DMAC/NMI | 0.30 | 1.4 (NpCl) | 0.00 | 1.15 | 0.25 | 1.3 |
| 20 | 12 | CPPvNp | DMAC/NMI | 0.32 | 1.4 (NpCl) | 0.00 | 1.1 | 0.29 | 1.31 |
| 21 | 12 | CPPvNp | DMAC/NMI | 0.32 | 1.4 (NpCl) | 0.00 | 1.1 | 0.29 | 1.31 |
| 22 | 12 | CPPvNp | DMAC/NMI | 0.43 | 1.2 (NpCl) | 0.00 | 1.11 | 0.38 | 1.18 |
| 23 | 12 | CPPvNp | DMAC/NMI | 0.42 | 1.3 (NpCl) | 0.00 | 1.12 | 0.38 | 1.29 |
| 24 | 12 | CPPvNp | DMAC/NMI | 0.43 | 1.3 (NpCl) | 0.00 | 1.11 | 0.41 | 1.23 |
| 25 | 1 | CPPvBt | DMAC/NMI | 0.32 | 1.4 (BtCl) | 0.00 | 1.11 | 0.32 | 1.06 |
| 68 | 1 | CPPvNP | DMAC/NMI | 0.43 | 1.2 (NpCl) | 0.00 | 1.1 | 0.4 | 1.2 |

Preparation of Example 26 (CPPvF)

To a dry 250 mL Erlenmeyer flask equipped with a magnetic stir bar and capped with septum and inserted with $N_2$ was charged anhydrous dimethylacetamide (DMAC, 1.53 mol) and N-methylimidazole (NMI, 0.164 mol). To the mixture was added with stirring CP-Pv (0.0.034 mol) from Step 2. The mixture was stirred 2 hrs at RT to afford a homogeneous mixture. To the dope was added with stirring furanoyl chloride (0.114 mol eq to CP-Pv) in DMAC (0.126 mol) over 1 minute. The reaction was stirred under a $N_2$ blanket at room temperature for 24 hours. The product was precipitated by pouring into 1.2 L of methanol with homogenization to afford a white solid (aka CP-Pv-F). The solids were collected in a polypropylene weave bag and washed with methanol (2×800 mL). The washed product while still in the closed bag was transferred to a wash station and continuously washed with deionized water for 6 hours. The product was centrifuged to remove excess water and then the product was transferred to a glass crystallization dish and dried in a vacuum oven at 55° C. and −22 in. Hg overnight. The product was analyzed by 1H NMR, 13C NMR and for optical properties.

The examples in Table 4 were synthesized by adapting the procedure for the synthesis of Ex. 26. The equivalents of Ch-Cl used to synthesize each example is provided. Each compound was characterized to determine the degree of substitution for the Pr, Pv, Ch and OH substituents.

TABLE 4

| Ex # | Eq. PvCl | Eq. Ch-COX | CP-Pv-Ch Product | $DS_{Pr}$ | $DS_{Pv}$ | $DS_{Ch}$ | $DS_{TOT}$ | $DS_{OH}$ |
|---|---|---|---|---|---|---|---|---|
| 26 | 0.43 | 1.02 | CPPvF | 1.2 | 0.41 | 1.01 | 2.62 | 0.39 |
| 27 | 0.43 | 0.99 | CPPvF | 1.2 | 0.41 | 1.0 | 2.63 | 0.39 |
| 28 | 0.48 | 1.18 | CPPvF | 1.19 | 0.45 | 1.05 | 2.69 | 0.31 |
| 29 | 0.48 | 1.37 | CPPvF | 1.22 | 0.46 | 1.25 | 2.93 | 0.07 |
| 30 | 0.44 | 1.00 | CPPvF | 1.22 | 0.39 | 0.84 | 2.45 | 0.55 |
| 31 | 0.44 | 0.90 | CPPvF | 1.22 | 0.4 | 0.77 | 2.39 | 0.61 |
| 32 | 0.44 | 1.14 | CPPvF | 1.19 | 0.39 | 1.04 | 2.62 | 0.38 |
| 33 | 0.44 | 1.06 | CPPvF | 1.2 | 0.38 | 0.9 | 2.48 | 0.52 |
| 34 | 0.44 | 1.19 | CPPvF | 1.19 | 0.4 | 1.01 | 2.6 | 0.4 |
| 35 | 0.44 | 1.12 | CPPvF | 1.2 | 0.41 | 0.96 | 2.57 | 0.43 |
| 36 | 0.44 | 1.09 | CPPvF | 1.2 | 0.38 | 0.94 | 2.52 | 0.48 |
| 37 | 0.44 | 1.12 | CPPvF | 1.21 | 0.38 | 0.96 | 2.55 | 0.45 |
| 38 | 0.43 | 1.00 | CPPvBFC | 1.2 | 0.43 | 1.02 | 2.65 | 0.35 |
| 39 | 0.48 | 1.33 | CPPvBFC | 1.22 | 0.45 | 1.24 | 2.91 | 0.09 |
| 40 | 0.44 | 1.0 | CPPvBFC | 1.19 | 0.4 | 0.83 | 2.42 | 0.58 |
| 41 | 0.44 | 0.94 | CPPvBTB | 1.21 | 0.4 | 0.92 | 2.53 | 0.47 |
| 42 | 0.48 | 1.33 | CPPvBzBz | 1.23 | 0.46 | 1.18 | 2.87 | 0.13 |
| 43 | 0.48 | 1.22 | CPPvBZT | 1.22 | 0.46 | 1.12 | 2.8 | 0.20 |
| 44 | 0.44 | 1.00 | CPPvBZT | 1.19 | 0.4 | 0.74 | 2.33 | 0.67 |
| 45 | 0.44 | 1.00 | CPPvBZT | 1.19 | 0.38 | 0.81 | 2.38 | 0.62 |
| 46 | 0.44 | 1.00 | CPPvBZT | 1.19 | 0.4 | 0.83 | 2.42 | 0.58 |
| 47 | 0.44 | 0.99 | CPPvBZT | 1.19 | 0.4 | 0.80 | 2.39 | 0.61 |
| 48 | 0.44 | 0.94 | CPPvBZT | 1.19 | 0.4 | 0.74 | 2.33 | 0.67 |
| 49 | 0.44 | 0.97 | CPPvBZT | 1.19 | 0.41 | 0.79 | 2.39 | 0.61 |
| 50 | 0.44 | 0.91 | CPPvBZT | 1.21 | 0.38 | 0.74 | 2.33 | 0.67 |
| 51 | 0.44 | 0.91 | CPPvBZT | 1.21 | 0.38 | 0.66 | 2.25 | 0.75 |
| 52 | 0.44 | 0.90 | CPPvBZT | 1.21 | 0.38 | 0.7 | 2.29 | 0.71 |
| 53 | 0.44 | 1.06 | CPPvMCA | 1.2 | 0.36 | 0.86 | 2.42 | 0.58 |
| 54 | 0.48 | 0.97 | CPPvMCA | 1.19 | 0.44 | 0.76 | 2.39 | 0.61 |
| 55 | 0.44 | 0.88 | CPPvMCA | 1.19 | 0.4 | 0.7 | 2.29 | 0.71 |
| 56 | 0.44 | 1.01 | CPPvNMP | 1.2 | 0.38 | 0.35 | 1.93 | 1.07 |
| 57 | 0.44 | 1.02 | CPPvNMP | 1.19 | 0.4 | 0.62 | 2.21 | 0.79 |
| 58 | 0.44 | 1.51 | CPPvNMP | 1.19 | 0.4 | 0.73 | 2.32 | 0.68 |
| 59 | 0.48 | 1.18 | CPPvT | 1.23 | 0.46 | 1.04 | 2.73 | 0.27 |
| 60 | 0.44 | 0.95 | CPPvT | 1.22 | 0.4 | 0.77 | 2.39 | 0.61 |
| 61 | 0.44 | 1.07 | CPPvT | 1.21 | 0.39 | 0.93 | 2.53 | 0.47 |
| 62 | 0.44 | 1.03 | CPPvT | 1.22 | 0.37 | 0.91 | 2.5 | 0.50 |
| 63 | 0.44 | 1.00 | CPPvTMB | 1.19 | 0.4 | 0.73 | 2.32 | 0.56 |
| 64 | 0.44 | 1.10 | CPPvTMB | 1.19 | 0.38 | 0.86 | 2.43 | 0.57 |
| 65 | 0.44 | 1.06 | CPPvTCA | 1.20 | 0.38 | 0.73 | 2.31 | 0.69 |
| 66 | 0.44 | 1.06 | CPPvTCA | 1.21 | 0.40 | 0.76 | 2.37 | 0.63 |
| 67 | 0.44 | 1.07 | CPPvTCA | 1.21 | 0.41 | 0.73 | 2.35 | 0.65 |

Table 5 provides the degree of substitution values were determined by $^{13}C$ NMR. The normalized or adjusted degree of substitution was calculated by multiplying the ratio of the total acyl as determined by $^{13}C$ NMR and the total acyl as determined by $^{1}H$ NMR.

TABLE 5

| | Experimental Degree of Substitution | | | | | Normalized Degree of Substitution | | | | |
|---|---|---|---|---|---|---|---|---|---|---|
| Ex # | C2 Acyl | C3 Acyl | C6 Acyl | $^{13}C$ acyl Total | $^{13}C$ $DS_{OH}$ | adj Ac2 | adj Ac3 | adj Ac6 | adj $^{13}C$ acyl | adj $^{13}C$ $DS_{OH}$ |
| Int-1 | 0.25 | 0.32 | 0.57 | 1.14 | 1.86 | 0.26 | 0.33 | 0.60 | 1.19 | 1.81 |
| Int-2 | 0.27 | 0.35 | 0.60 | 1.22 | 1.78 | 0.25 | 0.33 | 0.57 | 1.15 | 1.85 |
| Int-12 | 0.23 | 0.29 | 0.58 | 1.10 | 1.98 | 0.23 | 0.29 | 0.58 | 1.10 | 1.98 |
| 7 | 0.31 | 0.41 | 0.79 | 1.51 | 1.49 | 0.31 | 0.41 | 0.79 | 1.51 | 1.49 |
| 12 | 0.98 | 0.77 | 0.99 | 2.74 | 0.26 | 0.97 | 0.76 | 0.98 | 2.72 | 0.28 |
| 13 | 0.99 | 0.68 | 0.98 | 2.65 | 0.35 | 1.01 | 0.69 | 1.00 | 2.70 | 0.30 |
| 21 | 0.96 | 0.72 | 0.96 | 2.63 | 0.37 | 0.99 | 0.74 | 0.98 | 2.71 | 0.29 |
| 22 | 0.96 | 0.68 | 0.98 | 2.62 | 0.38 | 0.98 | 0.69 | 1.00 | 2.67 | 0.33 |
| 23 | 0.98 | 0.80 | 0.96 | 2.74 | 0.26 | 1.00 | 0.82 | 0.98 | 2.80 | 0.20 |
| 24 | 0.98 | 0.70 | 0.96 | 2.65 | 0.35 | 1.02 | 0.73 | 1.00 | 2.73 | 0.27 |

Table 6 provides the degree of substitutions for Pv and Np at C2, C3 and C6 along with the total degree of substitution for PV and Np of the cellulose ester backbone as determined by $^{13}$C NMR.

TABLE 6

| Ex # | C2DS$_{Pv}$ | C3DS$_{Pv}$ | C6DS$_{Pv}$ | DS$_{Pv}$ Total | C2DS$_{Np}$ | C3DS$_{Np}$ | C6DS$_{Np}$ | DS$_{Np}$ Total |
|---|---|---|---|---|---|---|---|---|
| 7 | 0.06 | 0.08 | 0.22 | 0.36 | | | | |
| 12 | 0.06 | 0.08 | 0.24 | 0.38 | 0.65 | 0.35 | 0.15 | 1.15 |
| 13 | 0.06 | 0.08 | 0.22 | 0.36 | 0.71 | 0.29 | 0.22 | 1.22 |
| 21 | 0.04 | 0.01 | 0.20 | 0.29 | 0.72 | 0.44 | 0.20 | 1.36 |
| 22 | 0.06 | 0.05 | 0.24 | 0.38 | 0.69 | 0.35 | 0.18 | 1.22 |
| 23 | 0.06 | 0.05 | 0.24 | 0.38 | 0.71 | 0.48 | 0.16 | 1.35 |
| 24 | 0.06 | 0.05 | 0.26 | 0.41 | 0.73 | 0.39 | 0.16 | 1.28 |

Using the data provided in Table 6, the values in Table 7 were calculated. The data show that the aryl-acyl group is favored on the C2 and C3 positions over C6 position. Additionally, the C2 position is favored over the C3 position.

TABLE 7

| Ex # | (C2DS$_{Np}$ + C3DS$_{Np}$) − C6DS$_{Np}$ | C2DS$_{Np}$ − C3DS$_{Np}$ |
|---|---|---|
| 21 | 1.0 | 0.3 |
| 22 | 0.9 | 0.3 |
| 23 | 1.0 | 0.2 |
| 24 | 1.1 | 0.3 |

General Procedure for Film Casting

A solvent (DCM, 10% MeOH in DCM, 10% DCE in DCM, MEK, or MIPK) and the regioselective cellulose ester (10 wt %) and optionally a plasticizer (10 wt %, DEP or TPP) were mixed to make a dope. Then, films were cast onto glass using a knife applicator and dried either at rt, in the case of a DCM based dope, or at 85° C. in a forced air oven for 10 min. for dopes made from MEK and MIPK based dopes. The cast films were annealed at 100° C. and 120° C. in a forced air oven for 10 min each. The thickness of the films were measured using a Metricon Prism Coupler 2010 (Metricon Corp.). The birefringence and retardations were measured using a M-2000V Ellipsometer (J. A. Woollam Co.).

Preparation of EX 25.1

A dope of Ex 25 (10 wt %), TPP (10 wt %), 10% MeOH in DCM was used to cast a film (11.9 μm). Δn=0.006 (589 nm), R$_{th}$[450 nm]/R$_{th}$[550 nm]=1.2 (dispersion); R$_{th}$=0.92 (650 nm/550 nm).

Table 8 provides casting results for the compounds of this application. The solvents used to make the dope is provided along with the plasticizer used. The dopes were used to prepare the films, and the birefringence and thickness were measured. The birefringence were taken using a wavelength of 589 nm. The thickness of the films were measured using a Metricon Prism Coupler 2010 (Metricon Corp.). The retardations were measured using a M-2000V Ellipsometer (J. A. Woolam Co.). The haze and b* measurements were made using a HunterLab Ultrascan VIS colorimeter in diffused transmittance mode (1 inch diameter port). In the case of dopes, a 1 cm path length cell was used. For dope b* and haze, 10 measurements were taken, and the average was reported.

TABLE 8

| Film # | Solvent | 10 wt % Pz | Δn (589 nm) | Film Thickness (μm) | R$_{th}$ (nm) | b* | % Haze (film) |
|---|---|---|---|---|---|---|---|
| 1.1 | MEK | TPP | 0.0066 | 13.07 | 86.6 | 0.27 | 0.13 |
| 3.1 | DCM | DEP | 0.0076 | 16.59 | 126.8 | — | — |
| 3.2 | DCM | DEP | 0.0065 | 12.36 | 80 | 0.69 | 0.50 |
| 3.3 | DCM | DEP (10.7 wt %) | 0.0070 | 14.96 | 104.0 | 0.75 | 0.80 |
| 4.1 | DCM/MeOH (9:1) | TPP | 0.0084 | 7.54 | 63.1 | 0.29 | 0.27 |
| 4.2 | DCM/MeOH (9:1) | TPP | 0.0076 | 7.27 | 55.1 | 0.28 | 0.14 |
| 5.1 | DCM/DCE (91:9) | TPP | 0.0128 | 13.79 | 176.8 | 0.53 | 0.81 |
| 5.2 | MEK | TPP | 0.0084 | 13.66 | 115.3 | 0.34 | 0.31 |
| 7.1 | DCM | TPP | 0.0118 | | | | |
| 8.1 | MEK | TPP | 0.0067 | 12.56 | 84.5 | 0.35 | 0.28 |
| 9.1 | DCM | TPP | 0.0064 | 17.76 | 113.5 | 0.59 | 0.46 |
| 10.1 | MEK | TPP | 0.0107 | 13.83 | 148.6 | 0.45 | 0.21 |
| 11.1 | MEK | TPP | 0.0098 | 10.40 | 102.0 | 0.34 | 0.24 |
| 11.2 | MEK | TPP | 0.0101 | 11.43 | 114.9 | 0.32 | 0.11 |
| 12.1 | MEK | TPP | 0.0076 | 12.72 | 97.1 | | |
| 13.1 | DCM/MeOH (97:3) | TPP | 0.0126 | 19.35 | 244.3 | 0.69 | 0.52 |
| 13.2 | DCM/MeOH (97:3) | TPP | 0.0141 | 12.84 | 180.4 | 0.60 | 0.76 |
| 13.3 | MEK | TPP | 0.0091 | 10.52 | 95.8 | 0.34 | 0.19 |
| 14.1 | MEK | TPP | 0.0092 | 8.96 | 82.3 | 0.28 | 0.19 |

TABLE 8-continued

| Film # | Solvent | 10 wt % Pz | Δn (589 nm) | Film Thickness (μm) | $R_{th}$ (nm) | b* | % Haze (film) |
|---|---|---|---|---|---|---|---|
| 14.2 | MEK | TPP | 0.0108 | 7.81 | 84.4 | 0.29 | 0.20 |
| 14.3 | MEK | — | 0.0086 | 8.07 | 69.6 | 0.30 | 0.15 |
| 14.4 | MIPK | — | 0.0087 | 9.29 | 80.7 | 0.30 | 0.12 |
| 15.1 | DCM/MeOH (97/3) | TPP | 0.0032 | 14.04 | 44.3 | 0.32 | 0.42 |
| 16.1 | DCM | TPP | 0.0062 | 11.60 | 72.1 | 0.33 | 0.32 |
| 16.2 | DCM/MeOH (9:1) | TPP | 0.0085 | 18.47 | 156.2 | 0.36 | 0.41 |
| 18.1 | DCM/MeOH (97:3) | TPP | 0.0093 | 13.61 | 126.8 | 0.33 | 0.63 |
| 19.1 | MEK | TPP | 0.0066 | 12.42 | 81.7 | | |
| 20.1 | MEK | TPP | 0.0070 | 13.44 | 94.3 | 0.70 | 0.82 |
| 21.1 | MEK | TPP | 0.0076 | 9.38 | 71.1 | 0.30 | 0.14 |
| 22.1 | MEK | TPP | 0.0077 | 13.89 | 106.4 | 0.28 | 0.40 |
| 23.1 | MEK | TPP | 0.0096 | 12.38 | 118.9 | 0.50 | 0.55 |
| 24.1 | MEK | TPP | 0.0091 | 8.91 | 81.1 | 0.28 | 0.25 |

Preparation of Bilayer Films by Solution Cast
Polymer Dope Preparation and Film Casting Procedure (Using Eastman Visualize™ Material 234 ("VM234") Films as an Example)

VM234 polymer is mixed at 12 wt % in solution with 13% MeOH in DCM and 10 wt % triphenylphosphate (TPP) as plasticizer based on solids (VM234 and TPP combined). Plasticizer types can be adjusted based on desired film strength and optical properties. A typical recipe uses 54 g VM234
6 g TPP (or other plasticizer)
390 g solvent (13% MeOH in DCM).

Dopes are made in a 16 oz wide mouth jar and placed on a roller at room temperature for 12-24 hours or until fully in solution. The polymer needs to be completely dissolved with no "fish eyes" (i.e., gels) present in the solution. When ready to cast, the dope is removed from the roller and allowed to sit until all bubbles have left solution.

Films are cast onto a glass plate using a GardCo Automatic Drawdown Machine II set to a speed of 3.5 and a 10-inch GardCo adjustable micrometer film applicator with stainless steel blade set to a 30 mil drawdown gap from the surface of the glass (targeting a 60 μm film). The dope is poured as a puddle between the "feet" of the casting blade. The Automatic Drawdown Machine pushes the casting blade over the dope, smoothing it out to the desired thickness. A non-contacting cover is immediately placed over the cast dope to slow down the solvent evaporation rate and prevent bubble formation. At the end of this time, the cover is propped open approximately 1 cm. for 15 minutes, at which point the cover is completely removed and the film is allowed to dry uncovered for an additional 15 minutes.

Once the film is dry, it is removed from the casting plate using a razor blade and placed between two sheets of paper. A heavy rectangular weight is placed on top of the sheet of film to prevent curling. The film can sit under the weight for up to a week.

The sheet of film is then cut into six smaller films for annealing, measuring, and stretching. The size of the film is determined by the type of stretching. For uniaxial (unconstrained) stretching, the films are 8.8 cm wide×12 cm long. Films for constrained stretching are 12 cm×12 cm.

The cut films are placed individually between two thin aluminum squares with a 3 in×3 in square cut out in the middle. The entire film is covered by the aluminum with the exception of the 3 in×3 in square in the middle of the film; it is this portion of the film on which all the measurements are run. The aluminum plates are secured with four owl clips, one at each corner of the film.

Secured films are then stacked on a cookie sheet for annealing. Typically, six films are stacked per 'cookie sheet', in two stacks of three films. The cookie sheet of films is then placed in a Blue M oven set to 100° C. for 10 minutes, then immediately moved into a Blue M oven set to 120° C. for an additional 10 minutes of annealing. After the annealing process is complete, the films cool to room temperature and are then removed from the aluminum plates before being measured.

Optical properties for each film are measured using a J.A. Woollan Co., Inc. spectroscopic ellipsometer with the JAW Co. Retardance Measurement Program and corresponding V.A.S.E. software for Windows. The color (B*) and haze for each film is measured using a HunterLab Ultrascan VIS colorimeter in diffused transmittance mode. The thickness of the films is measured using a handheld Positector 6000.

By adapting the procedures for preparation of films, the following films in Table 9 were prepared.

TABLE 9

| | | | | | | |
|---|---|---|---|---|---|---|
| | | | DSUV Optical Data | | | |
| Film # | CE Ex # | CPPvCh | d (μm) | $R_e$ (589 nm) (nm) | $R_{th}$ (589 nm) (nm) | $R_{th}$ (589 nm)/d |
| 26.1 | 26 | CPPvF | 9.4 | 0.1 | 13.7 | 1.4 |
| 27.1 | 27 | CPPvF | 10.3 | 0.0 | 15.4 | 1.5 |
| 28.1 | 28 | CPPvF | 8.9 | 0.5 | 23.0 | 2.6 |
| 29.1 | 29 | CPPvF | 10.2 | 1.9 | 56.5 | 5.5 |
| 30.1 | 30 | CPPvF | 10.5 | 0.1 | 1.9 | 0.2 |
| 31.1 | 31 | CPPvF | 9.8 | −0.1 | −4.9 | −1.3 |
| 32.1 | 32 | CPPvF | 9.1 | 0.1 | 18.3 | 2.0 |
| 33.1 | 33 | CPPvF | 12.5 | 0.4 | 6.5 | 0.5 |
| 34.1 | 34 | CPPvF | 9.5 | −0.1 | 29.9 | 3.1 |
| 35.1 | 35 | CPPvF | 8.6 | −0.2 | 19.7 | 2.3 |
| 36.1 | 36 | CPPvF | 6.4 | 0.0 | 13.2 | 2.1 |
| 37.1 | 37 | CPPvF | 6.7 | 0.4 | 18.3 | 2.5 |
| 38.1 | 38 | CPPvBFC | 10.6 | 0.2 | 41.5 | 3.9 |
| 39.1 | 39 | CPPvBFC | 11.1 | 1.8 | 77.6 | 7.1 |
| 40.1 | 40 | CPPvBFC | 9.2 | 0.1 | 22.6 | 2.5 |
| 41.1 | 41 | CPPvBTB | 10.2 | 0.2 | 47.1 | 4.6 |
| 42.1 | 42 | CPPvBzBz | | 0.0 | −24.3 | |
| 43.1 | 43 | CPPvBZT | 6.2 | 0.2 | 43.8 | 7.1 |
| 44.1 | 44 | CPPvBZT | 10.6 | −0.2 | 42.2 | 4.0 |
| 45.1 | 45 | CPPvBZT | 12.9 | 0.0 | 56.0 | 4.3 |
| 46.1 | 46 | CPPvBZT | 10.7 | 1.1 | 62.1 | 5.8 |

TABLE 9-continued

DSUV Optical Data

| Film # | CE Ex # | CPPvCh | d (μm) | $R_e$ (589 nm) (nm) | $R_{th}$ (589 nm) (nm) | $R_{th}$ (589 nm)/ d |
|---|---|---|---|---|---|---|
| 47.1 | 47 | CPPvBZT | 9.3 | 1.7 | 49.7 | 5.3 |
| 48.1 | 48 | CPPvBZT | 10.9 | 0.5 | 45.1 | 4.1 |
| 49.1 | 49 | CPPvBZT | 3.3 | 0.7 | 15.8 | 4.8 |
| 50.1 | 50 | CPPvBZT | 6.1 | 0.0 | 22.2 | 3.6 |
| 51.1 | 51 | CPPvBZT | 6.8 | 0.5 | 18.6 | 2.7 |
| 52.1 | 52 | CPPvBZT | 7.0 | 0.1 | 23.8 | 3.4 |
| 53.1 | 53 | CPPvMCA | 11.7 | 1.5 | 64.7 | 5.6 |
| 54.1 | 54 | CPPvMCA | 6.7 | 0.0 | 34.3 | 5.1 |
| 55.1 | 55 | CPPvMCA | 8.6 | 0.2 | 30.7 | 3.6 |
| 56.1 | 56 | CPPvNMP | 9.4 | 0.0 | −43.2 | −4.6 |
| 57.1 | 57 | CPPvNMP | 10.5 | 0.2 | −9.1 | −0.9 |
| 58.1 | 58 | CPPvNMP | 10.8 | −0.1 | 3.8 | 0.3 |
| 59.1 | 59 | CPPvT | 10.9 | −0.1 | 48.1 | 4.4 |
| 60.1 | 60 | CPPvT | 9.4 | 0.4 | 17.8 | 1.9 |
| 61.1 | 61 | CPPvT | 11.2 | 0.4 | 35.9 | 3.2 |
| 62.1 | 62 | CPPvT | 12.6 | 0.1 | 38.9 | 3.1 |
| 63.1 | 63 | CPPvTMB | 9.3 | 0.2 | 15.0 | 1.6 |
| 64.1 | 64 | CPPvTMB | 9.7 | 0.0 | 24.8 | 2.6 |
| 65.1 | 65 | CPPvTCA | 5.4 | 1.0 | 23.3 | 4.33 |
| 66.1 | 66 | CPPvTCA | 4.7 | 4.6 | 19.1 | 4.2 |
| 67.1 | 67 | CPPvTCA | 6.9 | 0.3 | 40.5 | 5.9 |

TABLE 10

| Film # | CE Ex # | $R_e$(450 nm)/ $R_e$(550 nm) | $R_e$(650 nm)/ $R_e$(550 nm) | $R_{th}$(450 nm)/ $R_{th}$(550 nm) | $R_{th}$(650 nm)/ $R_{th}$(550 nm) |
|---|---|---|---|---|---|
| 26.1 | 26 | 1.74 | 0.30 | 1.22 | 0.89 |
| 27.1 | 27 | 0.28 | 0.24 | 1.22 | 0.89 |
| 28.1 | 28 | 1.01 | 1.00 | 1.14 | 0.93 |
| 29.1 | 29 | 1.08 | 0.94 | 1.10 | 0.95 |
| 30.1 | 30 | 1.06 | 0.68 | 2.17 | 0.43 |
| 31.1 | 31 | 0.63 | 1.29 | 0.40 | 1.29 |
| 32.1 | 32 | 0.00 | 0.63 | 1.17 | 0.91 |
| 33.1 | 33 | 0.97 | 0.87 | 1.52 | 0.74 |
| 34.1 | 34 | −1.36 | 1.22 | 1.15 | 0.93 |
| 35.1 | 35 | −0.91 | 1.84 | 1.18 | 0.91 |
| 36.1 | 36 | 0.19 | 0.00 | 1.21 | 0.90 |
| 37.1 | 37 | 1.01 | 0.94 | 1.19 | 0.91 |
| 38.1 | 38 | 1.05 | 0.97 | 1.12 | 0.94 |
| 39.1 | 39 | 1.04 | 0.89 | 1.11 | 0.95 |
| 40.1 | 40 | −0.09 | 1.01 | 1.16 | 0.92 |
| 41.1 | 41 | −1.16 | −1.51 | 1.12 | 0.94 |
| 42.1 | 42 | 0.87 | 0.88 | 1.05 | 0.98 |
| 43.1 | 43 | 0.41 | 0.91 | 1.14 | 0.94 |
| 44.1 | 44 | 1.12 | 0.98 | 1.21 | 0.91 |
| 45.1 | 45 | 1.20 | 0.44 | 1.19 | 0.92 |
| 46.1 | 46 | 1.12 | 0.91 | 1.17 | 0.93 |
| 47.1 | 47 | 1.11 | 0.94 | 1.18 | 0.92 |
| 48.1 | 48 | 0.98 | 0.97 | 1.20 | 0.91 |
| 49.1 | 49 | 0.93 | 0.85 | 1.19 | 0.92 |
| 50.1 | 50 | 1.63 | −0.74 | 1.21 | 0.91 |
| 51.1 | 51 | −0.09 | −0.05 | 1.28 | 0.88 |
| 52.1 | 52 | 0.93 | 0.86 | 1.24 | 0.89 |
| 53.1 | 53 | 1.19 | 0.96 | 1.13 | 0.94 |
| 54.1 | 54 | 0.81 | 0.72 | 1.15 | 0.93 |
| 55.1 | 55 | 1.00 | 1.05 | 1.17 | 0.92 |
| 56.1 | 56 | −1.08 | 0.29 | 0.96 | 1.02 |
| 57.1 | 57 | 0.98 | 0.28 | 0.58 | 1.20 |
| 58.1 | 58 | 0.91 | 0.13 | 1.90 | 0.57 |
| 59.1 | 59 | 0.43 | 0.18 | 1.13 | 0.93 |
| 60.1 | 60 | 1.03 | 0.95 | 1.27 | 0.87 |
| 61.1 | 61 | 1.09 | 0.91 | 1.18 | 0.92 |
| 62.1 | 62 | 1.02 | 0.36 | 1.18 | 0.91 |
| 63.1 | 63 | 1.81 | 1.06 | 1.28 | 0.87 |
| 64.1 | 64 | 0.70 | −0.06 | 1.19 | 0.91 |
| 65.1 | 65 | 0.44 | 0.36 | 1.25 | 0.90 |
| 66.2 | 66 | 1.23 | 0.91 | 1.22 | 0.91 |
| 67.3 | 67 | 1.21 | 1.11 | 1.23 | 0.90 |

Bilayer Coatings

The bilayer substrate is cast consistent with the procedures listed above, using a slightly smaller casting blade (9-inch instead of 10-inch).

The coating is doped in a 4 oz wide mouth jar at 8-9 wt % polymer in solvent. Plasticizer is not used in the coating. A typical dope recipe may consist of
  4 g polymer (UV-dye compound)
  41 g solvent (87/13 DCM/MeOH, or MEK, or consistent with the solvent system used for the substrate).

To cast the bilayer film, the substrate is first cast and dried. After the allotted drying method and time, a 10-inch GardCo adjustable micrometer film applicator with stainless steel blade is set to a 1-2 mil drawdown gap from the surface of the substrate film. The edges of the casting blade rest on the glass outside the edges of the substrate film (so that the casting blade does not scratch the substrate). The coating dope is poured as a puddle on the glass plate above the substrate, and the film is cast and dried on top of the substrate using the same procedure as the substrate. The films are then prepared in the same manner as the procedure above.

The thickness of the coating on the bilayered film can be measured using a Metricon MCU Model 2010 Prism Coupler. First, the refractive index of the substrate is measured, then the index is used to calculate the thickness of the coating.

Stretching of Bilayer Films

Turn the nitrogen tanks on. Turn the stretcher on. Prep the samples using the designated precision cutter. Set up the test parameters on the instrument and allow it to preheat to the desired temperature. Load the sample into the clips to be stretched. Using the computer, engage the clips and start the stretching test. Heat the film for 25 seconds in the stretching oven (soak time) before beginning to stretch. Films are generally stretched uniaxially (unconstrained) or biaxially (constrained). Uniaxial stretched films are stretched to the ratio specified based on the original size of the film. Stretching ratios are typically between 1×1.4 and 1×2.0, such that a film stretched to a ratio of 1×1.4 is 40% longer than its original length. Films are stretched at a rate of 1% per second. After the stretching test is complete, release the clips. Using the computer switch, open the clips and then remove the sample. After all samples have been tested for the day, initiate auto shutdown. Turn off the nitrogen tanks and expel/flush the lines. Close nitrogen and air valves on instrument.

Optical Properties of Various Bilayer Films

TABLE 11

Optical Properties of Unconstrained, Machine Direction Stretched Furanoyl Optical Compensation Film

| Film # | CE Ex # | d (μm) | $R_e$ (589 nm) (nm) | $R_{th}$ (589 nm) (nm) | $R_e$ (450 nm)/ $R_e$ (550 nm) | $R_e$ (650 nm)/ $R_e$ (550 nm) |
|---|---|---|---|---|---|---|
| 35.2 | 35 | 68.0 | 146.2 | −78.68 | 0.88 | 1.06 |
| 32.2 | 32 | 74.0 | 113 | −67 | 0.82 | 1.10 |
| 32.3 | 32 | 72.0 | 111 | −64 | 0.82 | 1.09 |
| 32.4 | 32 | 77.0 | 110 | −65 | 0.83 | 1.09 |
| 35.3 | 35 | 63.0 | 113 | −81 | 0.84 | 1.09 |
| 32.5 | 32 | 68.0 | 129 | −75 | 0.86 | 1.08 |
| 28.2 | 28 | 84.0 | 125 | −69 | 0.86 | 1.08 |
| 35.4 | 35 | 62.0 | 110 | −85 | 0.86 | 1.08 |
| 37.2 | 37 | 66.0 | 133.19 | −96.54 | 0.86 | 1.07 |
| 32.6 | 32 | 72.0 | 125 | −73 | 0.86 | 1.07 |

TABLE 11-continued

Optical Properties of Unconstrained, Machine Direction Stretched Furanoyl Optical Compensation Film

| Film # | CE Ex # | d (μm) | $R_e$ (589 nm) (nm) | $R_{th}$ (589 nm) (nm) | $R_e$ (450 nm)/ $R_e$ (550 nm) | $R_e$ (650 nm)/ $R_e$ (550 nm) |
|---|---|---|---|---|---|---|
| 32.7 | 32 | 68.0 | 136 | −77 | 0.86 | 1.07 |
| 32.8 | 32 | 62.0 | 130 | −74 | 0.87 | 1.07 |
| 28.3 | 28 | 84.0 | 120 | −73 | 0.87 | 1.07 |
| 35.5 | 35 | 54.0 | 116 | −73 | 0.87 | 1.07 |

TABLE 12

Optical Properties of Unconstrained Stretched, Machine Direction Benzothiophenoyl Optical Compensation Film

| Film # | CE Ex # | d (μm) | $R_e$ (589 nm) (nm) | $R_{th}$ (589 nm) (nm) | $R_e$ (450 nm)/ $R_e$ (550 nm) | $R_e$ (650 nm)/ $R_e$ (550 nm) |
|---|---|---|---|---|---|---|
| 49.2 | 49 | 62 | 111 | −77 | 0.81 | 1.09 |
| 44.1 | 44 | 64 | 109 | −76 | 0.82 | 1.09 |
| 49.3 | 49 | 65 | 113 | −82 | 0.83 | 1.09 |
| 44.3 | 44 | 59 | 109 | −96 | 0.85 | 1.07 |
| 49.4 | 49 | 62 | 137 | −86 | 0.87 | 1.06 |
| 49.5 | 49 | 57 | 130 | −93 | 0.88 | 1.06 |
| 44.4 | 44 | 66 | 139 | −81 | 0.88 | 1.06 |
| 44.5 | 44 | 60 | 128 | −87 | 0.87 | 1.07 |
| 49.6 | 49 | 62 | 137 | −86 | 0.87 | 1.06 |
| 49.7 | 49 | 64 | 144 | −101 | 0.87 | 1.06 |
| 44.6 | 44 | 58 | 133 | −81 | 0.87 | 1.06 |

TABLE 13

Optical Properties of 45° Stretched Optical Compensation Films

| Ex # | CE Ex # | d (μm) | $R_e$ (589 nm) (nm) | $R_{th}$ (589 nm) (nm) | $R_e$ (450 nm)/ $R_e$ (550 nm) | $R_e$ (650 nm)/ $R_e$ (550 nm) |
|---|---|---|---|---|---|---|
| 36.2 | 36 | 114 | 150.92 | −190.31 | 0.88 | 1.06 |
| 50.2 | 50 | 112 | 150.65 | −117.35 | 0.86 | 1.08 |
| 52.2 | 52 | 120 | 154.73 | −144.79 | 0.82 | 1.09 |
| 50.3 | 50 | 84 | 141.53 | −116.71 | 0.85 | 1.07 |
| 52.3 | 52 | 87 | 134.03 | −119.95 | 0.84 | 1.07 |
| 66.2 | 66 | 74 | 164.04 | −122.83 | 0.88 | 1.06 |

Procedure for Accessing Film Ductility

Peel Test

1. Using the Polymer Dope Preparation and Film Casting Procedure, cast a 10μ thick film on a 4 inch×5.5 inch plate of glass.
2. Using cut resistant gloves and a razor blade, score the film from the left edge of the film across to the right edge of the film approximately 1 inch from the top of the film.
3. Place the bottom half of a piece of Scotch™ tape across the top of the bottom piece of film and fold back the tape to provide a fingerhold.
4. Carefully start peeling the film off of the glass slide in a continuous motion.
5. If 80% of the film comes off of the slide in one piece, the film passes the peel test.

Strength Grading

1. Using the Polymer Dope Preparation and Film Casting Procedure, cast a film on a plate of glass.
2. Wearing cut resistant gloves, slide a razor blade under the corner of the film and begin to remove the film from the glass plate. Grade the film by how it responds to the act of being removed.
3. The grades are as follows:
   a. Excellent—The film comes up in one or two big pieces
   b. Good—The film comes up in several medium to big pieces
   c. Bad—The film comes up in a lot of small pieces
   d. Poor—The film comes up in tiny or shredded pieces.

Film 68.1 was prepared from Ex 68. Films A-B were prepared from cellulose esters having the degree of substitutions for propionyl, pivaloyl, naphthoyl, and hydroxyl as shown in Table 14. The data in Table 14 shows that a film having a DSOH of less than 0.16 fail the film strength and Peel test.

TABLE 14

Compositions that produce ductile and non-ductile RACE C+ optical compensation films

| Film # | DS of CE | | | | $R_{th}/d$ | Thickness (μm) | Film Strength | Passed Peel Test |
| | $DS_{Pr}$ | $DS_{Pv}$ | $DS_{Np}$ | $DS_{OH}$ | | | | |
|---|---|---|---|---|---|---|---|---|
| 68.1 | 1.0-1.2 | 0.37-0.41 | 1.19-1.25 | 0.16-0.3 | 8.0-8.7 | 12-11.5 | Good | Yes |
| A | 1.18 | 0.42 | 1.19 | 0.21 | 9.1 | 11 | Good | Yes |
| B | 1.19 | 0.41 | 1.24 | 0.16 | 10 | 10 | Good | Yes |
| C | 1.16 | 0.38 | 1.32 | 0.14 | 11.5 | 8.7 | Bad | No |

CLAIMS NOT LIMITED TO DISCLOSED EMBODIMENTS

Forms of the invention described above are to be used as illustration only, and should not be used in a limiting sense to interpret the scope of the present invention. Modifications to the embodiments, set forth above, could be readily made by those skilled in the art without departing from the spirit of the present invention.

The inventors hereby state their intent to rely on the Doctrine of Equivalents to determine and assess the reasonably fair scope of the present invention as it pertains to any apparatus not materially departing from but outside the literal scope of the invention as set forth in the following claims.

We claim:

1. A regioselectively substituted cellulose ester comprising:
   (a) a plurality of chromophore-acyl substituents; and
   (b) a plurality of pivaloyl substituents, wherein the cellulose ester has a hydroxyl degree of substitution ("$DS_{OH}$") in the range of from about 0 to about 0.9, wherein the cellulose ester has a pivaloyl degree of substitution ("$DS_{Pv}$") in the range of from about 0.1 to about 1.2, wherein the cellulose ester has a chromophore-acyl degree of substitution ("$DS_{Ch}$") in the range of from about 0.4 to about 1.6, and wherein the regioselectivity is such that the sum of the chromophore-acyl degree of substitution at C2 and C3 ("$C2DS_{Ch}$" and "$C3DS_{Ch}$") minus the chromophore-acyl degree of substitution at C6 ("$C6DS_{Ch}$") is between about 0.1 and about 1.6, wherein the chromophore-acyl is chosen from

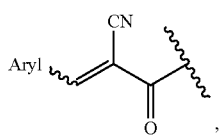

(i)

wherein the aryl is a (C6) aryl, and wherein the aryl is unsubstituted or substituted by 1-5 $R^1$; or

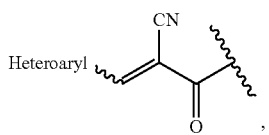

(ii)

wherein the heteroaryl is a 5- to 10-membered ring having 1-4 heteroatoms chosen from N, O or S, and wherein the heteroaryl is unsubstituted or substituted by 1-5 $R^1$, wherein each $R^1$ is independently chosen from nitro, cyano, $(C_{1-6})$alkyl; halo$(C_{1-6})$alkyl; $(C_{6-20})$aryl-$CO_2$—; $(C_{6-20})$aryl; $(C_{1-6})$alkoxy; halo$(C_{1-6})$alkoxy; halo; 5- to 10-membered heteroaryl having 1-4 heteroatoms chosen from N, O, or S; or

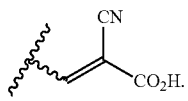

2. The cellulose ester of claim 1 wherein $C2DS_{Ch}$ minus $C3DS_{Ch}$ is greater than or equal to 0.01.

3. The cellulose ester of claim 2, wherein the $DS_{OH}$ is in the range of from about 0.1 to about 0.6, wherein the $DS_{Pv}$ is in the range of from about 0.1 to 0.6, wherein the $DS_{Ch}$ is in the range of from about 0.5 to about 1.5.

4. The cellulose ester of claim 3, wherein $C2DS_{Ch}$ minus $C3DS_{Ch}$ is greater than or equal to 0.2.

5. The cellulose ester of claim 1 wherein the chromophore-acyl is chosen from:

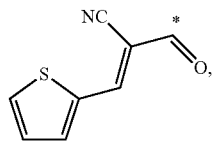

9

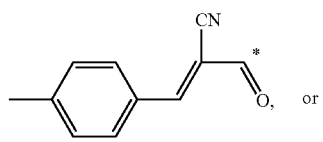

10

, or

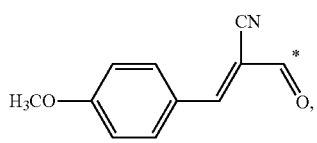

15 wherein * indicates the point of attachment of the chromophore-acyl substituent to an oxygen of the cellulose ester.

6. The cellulose ester of claim 5 wherein the chromophore-acyl is:

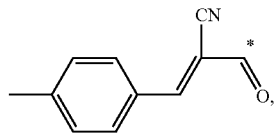

10 wherein * indicates the point of attachment of the chromophore-acyl substituent to an oxygen of the cellulose ester.

7. The cellulose ester of any one of claim 1-4, 5, or 6 wherein the chromophore-acyl has an absorption maximum ($\lambda_{max}$) in the range from about 200 nm to about 350 nm.

8. The cellulose ester of claim 7 wherein the chromophore-acyl has an absorption maximum ($\lambda_{max}$) in the range from about 247 nm to about 350 nm.

9. The cellulose ester of any one of claim 1-4, 5, or 6 further comprising (C) a plurality of $(C_{1-6})$alkyl-acyl substituents.

10. The cellulose ester of claim 9 wherein the $(C_{1-6})$alkyl-acyl substituent is chosen from acetyl, propionyl, butyryl, pentanoyl, or hexanoyl.

11. The cellulose ester of claim 10 wherein the $(C_{1-6})$ alkyl-acyl substituent is acetyl.

12. The cellulose ester of claim 10 wherein the $(C_{1-6})$ alkyl-acyl substituent is a combination of propionyl and acetyl.

13. The regioselectively substituted cellulose ester of claim 10 wherein the $(C_{1-6})$alkyl-acyl substituent is propionyl.

14. The regioselectively substituted cellulose ester of claim 10 wherein the $(C_{1-6})$alkyl-acyl substituent is butyryl.

* * * * *